(12) United States Patent
Main-Reade et al.

(10) Patent No.: US 12,393,744 B2
(45) Date of Patent: Aug. 19, 2025

(54) SAFETY AUTOMATION BUILDER—INTEGRATOR

(71) Applicant: Rockwell Automation Technologies, Inc., Mayfield Heights, OH (US)

(72) Inventors: David Main-Reade, Edinburgh (GB); Xinli Lin, Milwaukee, WI (US); Jonathan B Johnson, Milwaukee, WI (US); Susan Stuebe, Milwaukee, WI (US); Matthew R. Kuenzi, Milwaukee, WI (US); Kevin Zomchek, Milwaukee, WI (US); Todd M Bissell, Nashua, NH (US); Burt Sacherski, Nashua, NH (US); Linda A Freeman, Orlando, FL (US); Usha R Kolukula, Littleton, MA (US); Ian Murgatroyd, Suffolk (GB)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 1002 days.

(21) Appl. No.: 17/481,686

(22) Filed: Sep. 22, 2021

(65) Prior Publication Data
US 2023/0092348 A1    Mar. 23, 2023

(51) Int. Cl.
*G06F 3/0482* (2013.01)
*G06F 3/0484* (2022.01)
(Continued)

(52) U.S. Cl.
CPC ............ *G06F 30/12* (2020.01); *G06F 3/0482* (2013.01); *G06F 3/0484* (2013.01);
(Continued)

(58) Field of Classification Search
CPC .................................................. G06F 3/048–05
See application file for complete search history.

(56) References Cited

U.S. PATENT DOCUMENTS

| | | | | |
|---|---|---|---|---|
| 11,775,132 B1 * | 10/2023 | McDannald | ........ | G06F 3/04815 715/741 |
| 2004/0078098 A1 * | 4/2004 | Jeffries | .................. | G06Q 40/08 700/52 |

(Continued)

OTHER PUBLICATIONS

Extended European Search Report received for European Patent Application Serial No. 22 19 4583.5 dated Mar. 2, 2023, 12 pages.

(Continued)

*Primary Examiner* — Daniel Rodriguez
(74) *Attorney, Agent, or Firm* — Amin, Turocy & Watson, LLP

(57) ABSTRACT

A safety design system assists in the development of compliant industrial safety systems. User interfaces provided by the design system guide the user through an intuitive workflow for carrying out risk assessment analysis on industrial assets and designing safety functions for mitigating risks associated with the industrial assets. These user interfaces offer multiple views of safety system design aspects, including a layout view and a table view that offer alternative views of hazard and safety function data. The system also guides the user to the selection of suitable input, logic, and output devices for each safety function based on results of the risk assessment and local industrial safety standards.

20 Claims, 45 Drawing Sheets

(51) Int. Cl.
*G06F 30/12* (2020.01)
*G06Q 10/0635* (2023.01)
*G06Q 10/0639* (2023.01)
*G06Q 10/0875* (2023.01)
*G06Q 10/101* (2023.01)
*G06Q 10/10* (2023.01)

(52) U.S. Cl.
CPC ... *G06Q 10/0635* (2013.01); *G06Q 10/06393* (2013.01); *G06Q 10/0875* (2013.01); *G06Q 10/101* (2013.01); *G06Q 10/103* (2013.01)

(56) References Cited

U.S. PATENT DOCUMENTS

| | | | | |
|---|---|---|---|---|
| 2005/0177790 | A1* | 8/2005 | Molander | G06F 3/0482 715/700 |
| 2008/0040704 | A1* | 2/2008 | Khodabandehloo | G06F 30/20 717/105 |
| 2009/0019383 | A1* | 1/2009 | Riley | G06Q 10/10 715/764 |
| 2010/0088664 | A1* | 4/2010 | Khodabandehloo | G06F 8/20 717/103 |
| 2010/0229097 | A1* | 9/2010 | Eichner | G05B 19/41855 715/735 |
| 2013/0191300 | A1* | 7/2013 | Yoon | G06Q 10/063 705/325 |
| 2014/0222383 | A1* | 8/2014 | Eitzman | G06F 30/00 703/1 |
| 2015/0370773 | A1* | 12/2015 | Heineman | G06F 40/174 715/223 |
| 2018/0068242 | A1* | 3/2018 | Outram | G06Q 10/06311 |
| 2019/0034855 | A1* | 1/2019 | Halioris | G06Q 10/08 |
| 2019/0156539 | A1* | 5/2019 | Jiang | E21F 17/18 |
| 2019/0370295 | A1* | 12/2019 | de Boer | G06F 16/93 |
| 2022/0091732 | A1* | 3/2022 | Meriaz | G06Q 10/20 |

OTHER PUBLICATIONS

Allen Bradley: "RASWin 4.0 Risk Assessment Software for Windows", Sep. 24, 2020.

* cited by examiner

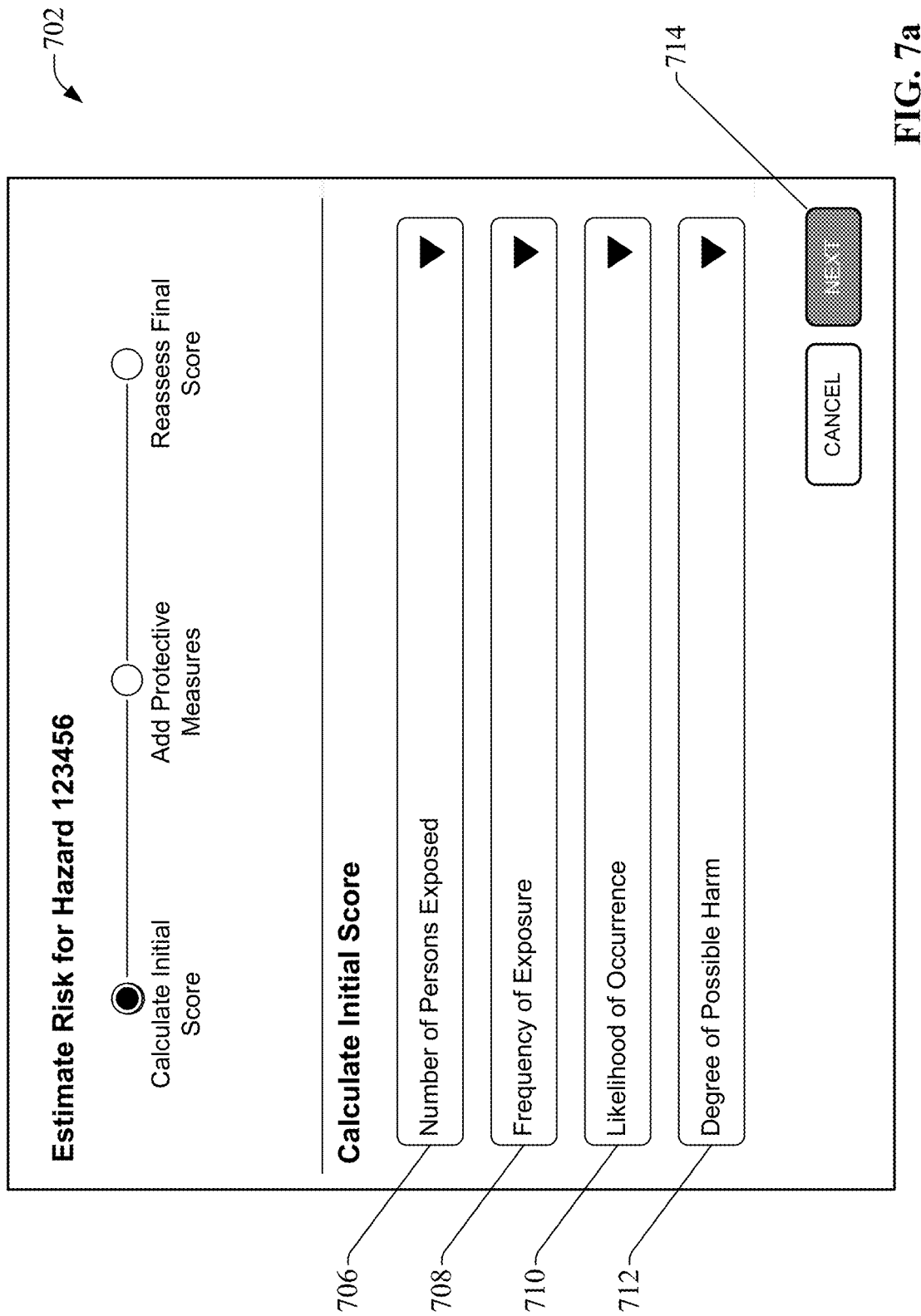

Total Response Time [ms]

Light Curtain    Safety Relays    Machine Stop Time
T = [10.1] ms + [22.45] ms + [11.23] ms = 43.8 ms

Industrial Application
● Yes  ○ No

Stroke Application
○ Yes  ● No

Two-Hand Application
○ Yes  ● No

Minimal Safety Distance [mm]
Valid for vertical mounting only

Light Curtain Resolution
d = [14] mm

Distance Transmitter-Receiver
R = [2378] mm

Safety Category
☐ Cat. 2   ☒ Cat. 4

Light Curtain should be no closer than:
S = 101 mm

Reflective Surface should be no closer than:
S2 = 72 mm

FIG. 18

SAFETY PROJECT BILL OF MATERIALS

| Qty | CATELOG NUMBER | DESCRIPTION | Ds | List Ea | Typical Delivery |
|---|---|---|---|---|---|
| 1 | 445L-P4E0600FP | Micro 400 Safety Light Curtain, Pair, Res 30mm, Pt Ht, 600mm | E8 | $1,220.00 | Preferred |
| 2 | 445L-AC8RJ5 | M12 to RJ45, 5 Meter | E8 | $26.30 | Preferred |
| 1 | 440R-ACABL2 | Ribbon Cable 10 pin for 2 extension | E8 | $36.40 | |
| 1 | 440R-P226AGS-NNR | MSR42 Multifunction Controller for GuardShield Light Curtains | E8 | $507.00 | Preferred |
| 1 | 440R-D22R2 | Guardmaster Safety Relay, 2 Dual Channel Inputs, 1 NC Solid State Aux Output | E8 | $402.99 | Preferred |
| 1 | 100S-C37EJ14BC | MCS 100S-C Safety Contactor, 37A, 24VDC, Bifurcated Contact | E8 | $411.07 | |
| ... | ... | ... | ... | ... | ... |

SAFETY FUNCTION TABLE ⟵ 2302

| SYMBOL | SAFETY FUNCTION | INPUT DEVICE | OUTPUT DEVICE | LOGIC DEVICE | PLr | # OPS |
|---|---|---|---|---|---|---|
| SF-1 | SafetyFunction_1 | Tongue | IEC Safety Contactors | Guardmaster Relay and Expansion Unit | PLr-D | 43800 |
| SF-2 | SafetyFunction_2 | Non-Contact | 7005-CF Safety Control Relay | Guardmaster Relay and Expansion Unit | PLr-D | 43800 |
| SF-3 | SafetyFunction_3 | GuardShield | PowerFlex 40P with SafeTorque Off | Single Function Relays | PLr-D | 43800 |
| ... | ... | ... | ... | ... | ... | ... |

FIG. 23

SAFETY AUTOMATION BUILDER—INTEGRATOR

BACKGROUND

The subject application relates generally to industrial automation, and, more particularly, to industrial safety system design and documentation.

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, a system for designing industrial safety systems is provided, comprising a user interface component configured to render an interface display and to receive, via interaction with the interface display, design input that defines aspects of an industrial safety system for an industrial machine, wherein the interface display simultaneously displays a layout view that displays a graphic of the industrial machine and the aspects of the industrial safety system as a hierarchical list, and a table view that displays the aspects of the industrial safety system in a tabular format; a safety function component configured to generate functional safety data for the industrial safety system based on the design input; and a reporting component configured to generate, based on the functional safety data, at least one of a risk assessment document for the industrial machine, a bill of materials for the industrial safety system, a safety requirements specification document for the industrial safety system, or a validation checklist for the industrial safety system, wherein an interaction with a first view, of the layout view or the table view, causes a corresponding update to a second view of the layout view or the table view.

Also, one or more embodiments provide a method for developing industrial safety systems, comprising rendering, by a system comprising a processor, an interface display; receiving, by the system via interaction with the interface display, design input that defines aspects of an industrial safety system for an industrial machine; generating, by the system, functional safety data for the industrial safety system based on the design input; and generating, by the system, based on the functional safety data, at least one of a risk assessment document for the industrial machine, a bill of materials for the industrial safety system, a safety requirements specification document for the industrial safety system, or a validation checklist for the industrial safety system, wherein the rendering comprises simultaneously displaying on the interface display: a layout view that displays a graphic of the industrial machine and the aspects of the industrial safety system as a hierarchical list, and a table view that displays the aspects of the industrial safety system in a tabular format.

Also, according to one or more embodiments, a non-transitory computer-readable medium is provided having stored thereon instructions that, in response to execution, cause a system comprising a processor to perform operations, the operations comprising rendering an interface display for development of a safety system for an industrial machine; receiving, via interaction with the interface display, design input that defines aspects of the safety system; generating functional safety data for the industrial safety system based on the design input; and generating based on the functional safety data, at least one of a risk assessment document for the industrial machine, a bill of materials for the industrial safety system, a safety requirements specification document for the industrial safety system, or a validation checklist for the industrial safety system, wherein the rendering comprises simultaneously displaying on the interface display: a layout view that displays a graphic of the industrial machine and the aspects of the industrial safety system as a hierarchical list, and a table view that displays the aspects of the industrial safety system in a tabular format.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIGS. 7*a*-7*e* are views of an example risk estimation dialog window.

FIG. 18 is an example dialog window that serves as an interface for a product selection wizard.

FIG. 21 is an example bill of materials that can be generated by a reporting component of an industrial safety design system.

FIG. 23 is an example safety function table that can be generated by a reporting component of an industrial safety design system.

DETAILED DESCRIPTION

Figure 1:
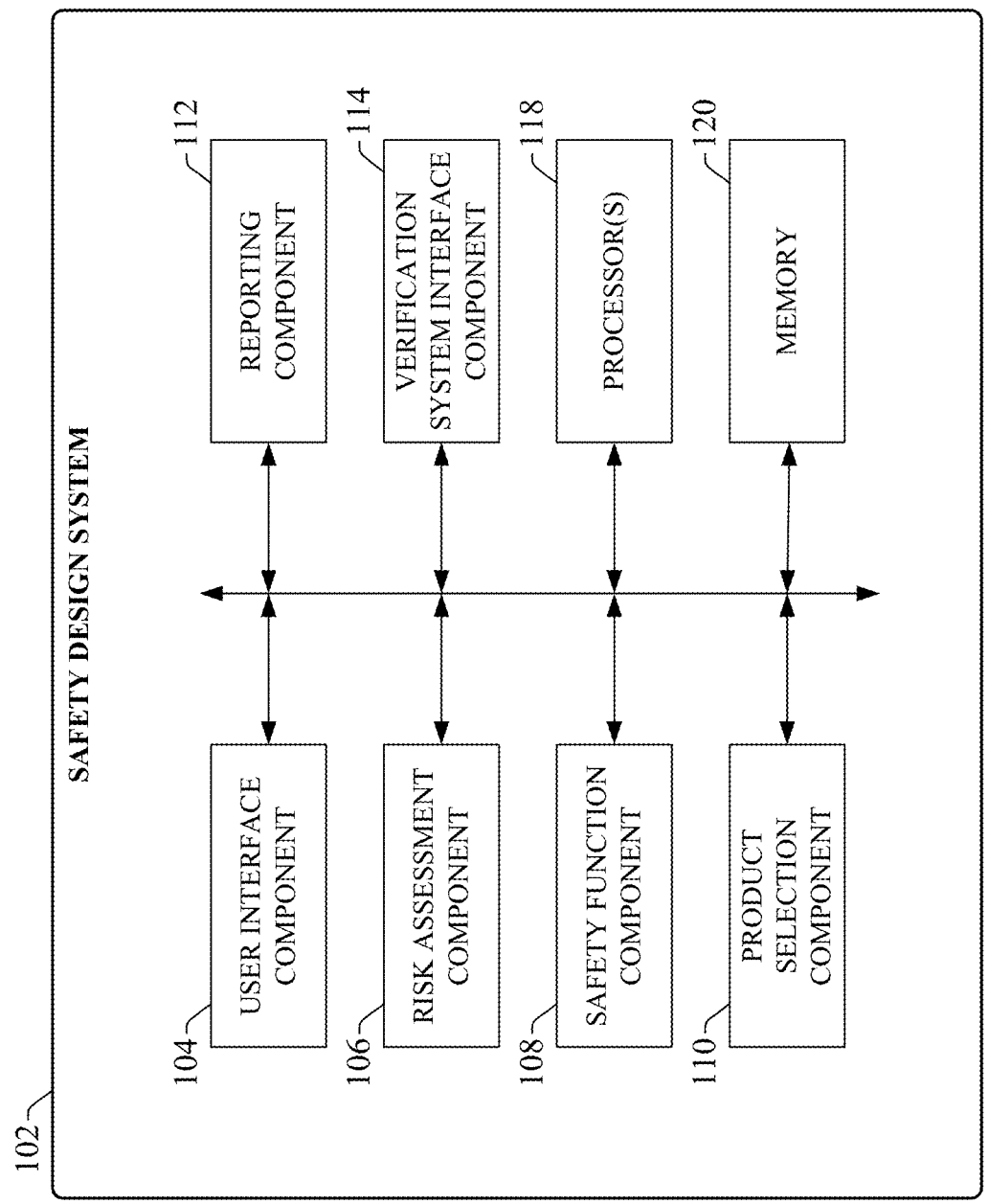
FIG. 1 is a block diagram of an example safety design system that can facilitate automated, guided safety system design in accordance with prescribed safety standards.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a hard disk drive, multiple storage drives (of optical or magnetic storage medium) including affixed (e.g., screwed or bolted) or removably affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Design of functional safety solutions for industrial automation systems can be broadly viewed in terms of three general tasks—risk assessment, safety system design, and design verification. Risk assessment is a formal evaluation of an automation line or machine that determines, for each identified hazard, a likelihood and severity of injury that can result if an operator improperly interacts with the hazard. In general, the goal of the risk assessment is to assess the level of risk associated with a hazard and decide whether the level of risk is such that work can be performed safely. The risk assessment can be used to determine a required safety performance for each safety function that defines a minimum degree of safety equipment performance and risk mitigation capability that satisfies the prescribed safety standards (e.g., ISO or IEC standards) given a likelihood and severity of the risk.

Based on the results of the risk assessment, the designer then designs a safety solution for the hazardous access point that achieves the required performance level. This requires the designer to possess a working understanding of current safety standards and how those standards should be applied to their own automation system. With these standards in mind, the designer must then select suitable input, logic, and output devices for each required safety function in accordance with the standards. Typically, the designer selects these devices from one or more vendor catalogs based on their understanding of the prescribed requirements. Finally, once the safety devices have been specified and a safety function configuration has been designed, the resulting safety function must be submitted for design verification to confirm that the design satisfies the required performance level determined by the risk assessment. Design verification can be carried out by manual assessment of the safety function, or by entering information about the safety function into a performance level verification tool that calculates the performance level achieved by the safety function and confirms that the design complies with the standards.

This process of translating the results of the risk assessment into a compliant safety function design and verifying the design prior to implementation can be complicated and time-consuming. Moreover, if the designer lacks sufficient knowledge of the prevailing safety standards, the resulting safety function design may fail the initial performance level verification, necessitating a redesign of the safety function.

To address these and other issues, one or more embodiments of the present disclosure provide an industrial safety design system that automates much of the risk assessment, product selection, safety function design, and verification processes.

FIG. 1 is a block diagram of an example safety design system 102 that can facilitate automated, guided safety system design in accordance with prescribed safety standards. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

One or more embodiments of safety design system 102 can include a user interface component 104, a risk assessment component 106, a safety function component 108, a product selection component 110, a reporting component 112, a verification system interface component 114, one or more processors 118, and memory 120. In various embodiments, one or more of the user interface component 104, risk assessment component 106, safety function component 108, product selection component 110, reporting component 112, verification system interface component 114, the one or more processors 118, and memory 120 can be electrically and/or communicatively coupled to one another to perform one or more of the functions of the safety design system 102. In some embodiments, components 104, 106, 108, 110, 112, and 114 can comprise software instructions stored on memory 120 and executed by processor(s) 118. Safety design system 102 may also interact with other hardware and/or software components not depicted in FIG. 1. For example, processor(s) 118 may interact with one or more external user interface devices, such as a keyboard, a mouse, a display monitor, a touchscreen, or other such interface devices.

User interface component 104 can be configured to receive user input and to render output to the user in any suitable format (e.g., visual, audio, tactile, etc.). In some embodiments, user interface component 104 can be configured to interface with a client device (e.g., a laptop computer, tablet computer, smart phone, etc.) that is communicatively connected to the safety design system 102; e.g., via a hardwired or wireless connection. The user interface component 104 can then render graphical design interfaces on the client device, and receive user input data and render output data via these design interfaces. User input submitted to the user interface component 104 can include, for example, information regarding an industrial environment for which one or more safety functions are to be designed, risk assessment data, safety product selection input, user responses to prompts provided by the user interface component 104, or other such input. Output data rendered by the user interface component 104 can include, for example, dialog windows that prompt a user for the input data mentioned above, safety function tables, graphical views of the user's industrial system and associated hazard information, hazard rating information, results of risk assessment analysis, safety product information, or other such output data.

Risk assessment component 106 can be configured to generate risk assessment data for an industrial machine or production line based on hazard information submitted to the system 102. Safety function component 108 can be configured to generate functional safety data that documents the safety system design. Product selection component 110 can be configured to access a library of input, logic, and output safety devices and retrieve a filtered subset of devices that satisfy a set of safety function criteria. Reporting component 112 can be configured to generate a variety of reports, tables, or other outputs based on the risk assessment and functional safety data generated by the system 102. These reports can include, but are not limited to, a bill of material, safety function requirement specifications (SFRS), a risk assessment report, a validation checklist for the specified safety system, or other such reports.

Verification system interface component 114 can be configured to exchange data with an external performance level verification tool (not shown). For example, data tabulated by the reporting component 112 can be exported to the performance level verification tool via verification system interface component 114 so that the verification tool can calculate a performance level achieved by each safety function specified in the safety function table. Subsequently, verification system interface component 114 can receive report data from the performance level verification tool that specifies an achieved performance level for each safety function and confirms whether the components, structures, and designs meet the required performance level dictated by the prevailing safety standards.

The one or more processors 118 can perform one or more of the functions described herein with reference to the systems and/or methods disclosed. Memory 120 can be a computer-readable storage medium storing computer-executable instructions and/or information for performing the functions described herein with reference to the systems and/or methods disclosed.

Figure 2:
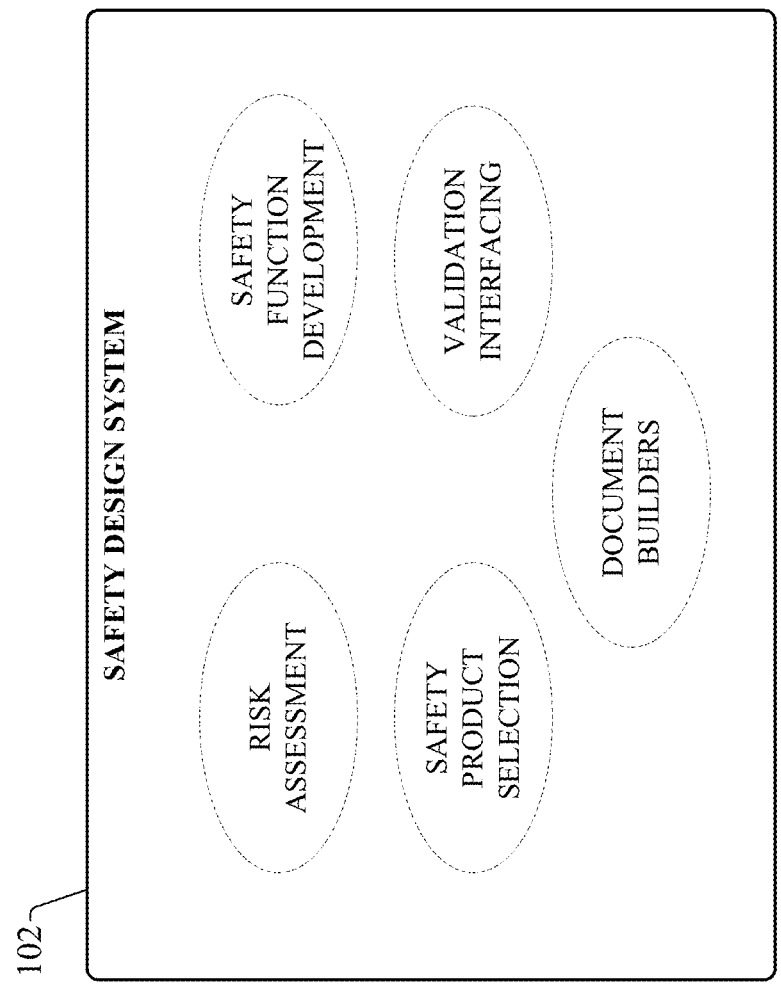
FIG. 2 is a diagram illustrating a general overview of industrial safety design functions carried out by the system.

FIG. 2 is a diagram illustrating a general overview of industrial safety design functions carried out by the system 102. In general, safety design system 102 implements an industrial safety design workflow that meets a user's safety lifecycle needs and facilitates compliance with relevant industrial safety standards. To this end, the safety design system 102 can perform a risk assessment analysis and develop safety functions for an industrial automation system or other hazardous industrial environment based on information about the hazardous environment submitted by the user. As part of this workflow, the system 102 can also guide selection of suitable safety devices for use in the safety solution. Safety design system 102 also includes document builders that can generate a variety of reports and output data for the safety solution, including bills of materials, functional safety documents, and validation checklists. This output data can include safety function data generated in a format compatible with external safety validation systems, which can assess the safety function data to verify each safety function's compliance with a required performance level. The safety design system 102 can also be integrated with other design systems for larger project integration.

Figure 3:
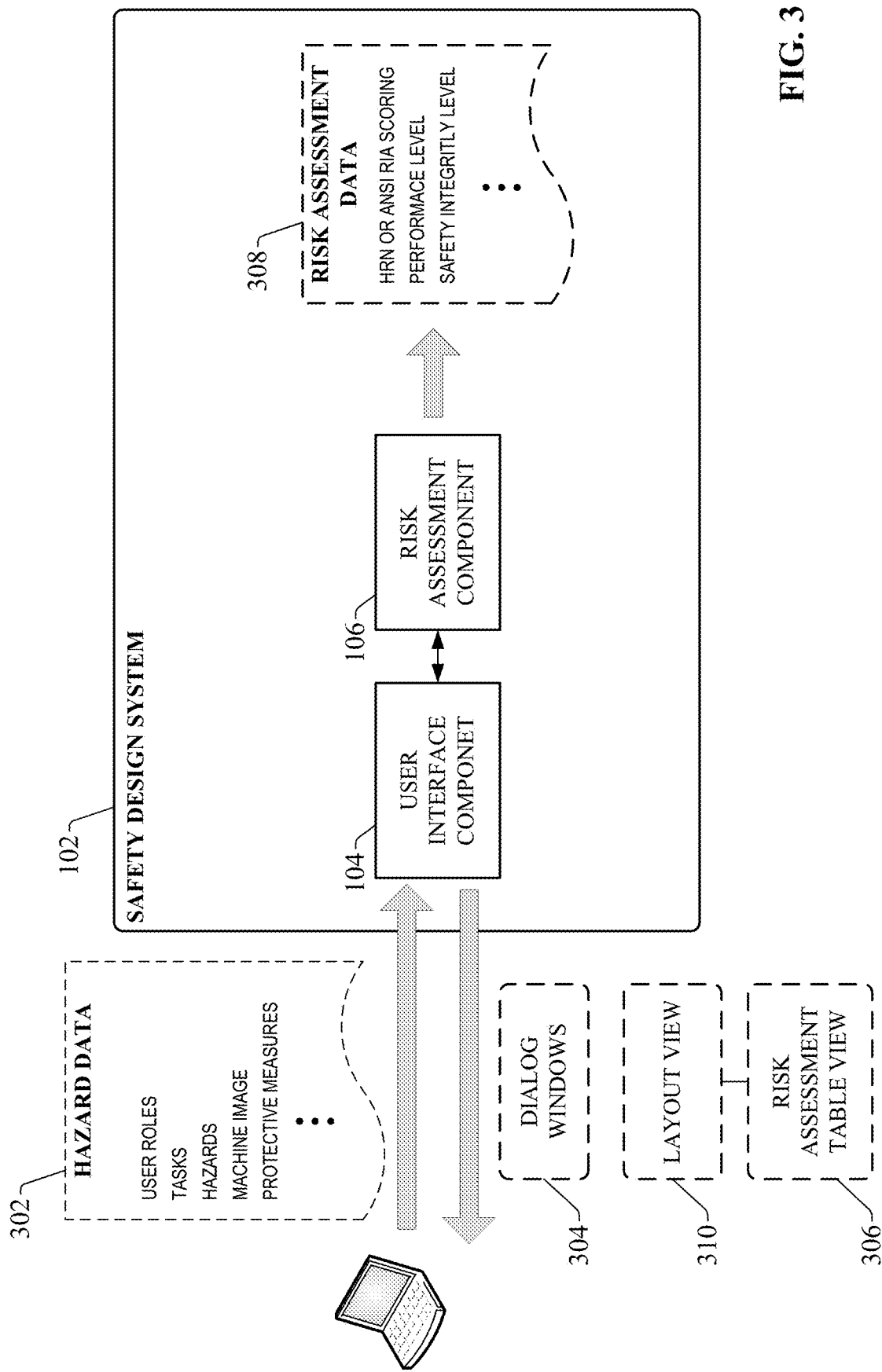
FIG. 3 is a diagram illustrating generalized data flows associated with risk assessment analysis performed by a safety design system.

Safety design system 102 guides the development of a suitable industrial safety system based on results of risk assessment analysis performed on the machine or production line for which the safety system is being developed. Accordingly, the safety design system 102 allows the user to import or enter results of a separate risk assessment analysis prior to beginning safety function development, or to use the system's internal risk assessment tools to perform a risk assessment on the machine or production line. A general workflow is now described for guiding a user through the process of performing risk assessment of their hazardous industrial system and designing one or more compliant safety functions for mitigating risks posed by the industrial system. FIG. 3 is a diagram illustrating generalized data flows associated with risk assessment analysis performed by the safety design system 102 according to one or more embodiments. As will be described in more detail below, safety design system 102 includes integrated risk assessment tools and associated user interface guides that allow the user to easily identify, for a hazardous machine or area for which a safety system is being designed, tasks associated with the hazardous machine as well as hazards associated with those tasks.

To this end, the user interface component 104 generates various dialog windows 304 and other interfaces that guide the user through the process of submitting hazard data 302 describing the hazardous machine or environment for which one or more safety functions are to be specified. This hazard data 302 can describe, for example, tasks associated with the hazardous industrial system, hazards associated with those tasks, roles of users who will be performing the tasks, an image of the hazardous machine for which the safety functions are being designed, protective measures that are in place for the machine, or other such data.

Based on analysis of this hazard data 302, the system's risk assessment component 106 generates risk assessment data 308 for the hazardous machine. This risk assessment data 308 can include hazard rating number (HRN) scoring for the machine (or ANSI RIA scoring in the case of industrial robots), or a required performance level (PLr) or safety integrity level (SIL) category for each safety function to be installed. The user interface component 104 can render these results in a risk assessment table view 306 that tabulates the tasks, hazards, risk scores, and performance levels calculated by the risk assessment component 106. On a same interface display as the risk assessment table view 306, user interface component 104 can also display a layout view 310 that renders the tasks and their associated hazards in a hierarchical list format, and also indicates the locations of the hazards on an image of the hazardous machine. Interactions in one of these two views informs the data presented in the other of the two views.

Figure 4A:
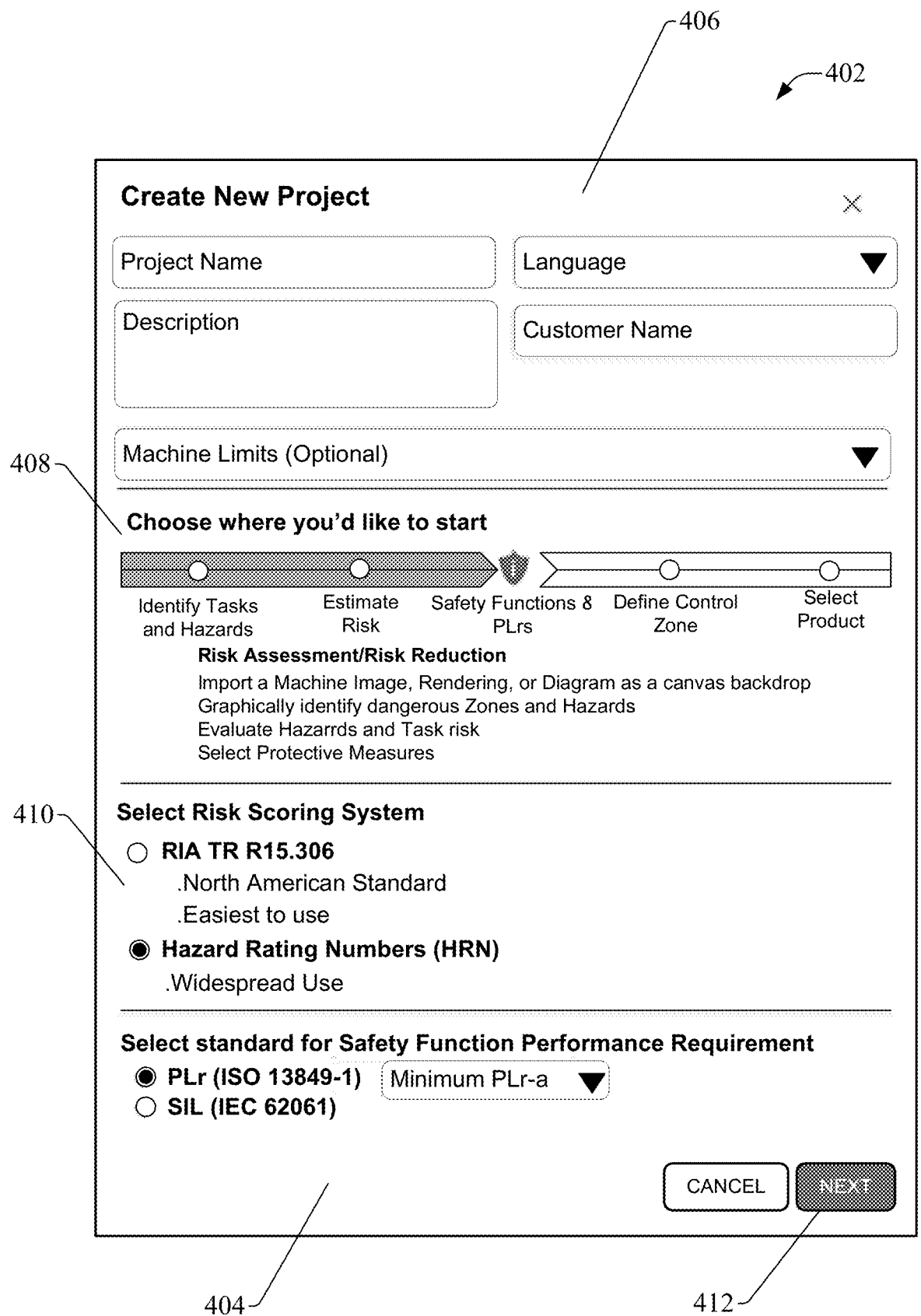
FIGS. 4*a*-4*b* views of an example dialog window for initiating creation of a new safety design project.
Figure 4B:
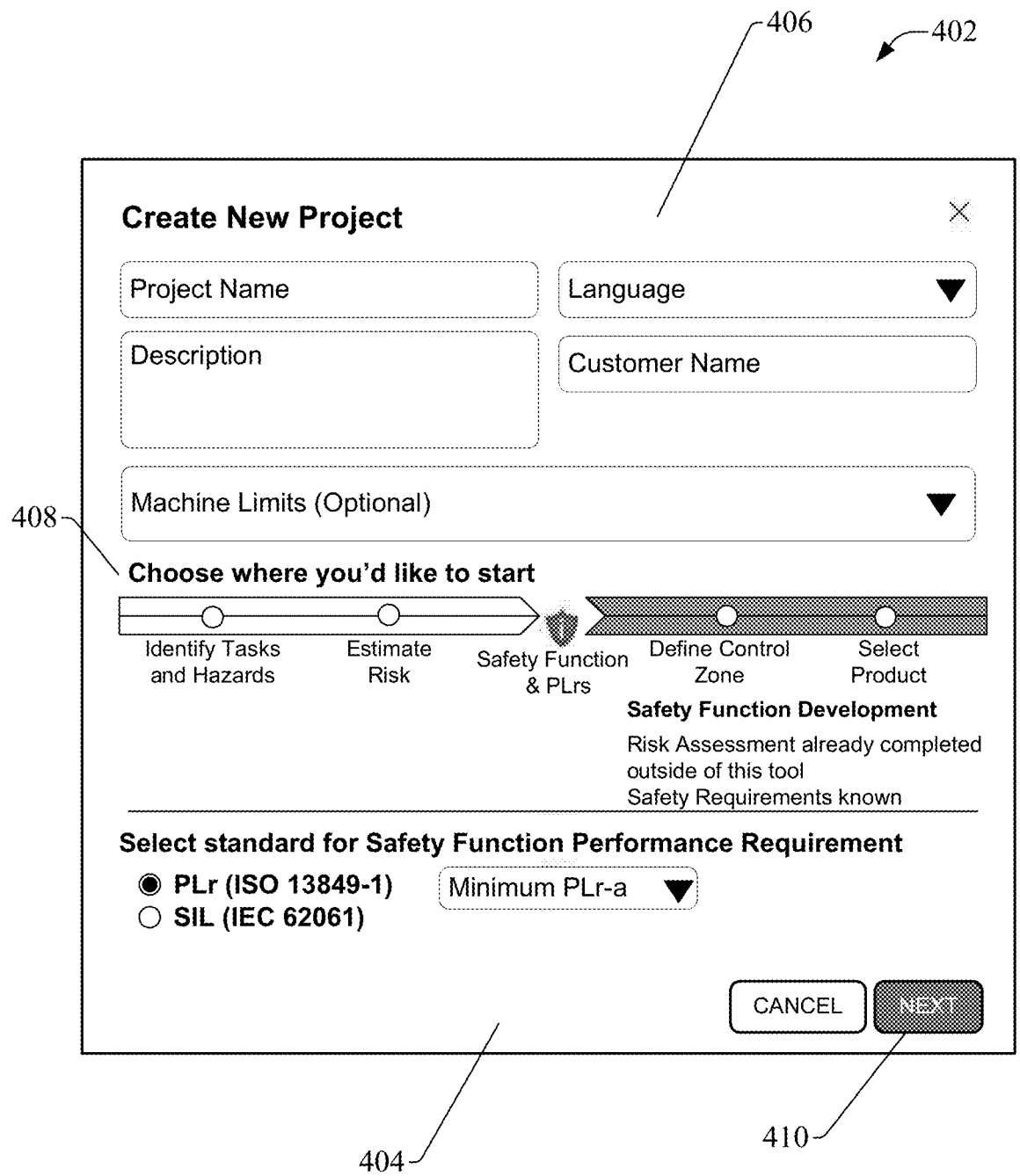

FIGS. 4a and 4b are two views of an example dialog window 402 that can be generated by user interface component 104 for initiating creation of a new safety design project. Dialog window includes a first section 406 comprising data fields for entering a name and description of the new safety design project, as well as other general information about the project (e.g., language, customer name, machine limits, etc.).

As noted above, safety design system 102 includes integrated risk assessment tools that can perform a risk assessment on the user's automation line or machine as a preliminary step toward designing compliant safety functions for the machine's hazardous access points. However, in some design scenarios a user may have already performed risk assessment of their machine prior to initiating a new safety design project. Accordingly, dialog window 402 includes a section 408 that allows the user to select a starting point for the design workflow. If a risk assessment has not yet been performed, the user can select the option to start the design process by identifying tasks and hazards associated with the hazardous machine and to estimate risks associated with the machine (e.g., by selecting the left-hand side of the workflow bar in section 408). Alternatively, if a risk assessment has already been performed separately and risk assessment data is already available for the machine, the user can opt to skip the risk assessment portion of the workflow and begin defining safety functions (e.g., by selecting the right-hand side of the workflow bar).

FIG. 4a depicts the dialog window 402 in the case in which the user has selected to begin the workflow by performing a risk assessment. Selecting this option causes the dialog window 402 to render a section 410 that allows the user to select a risk scoring system to be used when performing the risk assessment. In the illustrated example, the system 102 allows the user to select either an ANSI RIA standard or an HRN rating system. However, other risk assessment standards can also be offered in various embodiments. Another section 404 of the dialog window 402 allows the user to select a standard for defining the required level of safety function performance for each safety function. In the illustrated example, the user can elect to define the performance level using either PLr or SIL standards.

FIG. 4b depicts the dialog window 402 in the case in which the user has selected to skip the risk assessment step and begin the workflow by defining control zones. In this scenario, the section 410 for selecting a risk scoring approach is hidden, and the user is required only to select the standard for defining safety function performance requirements in section 404. However, in the example workflows described herein, it is assumed that the user will be using safety design system 102 to perform a risk assessment.

Figure 5A:
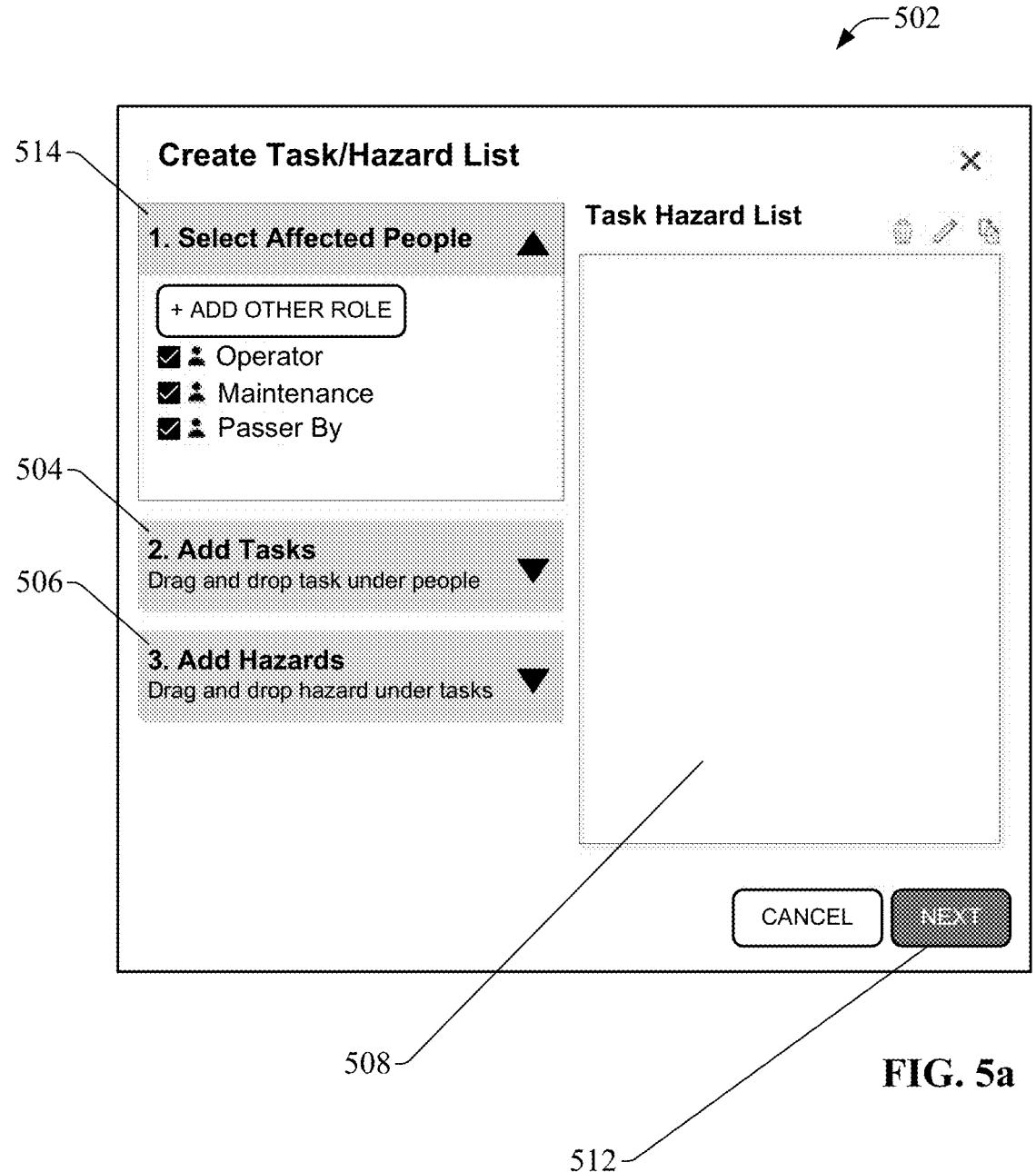
FIGS. 5*a*-5*c* are views of an example dialog window for entering hazard data into a safety design system.
Figure 5B:
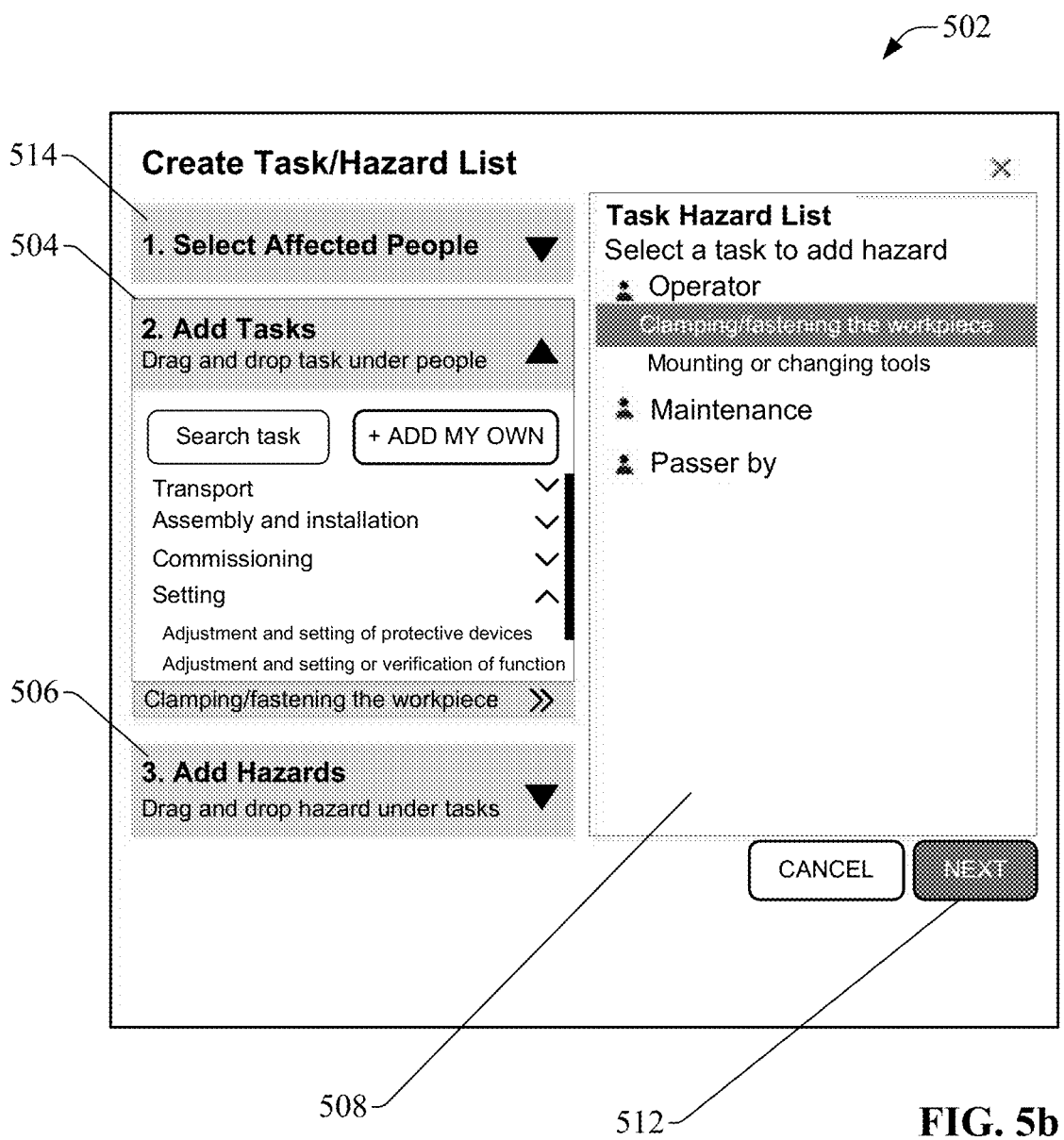
Figure 5C:
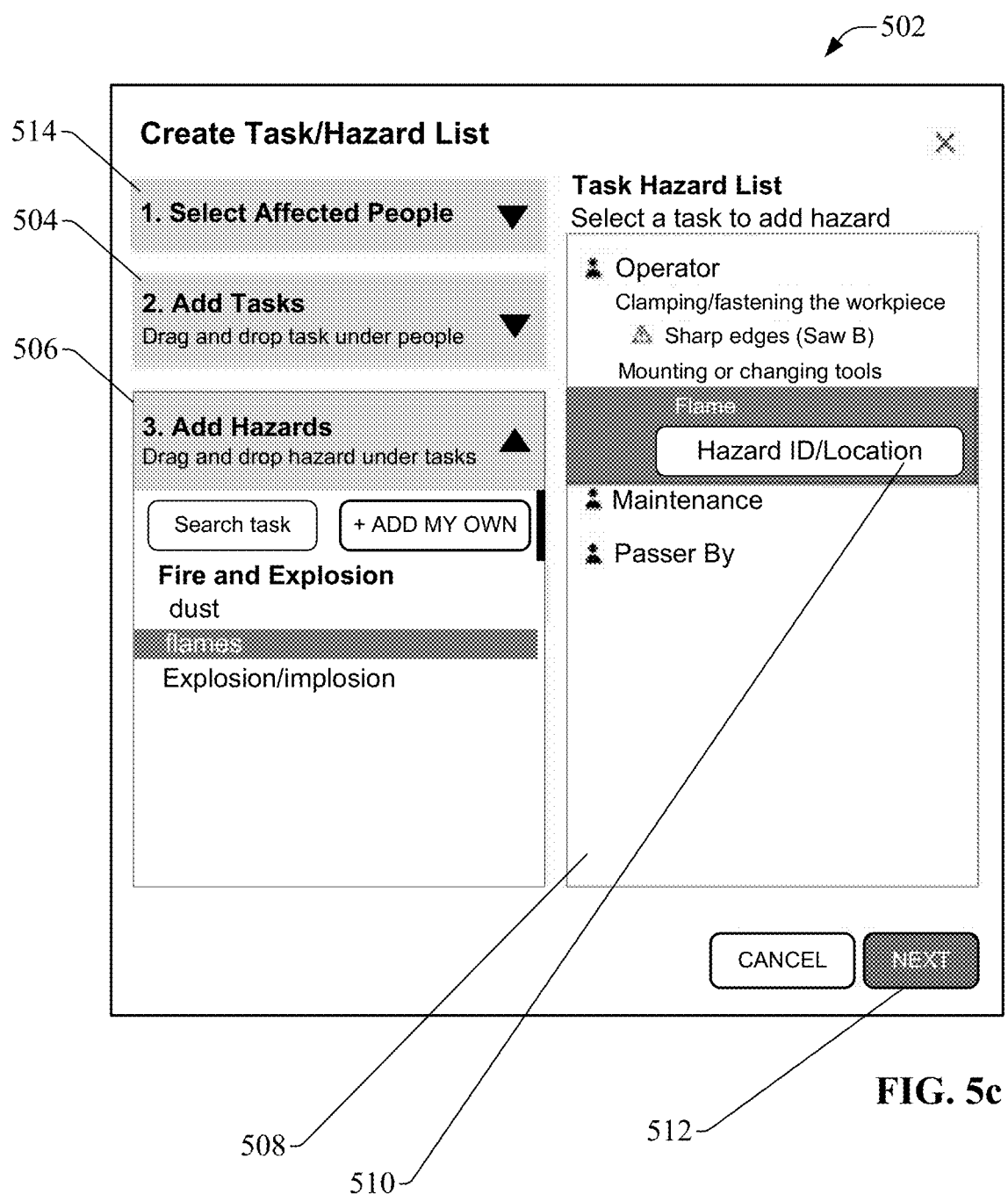

Selecting the Next button 412 on dialog window 402 causes the workflow to proceed to the step of defining tasks and associated hazards as part of the risk assessment. FIGS. 5a-5c are three views of an example dialog window 502 that can be generated by user interface component 104 for entering hazard data 302 into the safety design system 102. As noted above, hazard data 302 defines tasks associated with the industrial machine or environment for which safety functions are to be designed, as well as hazards associated with those tasks. Dialog window 502 provides a simple interface that allows the user to identify and select tasks associated with the machine for which the risk assessment is being performed, as well as potential hazards associated with each task. Dialog window 502 allows the user to define these task-hazard pairs as a function of the role of the affected person.

To enter this information, dialog window 502 renders a first drop-down section 514 for selecting a user role, a second drop-down window 504 for selecting a task, and a third drop-down section 506 for selecting a hazard. Selections from these sections can be dragged to or otherwise added to a hazard list window 508 to facilitate adding the selected hazard data to the risk assessment.

As shown in FIG. 5a, selection of the first drop-down section 514 causes a list of selectable user roles to be displayed. Example user roles can include, but are not limited to, a machine operator, maintenance personnel, a person passing by the machine, or other such roles. Section 514 also allows the user to define a custom role if desired.

After one or more user roles have been selected, the user can select the second drop-down section 504 to associate one or more tasks with the selected user roles, as shown in FIG. 5b. As shown in this view, the user has added Operator, Maintenance, and Passer By roles to the hazard list window 508. Selection of the second drop-down section 504 renders a list of selectable tasks that can be associated with each selected user role. Selected tasks appear in hazard list window 508 as line items below their associated user role. Example tasks can include, but are not limited to, clamping or fastening a workpiece into the machine, mounting or changing tools on the machine, or other such tasks or behaviors relative to the machine. Section 504 can organize the selectable tasks according to different categories to assist the user in locating a desired task. These categories can include, for example, tasks relating to transport (e.g., handling of parts), assembly and installation, commissioning, set-up (e.g., adjustment and setting of protective devices, device verification, etc.), or other such categories. In the example depicted in FIG. 5b, the user has assigned the tasks of clamping/fastening a workpiece and mounting a tool with the Operator user role, as shown in section 508. Section 504 also allows the user to define custom tasks to be associated with a user role if a desired task is not available in the predefined task list.

After user roles and associated tasks have been selected, the user can select the third drop-down section 506 to begin defining hazards associated with each specified task, as shown in FIG. 5c. Section 506 renders a list of predefined hazards that can be selectively associated with each task selected from section 504. Example hazards can include, but are not limited to, sharp edges, explosion or implosion, flames, dust, electrocution, crushing, burning, or other such hazards. As with task selection, section 506 can organize the predefined hazards according to hazard type to facilitate easy location of relevant hazards. Section 506 also allows the user to define custom hazards if desired. Hazards appear in hazard list window 508 as line items below their associated task.

The hazard list window 508 also displays an editable text field 510 below each selected hazard to allow the user to define a location or hazard ID for each hazard (e.g., a specific tool that is a source of a Sharp Edges hazard). In the example depicted in FIG. 5c, the user has indicated that the task of clamping or fastening a workpiece into the machine by an operator is associated with a hazard due to sharp edges of a saw (Saw B) near the workpiece mounting location.

Figure 6A:
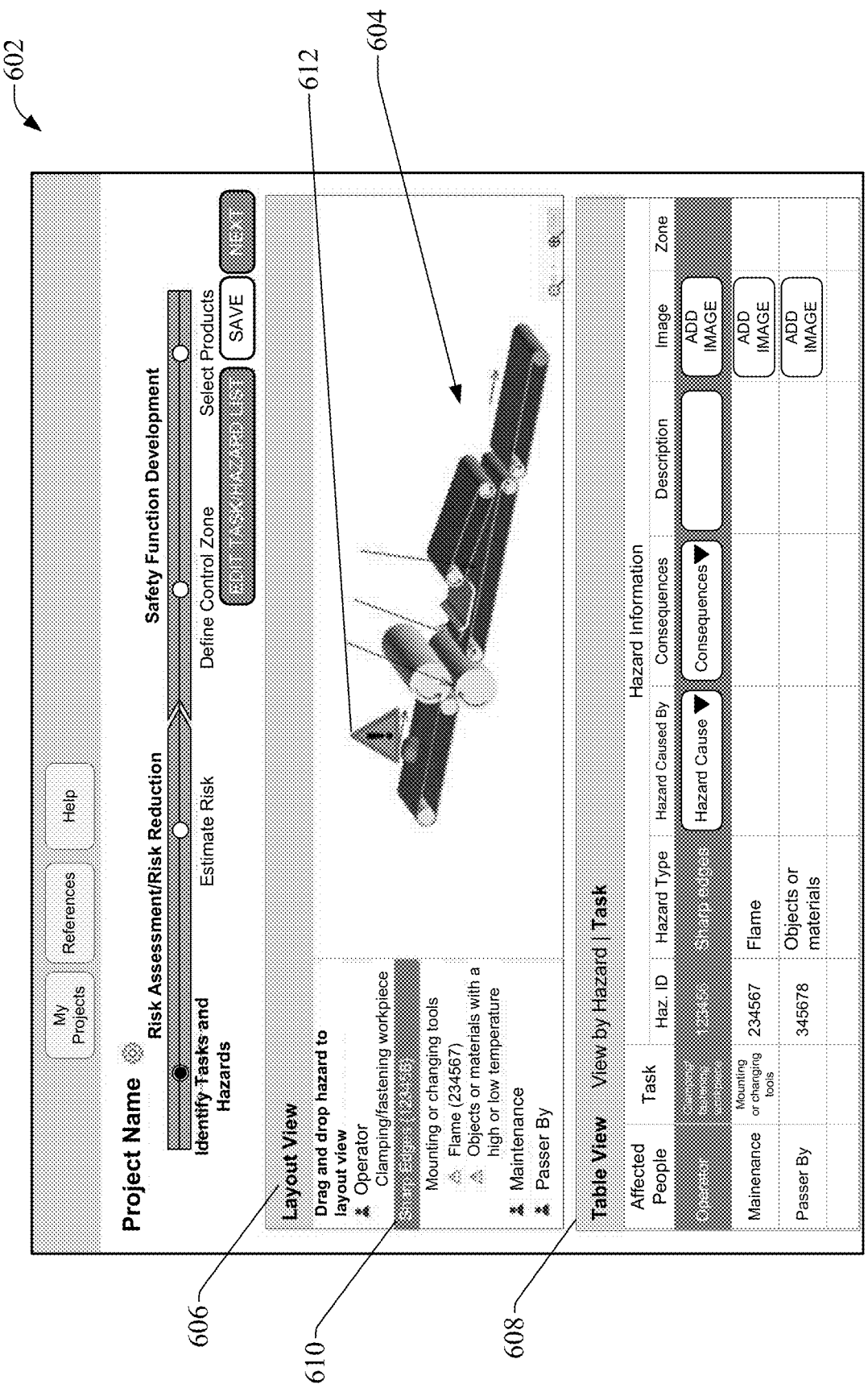
FIGS. 6*a*-6*c* are views of an example configuration display for identifying hazards on a graphic of an industrial machine for which safety functions are being designed.
Figure 6B:
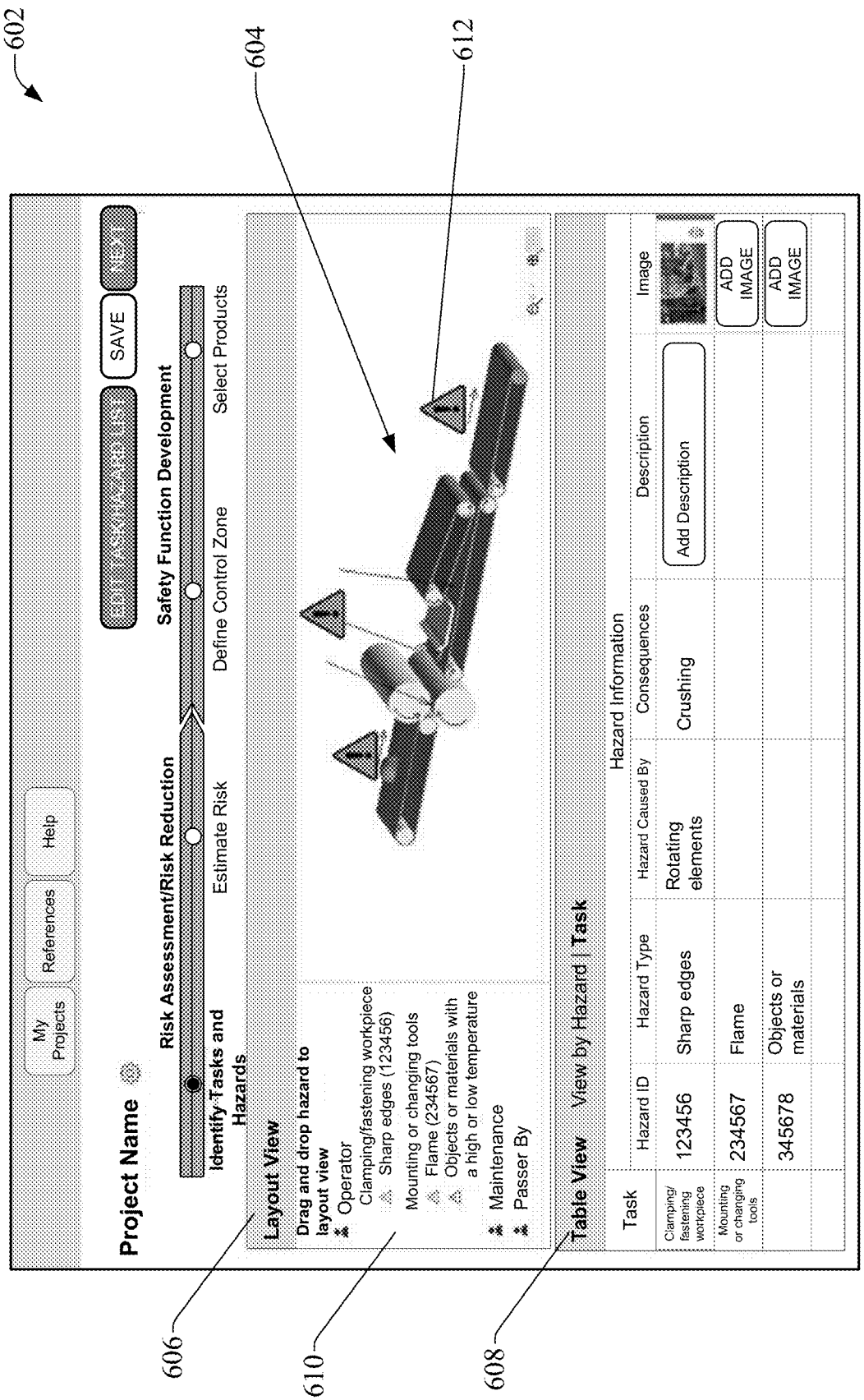
Figure 6C:
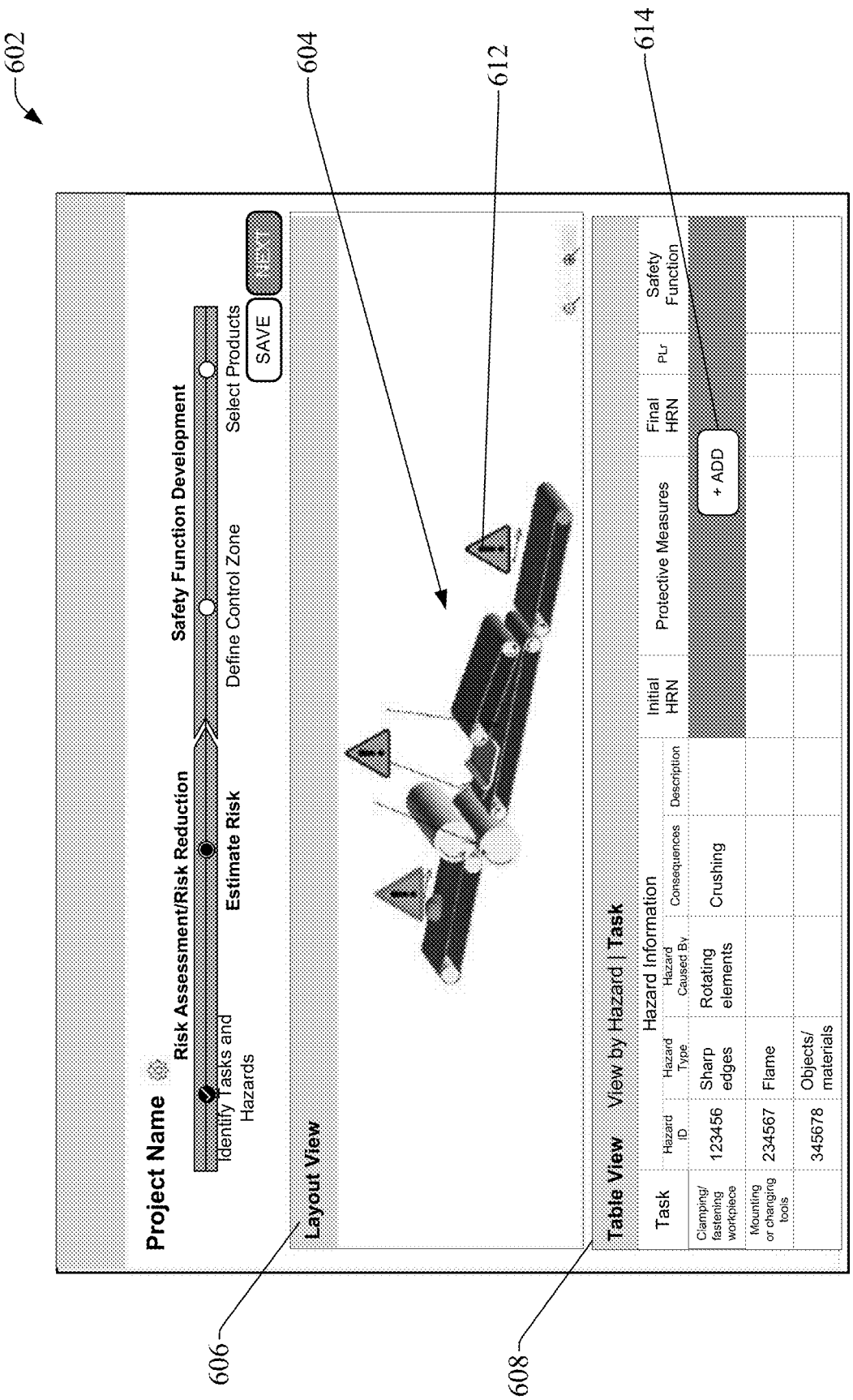

With the role-specific task-hazard pairs defined, the user can select the Next button 512 to proceed to the next stage of the workflow, wherein the specified hazards are identified on an image or graphic of the industrial machine or production line, and further hazard data is submitted for each hazard so that risk assessment scoring can be completed. FIGS. 6a-6c are three views of an example configuration display 602 that can be generated by user interface component 104 for identifying hazards on a graphic of the industrial machine. Configuration display 602 depicts two simultaneous views of the hazard data that was previously submitted using dialog window 502—a layout view 606 and a table view 608. The left side of the layout view 606 comprises a hierarchical list 610 of the previously defined hazards, categorized according to user role. Each defined task is listed as a line item under its corresponding user role, and each hazard is listed under its corresponding task.

The right side of the layout view 606 renders a graphic or image 604 of the industrial machine, line, or production area for which safety functions are being designed. This image 604 can be imported into the safety design system 102 and linked to the system project. Image 604 can be, for example, a representation of an engineering drawing depicting an overview of the line or machine. During subsequent design steps, some items of hazard data 302 will be displayed on the imported image 604, or can be entered into the safety design system 102 through interaction with the imported image 604, thereby providing an intuitive interface for defining safety functions and their corresponding spans of control.

The table view 608 of the specified hazards is rendered on the same interface display 602 as, and simultaneously with, the layout view 606. In the illustrated example, the table view 608 is rendered below the layout view 606. The table view 608 lists the hazards in a tabular format, with each row of the table corresponding to one of the defined hazards and each column of the table representing an item of information about the hazard. Some columns of table view 608 are pre-populated with hazard data that was previously entered using dialog window 502, including the user role of the hazard (Affected People), the task with which the hazard is associated, and the type of hazard (e.g., sharp edges, flame, objects or materials, etc.). The table view 608 also includes a column for a hazard ID that uniquely identifies each hazard.

In addition to these pre-populated columns, table view 608 also includes columns for additional information that can be entered for each hazard. This additional hazard data can include, but is not limited to, a cause of the hazard (e.g., rotating elements), a consequence of the hazard (e.g., crushing, burning, etc.), and a user-defined description of the hazard. Data fields in the Image column can each contain a control (e.g., an Add Image button) that allows the user to import an image of the section of the machine that acts as the source of the corresponding hazard. The user can enter additional information about each hazard via interaction with these data fields in the table view 608. Data fields for the Cause and Consequences columns can contain drop-down lists that allow the user to select, for each hazard in the table, a cause and a consequence of the hazard from a list of pre-defined selections. Other fields, such as those in the Description column, can be entered as user-defined alphanumeric text.

Interface display 602 allows the user to interact with both the layout view 606 and the table view 608 within the same interface, such that interactions with one of the two views are reflected in the other view, allowing the user to explore and define the hazard data using multiple ways. In the example depicted in FIG. 6a, the user has selected a Sharp Edges hazard, which is a risk to operators of the machine. The user can select this hazard by either selecting the Sharp Edges hazard from the hierarchical list 610 in layout view 606 or by selecting the row in the table view 608 corresponding to the Sharp Edges hazard. In either case, selecting one of these two representations of the hazard causes the hazard to be highlighted in both the hierarchical list 610 of the layout view 606 and in the table rendered in the table view 608, as illustrated in FIG. 6a.

FIG. 6b depicts the interface display 602 with a portion of the additional hazard information entered in the table view 608. In this example, additional hazard data has been entered for the "Sharp edges" hazard, specifying that the hazard is caused by rotating elements, and that crushing is a possible consequence of the hazard. In addition, interface display 602 allows the user to specify, via interaction with the image 604 of the industrial machine, a location on the machine that acts as a source of the hazard. In an example embodiment, the user can select a hazard from either the hierarchical list 610 or the table view 608, then select a location on the image 604 corresponding to the location of the hazard. Based on these interactions, the system's risk assessment component 106 links the hazard with the specified location. When a hazard has been associated with a location on the machine, the interface display 602 can render a suitable hazard icon 612 on or near the specified hazard location. In some cases, an arrow graphic can also be rendered on the image 604 to indicate a more precise location of the hazard.

Returning to FIG. 6a, the two simultaneous views 606 and 608 rendered in the interface display 602 allow the user to easily navigate and review the hazard data. Selecting a hazard in either of the two views 606 or 608 causes additional information about the selected hazard to be indicated in the other view. For example, when a row corresponding to a hazard is selected in the table view 608—e.g., the "Sharp edges" hazard, as illustrated in FIG. 6a—the corresponding hazard is also highlighted in the hierarchical list 610 of the layout view 606. Moreover, interface display 602 indicates the location of the selected hazard on the image 604 of the machine by highlighting the hazard icon 612 (and, if applicable, the arrow graphic) corresponding to the selected hazard. Similarly, if a hazard is selected in the hierarchical list 610, the row of the table view 608 corresponding to the selected hazard is also highlighting, thereby drawing the user's attention to additional information about the selected hazard (e.g., a cause, consequence, description, or image of the hazard). The icon 612 corresponding to the selected hazard is also highlighted on the image 604 of the machine. Users can also select a hazard icon 612 via interaction with the image 604 of the machine in the layout view 606, causing the hazard corresponding to the selected icon 612 to be highlighted in both the list 610 and in the table view 608.

Once all task-hazard pairs for the machine have been identified, the system proceeds to the risk estimation stage. FIG. 6c depicts the interface display 602 after all tasks and corresponding hazards have been identified and entered into the system 102. At this stage, the risk assessment component 106 can calculate an initial risk score depending on the previously selected risk scoring system (HRN or ANSI RIA) for each identified hazard. This initial risk score is a measure of risk posed by the hazard prior to addition of a safety function or protective measure. As will be described below, the user can also enter information describing protective measures to be installed for the respective hazards, and the risk assessment component 106 will calculate a final risk score representing the new reduced risk posed by the hazard with the protective measure in place.

Figure 7B:
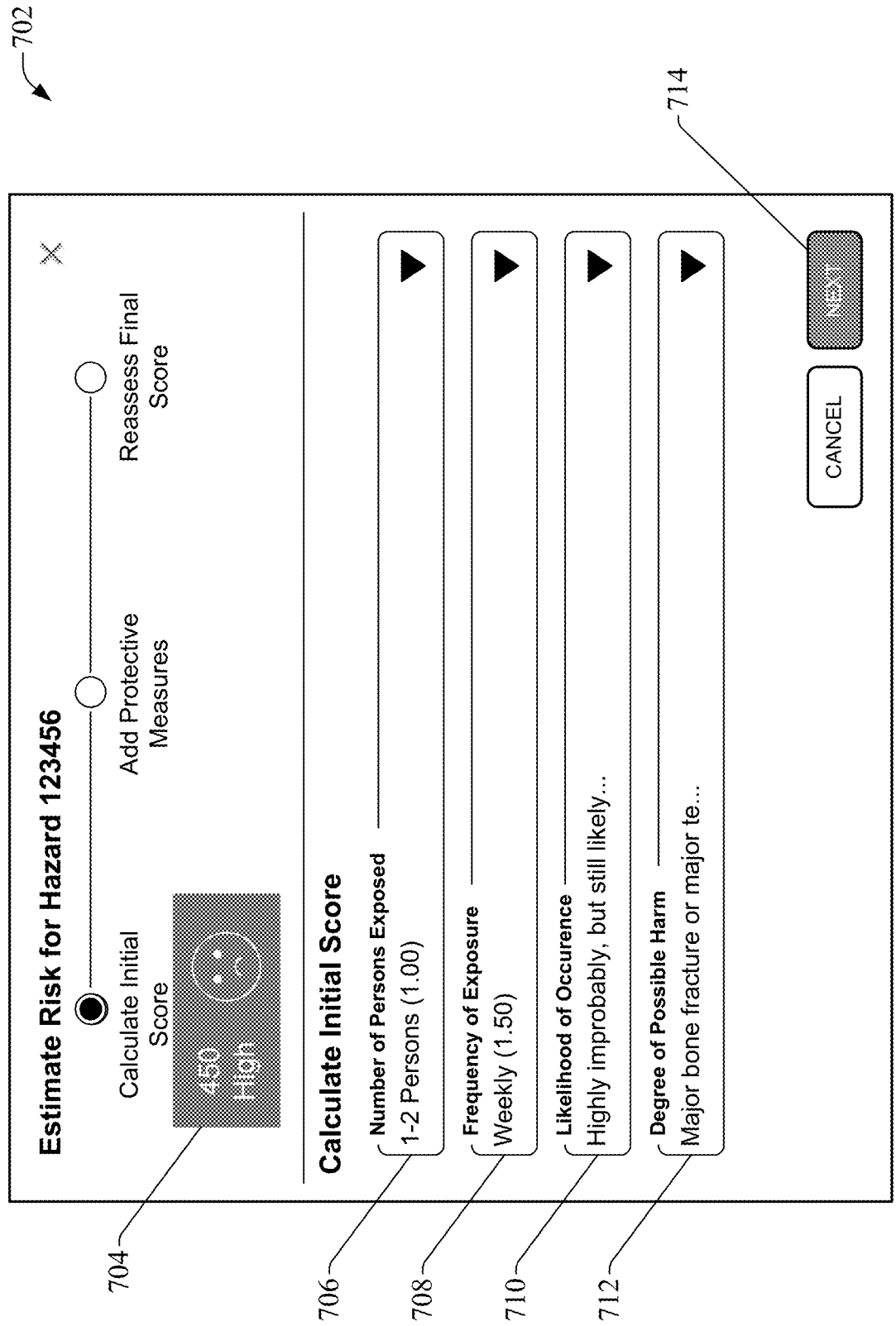

In the example depicted in FIG. 6c, the user can begin this risk scoring process for a given hazard by selecting an Add button 614 within the row of the table view 608 corresponding to the hazard. In this example, the Add button 614 is located over a range of data fields corresponding to risk assessment data (e.g., initial HRN, protective measures, final HRN, required Plr, safety function, etc.). Selection of this Add button 614 causes a risk estimation dialog window to be displayed by the interface component 104. FIGS. 7a-7e are views of an example risk estimation dialog window 702 according to one or more embodiments. As shown in FIG. 7a, dialog window 702 includes data fields for each of the parameters used to calculate the risk score for a hazard. In the present example, the dialog window 702 includes a field 706 for the estimated number of persons exposed to the hazard, a field 708 for the estimated frequency of exposure to the hazard, a field 710 for the estimated likelihood of occurrence of the hazard, and a field 712 for the degree of possible harm posed by the hazard. These fields 706, 708, 710, and 712 are comprised of drop-down selection boxes which are pre-populated with the defined values for each of the risk scoring parameters. In some embodiments, the risk assessment component 106 can calculate initial values of one or more of these data items based on information previously submitted for the hazard and render these calculated values in their corresponding data fields. In such cases, the user may modify any of the calculated items of hazard data if desired before proceeding to the next step. Risk assessment component 106 will analyze this information together with the previously entered information about the hazard to compute an initial risk score prior to addition of any protective measures.

FIG. 7b depicts the dialog window 702 after selections have been made for each of the risk scoring parameters. In the present example, the user has indicated that 1-2 people are likely to be exposed to the hazard, the hazard has a weekly exposure frequency, the likelihood of occurrence of the hazard is highly improbably but still likely, and that a major bone fracture is a possible degree of harm due to the hazard. When the risk scoring parameters have been entered into the dialog window 702, the risk assessment component 106 calculates an initial risk score for the hazard based on these items of information as well as the other hazard data entered using interface display 602, and this initial risk score 704 is displayed on the dialog window 702. In the absence of protective measures, the risk assessment component 106 calculates a worst-case score. For example, an HRN score of 450 for the hazard in the illustrated example, which is deemed a high level of risk.

Figure 7C:
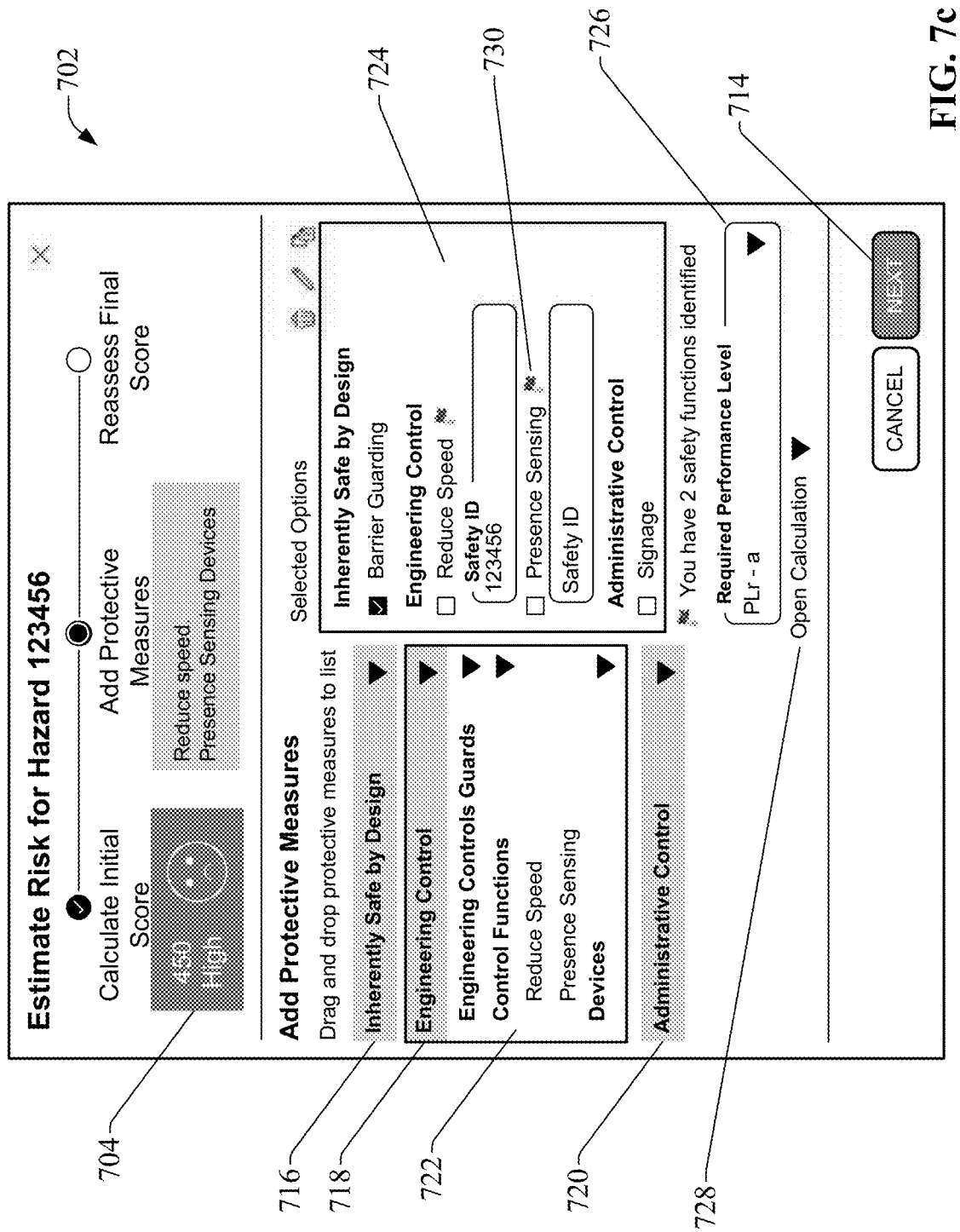

After entering the risk scoring parameters, selecting the Next button 714 causes the workflow to proceed to the step of adding protective measures for the hazard, as illustrated in FIG. 7c. When the user proceeds to this step, dialog window 702 replaces data fields 706-712 with a set of controls for specifying one or more protective measures or safety functions to be added for the hazard. Using these controls, the user can choose protective measures from a list of pre-defined risk reduction measures.

In the example depicted in FIG. 7c, available protective measures are listed in a browsable format on the left side of dialog window 702. These protective measures are organized according to a standards-based hierarchy, such as the ISO 12100 Hazard Control Hierarchy, to assist the user in selecting the most appropriate protective measure. In the illustrated example, these categories include measures that are inherently safe by design (drop-down window 716), measures implemented via engineering control (drop-down window 718), and measures implemented via administrative control (drop-down window 720). Measures that are inherently safe by design can include, for example, physical barrier guarding such as safety fences that prevent entry into the hazardous zone. Measures implemented by engineering control can include, for example, causing the machine's moving components to slow or stop, detecting the presence of a person or vehicle and initiating a safety response using automated safety equipment, or other such engineering controls. Measures implemented via administrative control can include instructional measures, such as installation of warning signs, audible alarms, or stack lights that warn those nearby of the potential hazards. Selection of a drop-down window 716, 718, 720 causes predefined measures associated with the selected category to be rendered. In some cases, the measures under a given category can be further organized according to sub-categories. For example, in the scenario depicted in FIG. 7c, the engineering control category comprises sub-categories for engineering controls guards, control functions, and devices.

Dialog window 702 allows the user to add protective measures from these categories to the hazard by adding the selected protective measures to a list 724 on the right side of the dialog window 702. In some embodiments, a protective measure can be added by dragging a selected measure from the left side of the window 702 to the list 724 on the right side, causing the risk assessment component 106 to associate the selected protective measure with the hazard. The list 724 can render a Safety ID data field for one or more of the selected protective measures, allowing the user to assign an identifier to the measure. Selected protective measures that are safety functions, and which will therefore require further design specifications in a later interaction with the system 102, can be flagged with an appropriate indicator 730 (e.g., a red flag icon).

Dialog window 702 also includes a selection field 726 for specifying the required safety performance (PLr or SIL) for the identified safety function. Initially, this safety performance selection field 726 can be prepopulated with a PLr or SIL for the safety function calculated by the risk assessment component 106 based on the hazard information submitted by the user. This calculated safety performance represents a minimum degree of safety equipment performance for mitigating the hazard that satisfies prescribed safety standards (e.g., ISO 13849-1 or IEC 62061) given a likelihood and severity of the risk posed by the hazard. In general, the required safety performance is defined by the severity of injury that can result from improper interaction with the access point, a frequency of exposure to the risk, and a possibility of avoiding the injury. The risk assessment component 106 can determine the required safety performance based on industrial safety standards prescribed for the region in which the safety system is being designed, and as a function of the type of risk posed by the hazard, a probability of injury, a possibility of avoiding injury, or other such factors.

Figure 7D:
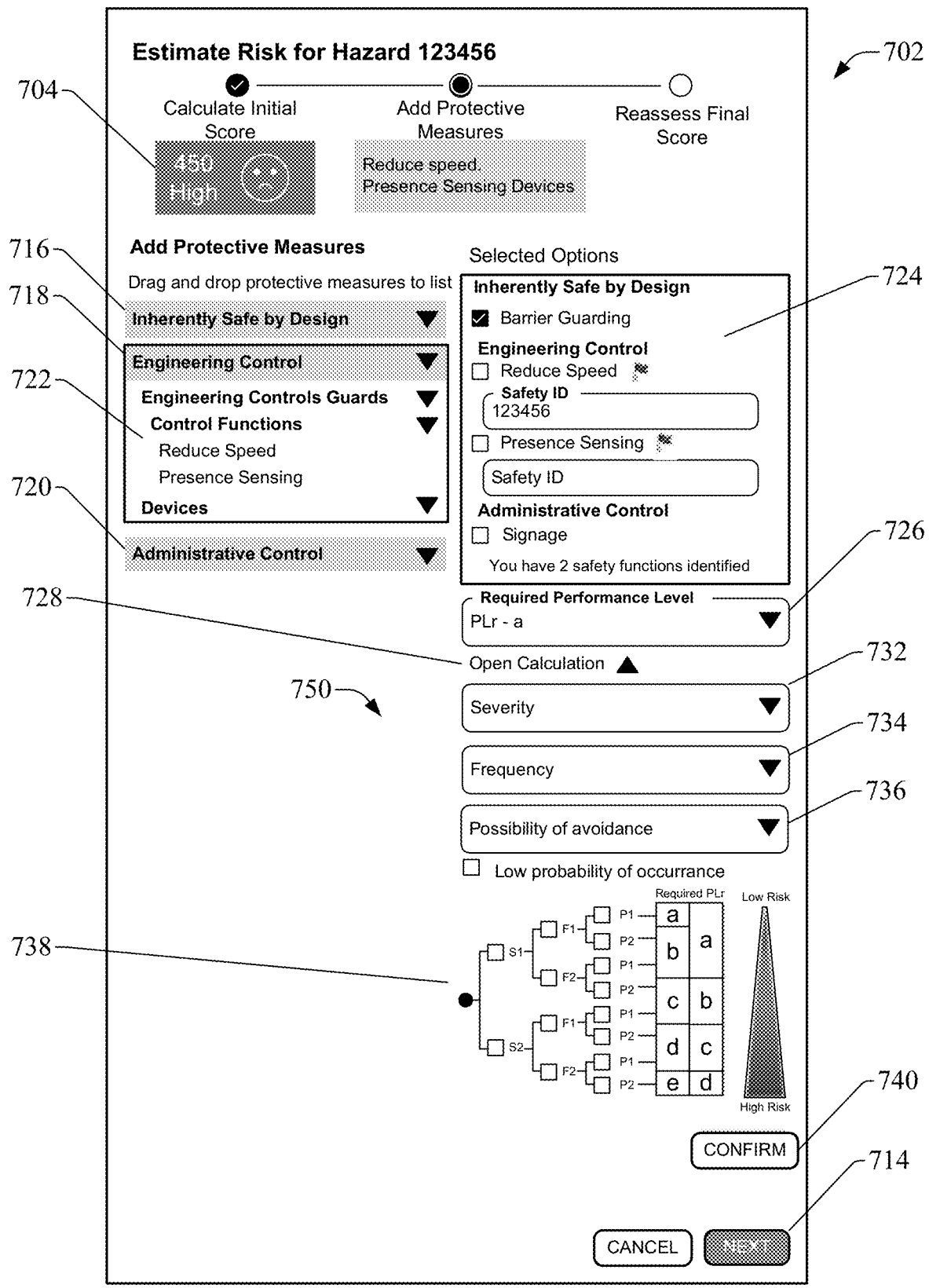
Figure 8:
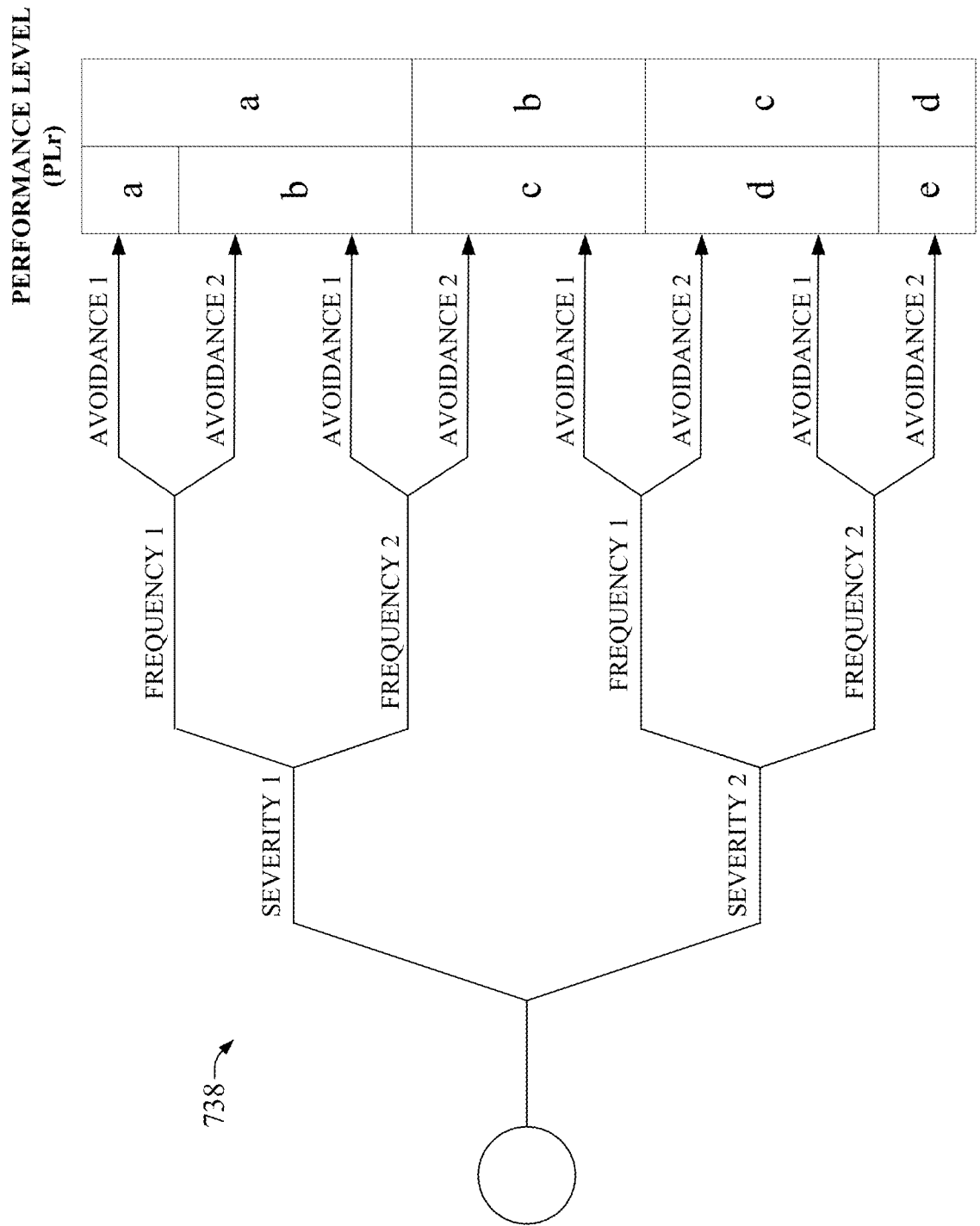
FIG. 8 is an example risk graph for determining a suitable performance level for a safety function.

If desired, the user can modify the calculated safety performance by selecting a different safety performance from the drop-down selection field 726, which lists the available safety performance values. To assist the user, dialog window 702 can display a calculation guidance section that assists the user in determining a required safety performance of the safety function. This calculation guidance section can be invoked by selecting an Open Calculation control 728 located below the safety performance selection field 726. FIG. 7d depicts an example dialog window 702 with the calculation guidance section 750 displayed. The calculation guidance section 750 includes data fields that allow the user to select a severity (data field 732), a frequency (data field 734), and a possibility of avoidance (data field 736) for the hazard. Based on the user's selections for these data fields, the risk assessment component 106 can identify a suitable performance level of a safety function for mitigating the hazard, as determined based on the risk graph 738. Turning briefly to FIG. 8, an example risk graph 738 for determining a suitable performance level is depicted. Based on the user's selections for the severity (severity 1 or 2), frequency (frequency 1 or 2), and possibility of avoidance (avoidance 1 or 2), the risk graph 738 is navigated to determine the appropriate performance level. The available performance levels can depend on the safety standard under which the safety system is being designed. For example, the EN ISO 13849-1 standard defines five performance levels ("a" through "e") defining respective five levels of system reliability and capability. Other standards only define four performance levels ("a" through "d).

Returning to FIG. 7d, once the user has entered values for the severity, frequency, and possibility of avoidance in the calculation guidance section 750, the user's selections and resulting performance level result can be graphically highlighted on the risk graph 738. Selection of the confirm button 740 sets the calculated performance level in data field 726.

Figure 7E:
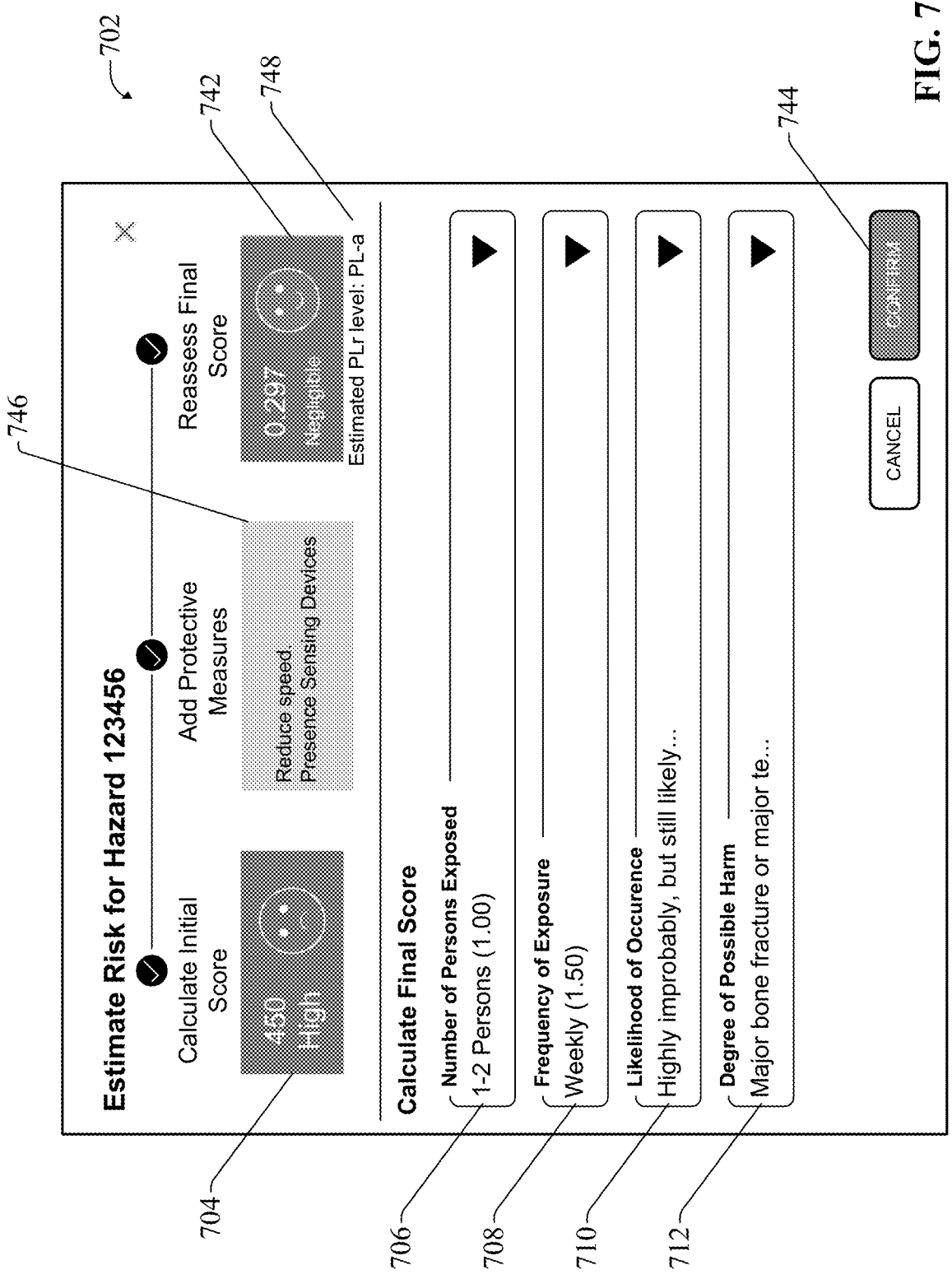

Once the user has entered the safety measure data for the hazard, selection of the Next button 714 causes the risk assessment component 106 to reassess the risk score assuming installation of the selected safety measures, yielding a final risk score. This final risk score is rendered on the dialog window 702 as shown in FIG. 7e. This view summarizes the results of the risk assessment, displaying the initial risk score 704 for the hazard prior to addition of protective measures, a list 746 of the protective measures defined for the hazard in previous steps, and a final risk score 742 for the hazard after the protective measures have been added. The estimated safety performance 748 is also displayed below the final risk score 742.

The risk assessment workflow described above in connection with FIGS. 7a-7e can be iterative, in that the user can return to previous steps to modify the selected protective measures as desired and the risk assessment component 106 will re-evaluate the final risk score 742 based on the modifications. In this way, the system 102 allows the user to evaluate different safety measures or combinations of safety measures to determine their impact on the final risk score 742 and to ascertain a set of protective measures that yields a suitable degree of risk mitigation for the hazard.

Figure 9A:
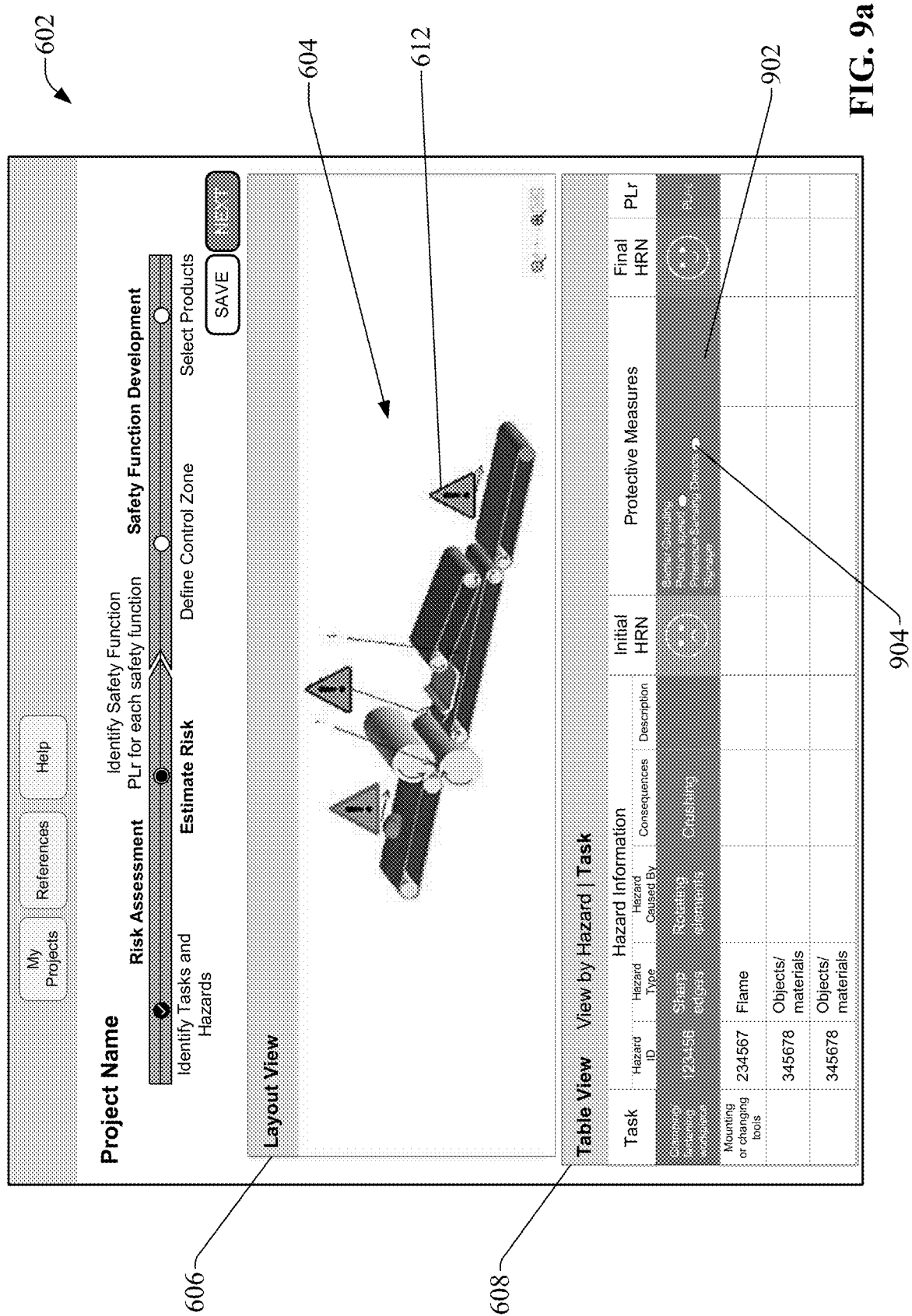
FIGS. 9*a*-9*b* are views of an interface display in which risk assessment results are depicted in a table view.
Figure 9B:
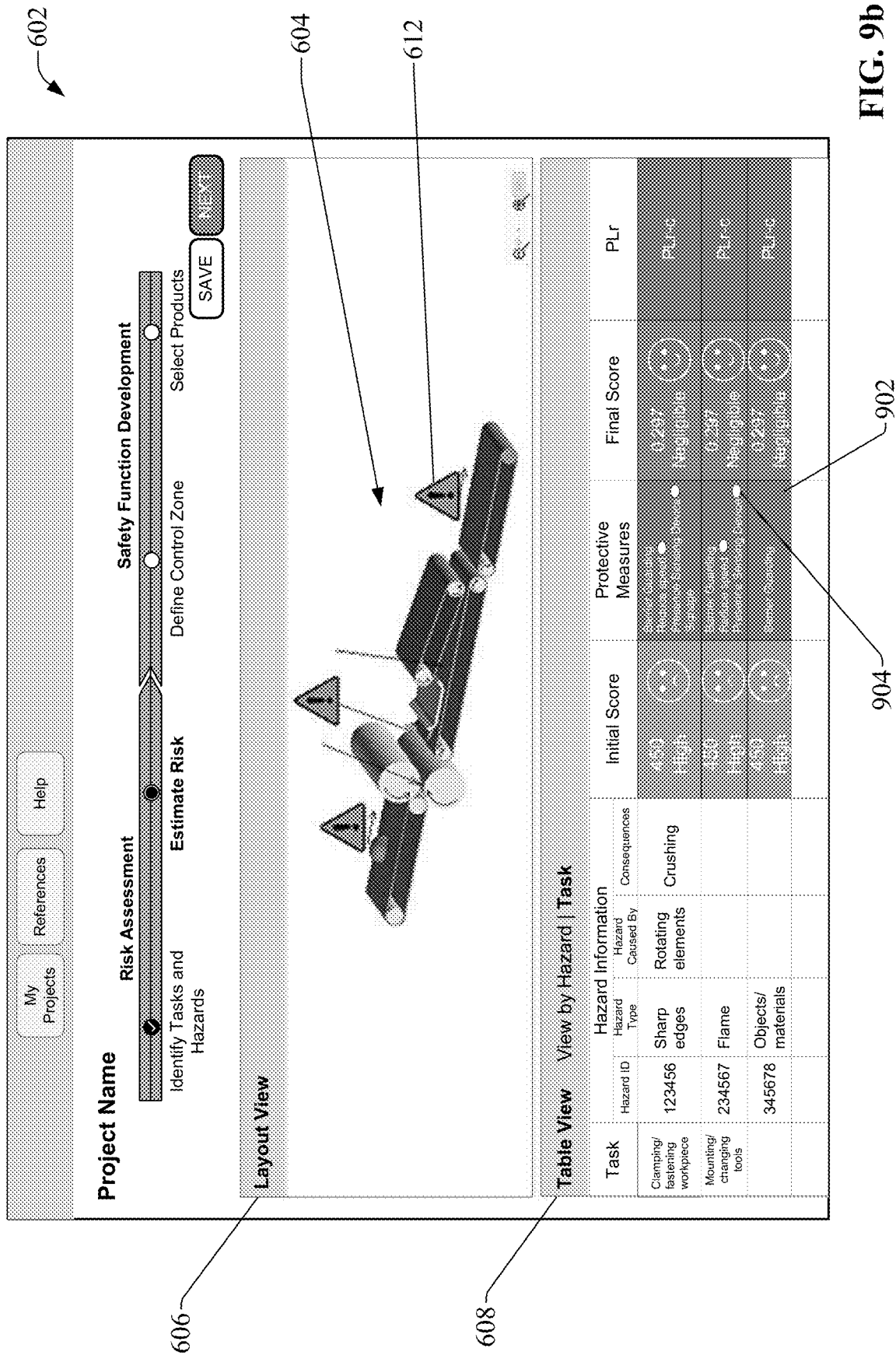

Once the user has finalized selection of protective measures for the selected hazard, selection of the Confirm button 744 on the dialog window 702 returns the system 102 to the interface display 602, as illustrated in FIG. 9a. Since the risk assessment phase has been completed, the entry for the hazard in the table view 608 has now been populated with the results of the risk assessment, including the initial HNR score calculated by the risk assessment component 106, the protective measures specified by the user, the final HNR score calculated by the risk assessment component 106, and the performance level. The risk assessment workflow described above in connection with FIGS. 7a-7e can be repeated for each defined hazard so that each hazard has its own set of risk assessment data. FIG. 9b is another view of interface display 602 in which risk assessment results are depicted for multiple hazards in the table view 608. In the protective measures field 902 for each hazard, any protective measures that are safety functions are flagged with a suitable icon 904 (e.g., a red flag indicator or other type of icon), indicating that these safety functions will require further definition during the subsequent safety function development phase of the workflow. These flagged safety functions correspond to those that were flagged with indicator 730 in dialog window 702.

Figure 10:
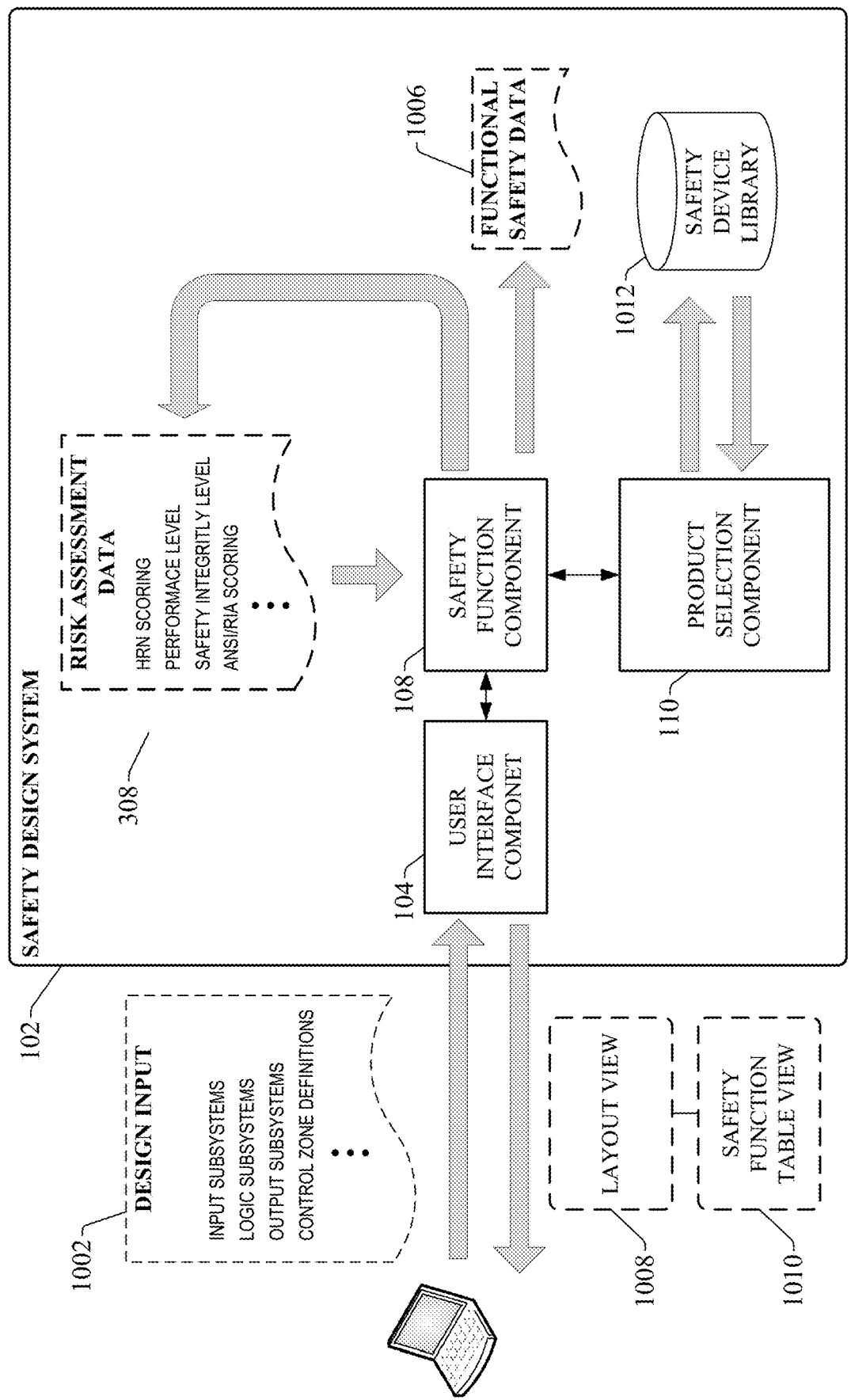
FIG. 10 is a diagram illustrating generalized data flows associated with a safety function development phase.

With the risk assessment phase of the safety system design complete, the system 102 can proceed to the safety function development phase of the workflow. FIG. 10 is a diagram illustrating generalized data flows associated with the safety function development phase according to one or more embodiments. Although the present example assumes that the safety function development phase continues from the risk assessment phase described above, the user may choose to skip the risk assessment phase and begin the workflow at the safety function development phase if a separate risk assessment has been already performed using other risk assessment tools or methods.

The system's user interface component 104 renders graphical interfaces and associated dialog windows that guide the user through the process of submitting design input 1002 for respective safety functions. As will be described in more detail below, this design input 1002 can include, but is not limited to, identification of technology groups for a complete safety function, including input, logic, and output subsystems; control zone definitions; span of control; or other such safety function design information.

To assist the user in selecting suitable safety devices that yield safety functions in compliance with relevant industrial safety standards, and which satisfy the performance levels required for each hazard, a product selection component 110 can present filtered subsets of available safety device products for each of the input, logic, and output device categories. In this regard, the safety design system 102 can maintain a safety device library 1012 that stores specification data for a range of input, output, and logic safety devices. As will be described in more detail below, at relevant stages of the safety function development workflow, product selection component 110 can select and present an appropriate subset of these devices for user selection based on a determination of which available devices satisfy the required performance levels for the safety functions, as determined by the risk assessment analysis.

As with the risk assessment phase, the user interface component 104 allows this design input 1002 to be entered and viewed via an interface display that provides two simultaneous views of the safety function information—a layout view 1008 and a table view 1010. The system 102 allows the user to enter and edit portions of the design input 1002 via either of these two views. Changes entered via one of these two views are reflected in the presentation of information in the other of the two views. Based on the safety function design input 1002 submitted by the user, as well as the risk assessment data 308 generated during the risk assessment phase of the workflow (e.g., HRN scoring, ANSI/RIA scoring, performance levels, SIL levels, etc.), safety function component 108 generates functional safety data 1006 that documents the hazards and the associated safety function designs for mitigating the risks posed by the hazards. If the design input 1002 is determined to alter a portion of the risk assessment data 308—e.g., by changing one or more of the HRN scores—safety function component 108 can also update the risk assessment data 308 accordingly.

Figure 11A:
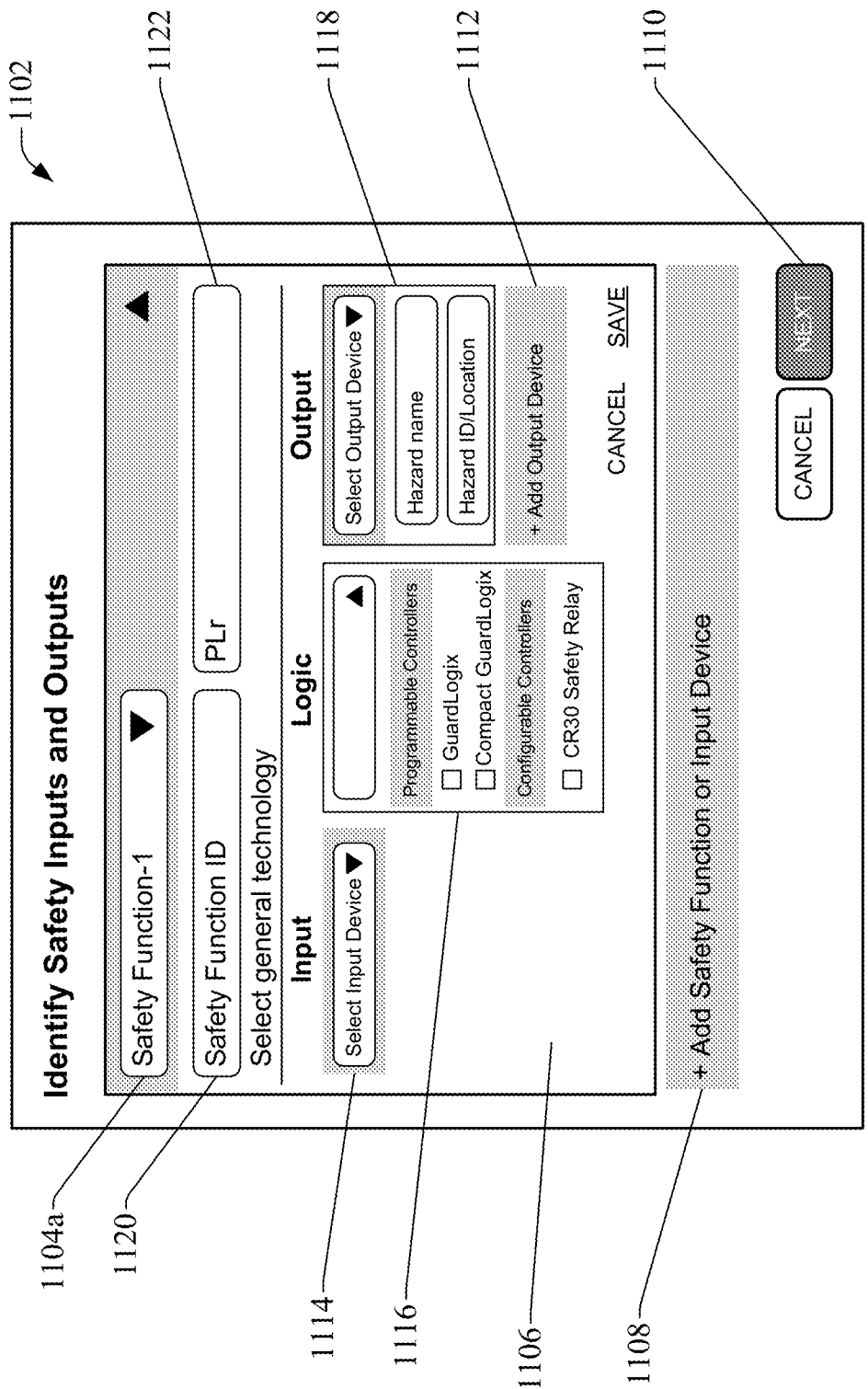
FIGS. 11*a*-11*b* are views of an example dialog window for specifying safety inputs and outputs for defined safety functions.
Figure 11B:
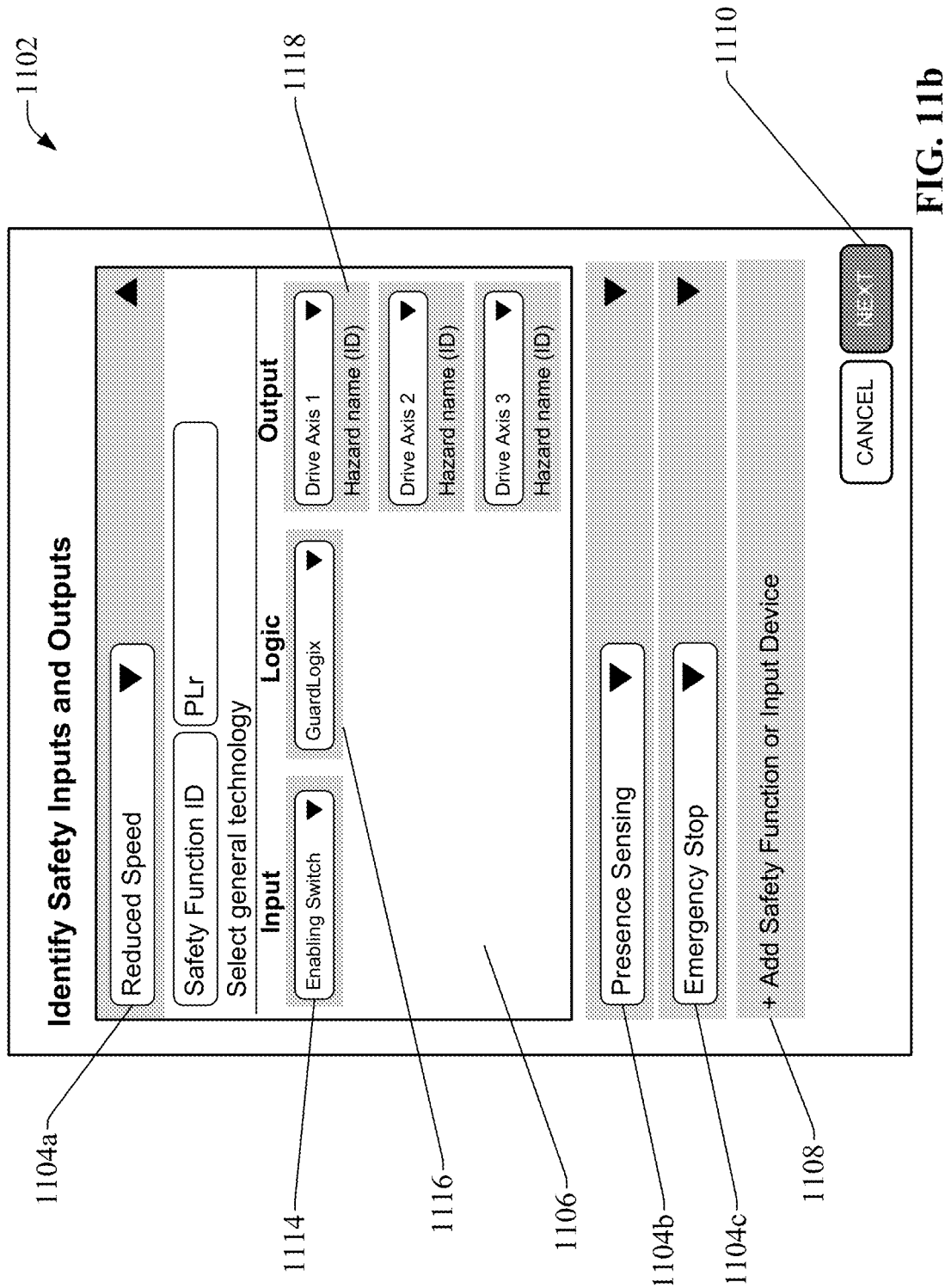

FIGS. 11a and 11b are views of an example dialog window 1102 that can be generated by the user interface component 104 for specifying safety inputs and outputs for each defined safety function according to one or more embodiments. As noted above, any specified protective measures that are safety functions—i.e., protective measures displayed in the protective measures fields 902 of the table view 608 that were flagged with an icon 904—require further design specification to identify a suitable combination of input, logic, and/or output safety devices for the safety function. A safety function typically comprises at least one input device for detecting a user action requiring a safety countermeasure to be performed (e.g., a light curtain, a pressure mat, an interlock switch, etc.), at least one output device to which the safety action is directed (e.g., a safety contactor for isolating power to a hazardous device, a variable frequency drive with integrated safety functionality, etc.), and a logic device for controlling the output device based on signaling received from the input device (e.g., a programmable safety controller, a safety relay, etc.). These safety devices must be selected and configured such that the resulting safety function meets the required performance level or category specified for the safety function. Dialog window 1102 can assist the user in selecting a suitable combination of these safety devices for each safety function in accordance with the required performance levels that were determined by the risk assessment.

Dialog window 1102 includes a data field 1104a that allows the user to identify a safety function for which input, logic, and/or output devices are to be specified. In some embodiments, data field 1104a can be a drop-down selection box that is populated with the safety functions that were specified for one or more hazards as part of the risk assessment phase of the workflow (i.e., the protective measures added to list 724 of dialog window 702 that were flagged as being safety functions). The safety function identifier and the performance level for the selected safety function—which were set during the risk assessment phase—are displayed in data fields 1120 and 1122, respectively.

Selection of a safety function in data field 1104a causes a technology section 1106 to be displayed. This section 1106 allows the user to select general technology groups for each of the input, logic, and output devices that will make up the safety function. To this end, technology section 1106 includes an input section 1114 for selecting a type of input safety device, a logic section 1116 for selecting a type of logic device, and an output section 1118 for selecting one or more types of output devices. Each section 1114, 1116, 1118 includes a drop-down selection box that, when selected, causes a filtered set of suitable devices or device types to be displayed below the selection box. In the example depicted in FIG. 11a, the user has selected the logic selection box in the logic section 1116, which causes a listing of logic devices to be displayed below the selection box for user selection.

Selectable input device technologies that can be selected in via the input section 1114 can include, but are not limited to, enabling switches, light curtains, emergency stop push-buttons, safety mats, safety pull cords, photosensors, safety gate switches, or other such input devices. Example logic device technologies that can be selected via the logic device section 1116 can include, but are not limited to, various categories of safety relays (e.g., classes or product lines of safety relays offered by one or more product vendors). Example output device technologies that can be selected via section 1118 can include, but are not limited to, drive axes, contactors (e.g., motor starters, conveyor starts, etc.), disconnect switches, robot axes, or other such categories of output devices.

In the example depicted in FIG. 11*a*, the user has selected the drop-down selection box in the logic section 1116, which causes a list of candidate logic device categories selected by the product selection component 110 (e.g., GuardLogix, Compact GuardLogix, CR30 Safety Relay, etc.) to be displayed in that section. Dialog window 1102 can organize the list of device types according to any suitable categorization. In the example depicted in FIG. 11*a*, the selectable device types are organized under Programmable Controller and Configurable Controller categorizations. Selection of a logic device type from this list causes the safety function component 108 to associate the selected type of logic device with the safety function that is currently being configured.

A similar selection process can be used to select an input device type and one or more output device types for the safety function currently being configured. Since a safety function may have more than one associated output device—e.g., in a case in which the function's safety response must alter the behavior of multiple devices or machines—the output section 1118 of the dialog window 1102 can allow the user to select multiple types of safety output devices for a given safety function. Additional safety output devices can be added to the safety function design by selecting an Add Output Device button 1112 in the output section 1118. As shown in FIG. 11*a*, data fields under each output device selection box allow the user to provide a hazard name and a hazard ID or location for the output device. This information can be used by the reporting component 112 in connection with generating safety function requirement specification (SFRS) documentation after the safety function development is complete.

FIG. 11*b* depicts the dialog window 1102 after multiple safety functions have been defined. As shown in this example, the user has configured Reduced Speed, Presence Sensing, and Emergency Stop safety functions. These safety functions were selected during the risk assessment phase of the workflow using dialog window 702 and have now been further developed using dialog window 1102, which has allowed the user to specify input, logic, and output device technologies for each safety function. Each safety function can be selectively expanded or collapsed, allowing the user to view or hide the configuration details (in FIG. 11*b*, the Reduced Speed safety function is expanded while the remaining safety functions are collapsed). As shown in the example depicted in FIG. 11*b*, three output devices—Drive Axis 1, Drive Axis 2, and Drive Axis 3—have been assigned to the Reduced Speed safety function, indicating that the safe states of these three devices will be controlled by the Reduced Speed safety function. Dialog window 1102 also allows the user to assign a Hazard Name or ID to each output device. As will be described in more detail below, the system 102 will guide the user through the process of selecting specific input, logic, and output device products at a later step of the safety function development workflow.

Once all safety functions have been assigned input, logic, and output device technologies, selection of the Next button 1110 causes the system to proceed to the next step of the workflow, in which spans of control are defined. FIGS. 12*a*-12*f* are views of interface display 602 for defining spans of control for safety functions. Similar to the views depicted in FIGS. 6*a*-6*c*, interface display 602 simultaneously renders a layout view 1008 and a table view 1010, which in this case will be used to view and configure spans of control for the safety functions defined in previous steps of the design workflow. During this phase of the design workflow, the left side of the layout view 1008 displays a hazard section 1202 listing the hazard IDs that were specified for the respective output devices using dialog window 1102 (see section 1118 of FIGS. 11*a* and 11*b*), and a safety function section 1204 that displays selectable graphical icons representing the safety functions defined for the hazards as labeled graphical icons. The table view 1010 now tabulates the defined safety functions, such that each row of the table corresponds to one of the safety functions that were specified using dialog window 1102. Each row comprises data fields containing information about the corresponding safety function—including a unique safety function identifier, at type of the safety function (e.g., reduced speed, presence sensing, emergency stop, etc.), and the type of input device specified for the safety function, as defined previously using dialog window 1102. Each row also comprises one or more data fields corresponding to safety output devices associated with the industrial machine. These fields correspond to the output devices specified in section 1118 of dialog window 1102 (see FIGS. 11*a* and 11*b*), where the output devices correspond to respective hazards listed in the hazard section 1202 of the layout view 1008. Each of these output device data fields comprises a checkbox 1220 indicting whether the corresponding output device is part of the safety function (that is, whether the safety function's safety response will affect the output device).

Figure 12A:
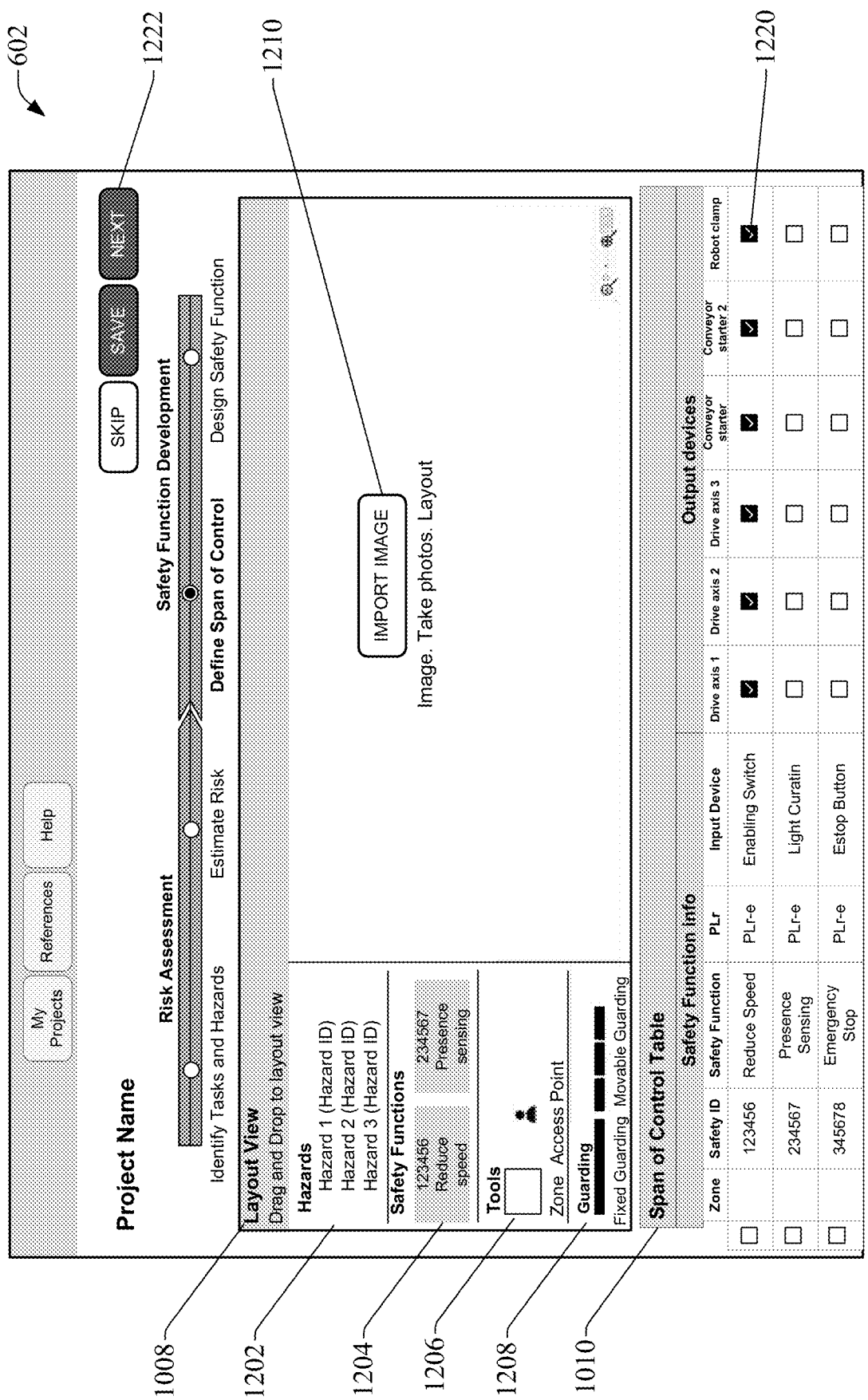
FIGS. 12*a*-12*f* are views of an interface display for defining spans of control for safety functions.
Figure 12B:
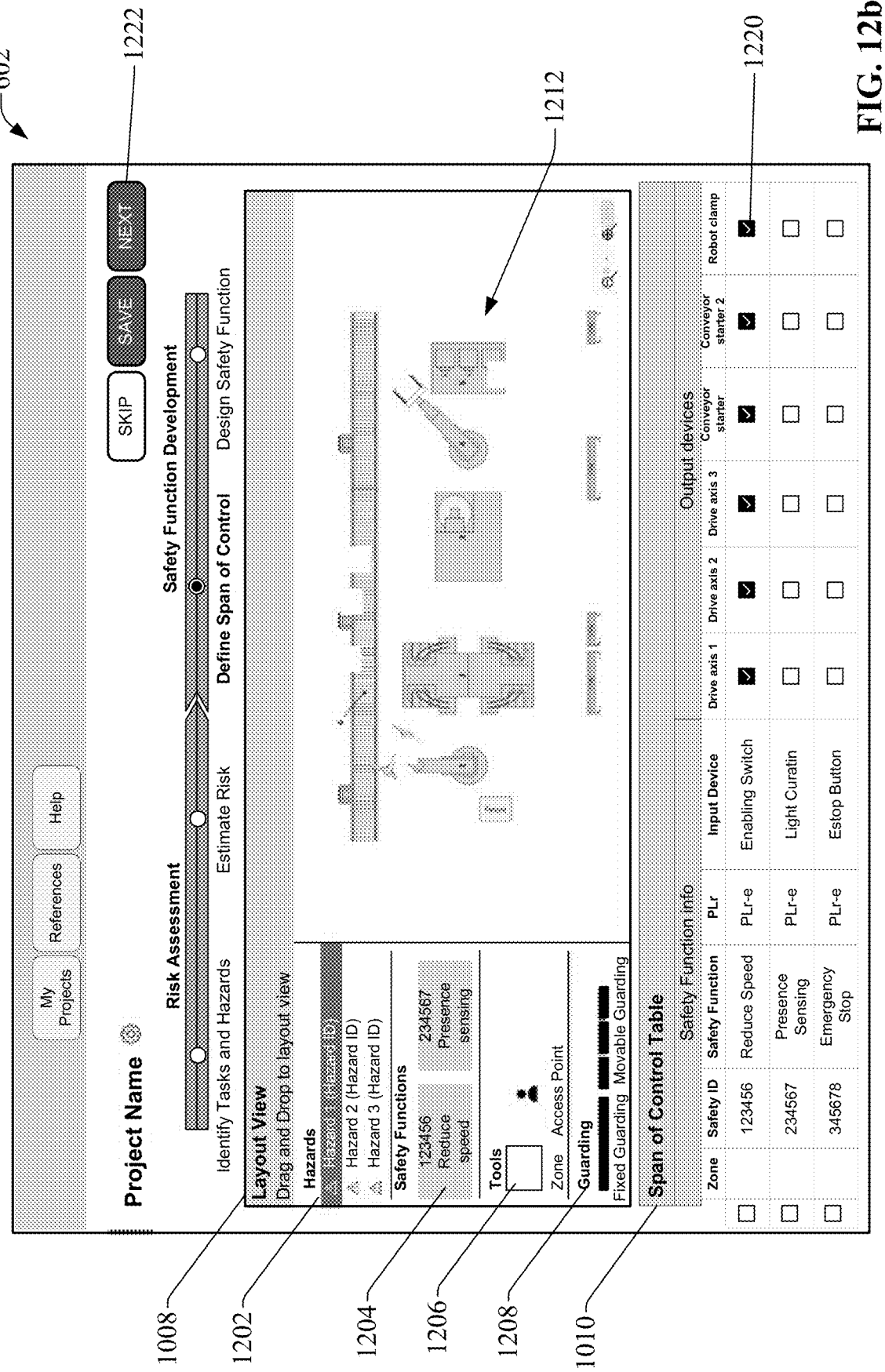

As shown in FIG. 12*a*, the right side of the layout view 1008 contains an Import Image button 1210 that allows the user to import a layout image of the industrial machine or line for which the safety system is being designed so that safety zones and spans of control for the safety functions can be defined. As shown in FIG. 12*b*, the imported layout image 1212 is rendered on the right side of the layout view 1008. Layout image 1212 can be imported from any suitable source, including but not limited to a computer assisted design (CAD) system in which the image 1212 was originally developed.

Figure 12C:
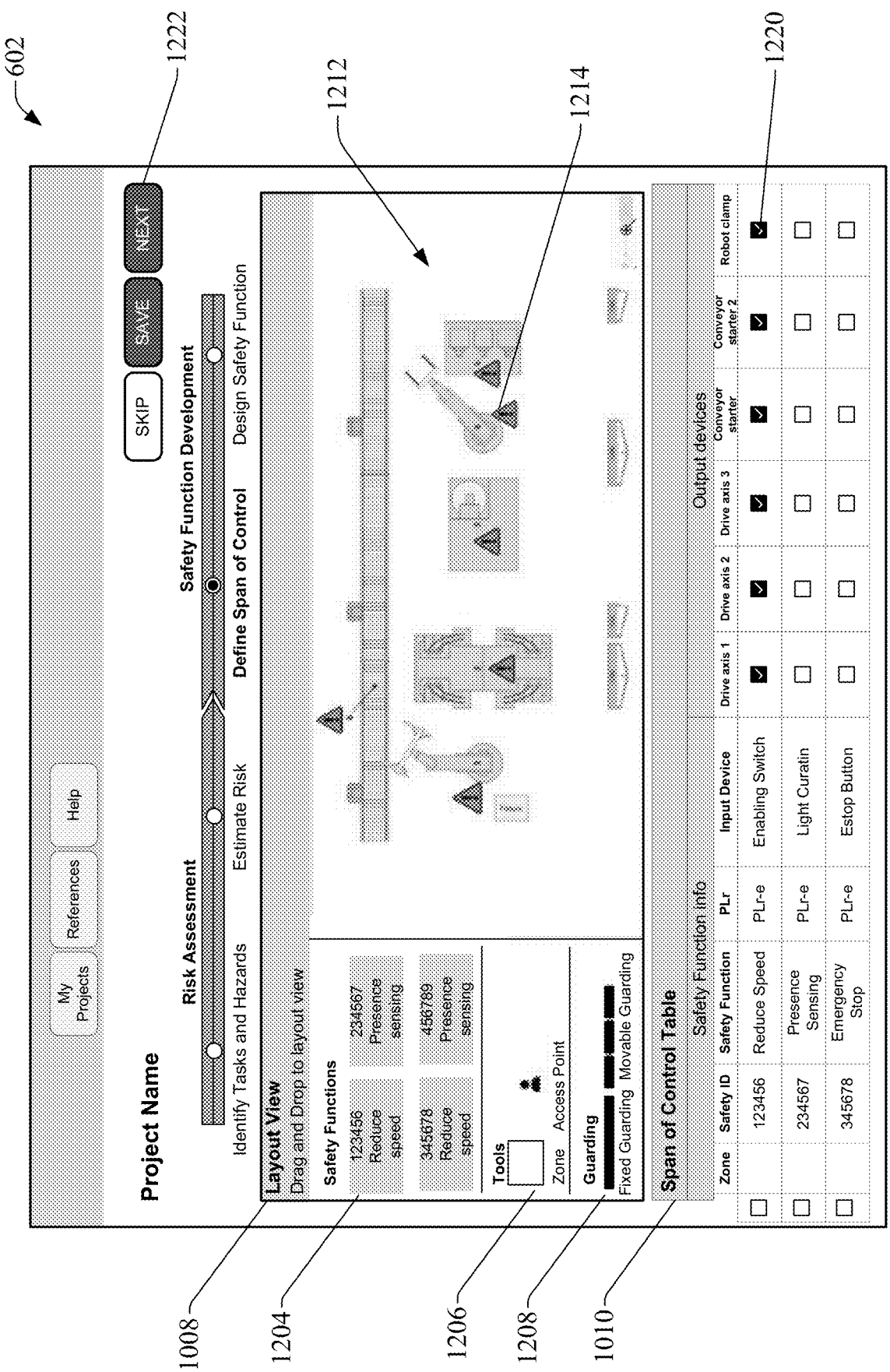

Once image 1212 has been imported into the project, the user can interact with the image 1212 to specify locations of the hazards (each corresponding to an output device) on the image 1212, and to define safety zones for each safety function. With reference to FIG. 12*b*, a hazard can be added to the layout image 1212 by selecting the hazard from the hazard section 1202 on the left side of the layout view 606 and dragging the selected hazard to a selected location on the image 1212 corresponding to the location of the hazard. As shown in FIG. 12*c*, when a hazard is linked to the image 1212 in this manner, the user interface component 104 renders a suitable hazard icon 1214 on or near the designated hazard location. This association between the hazard and the location is also recorded by the safety function component 108 as part of the functional safety data 1006 (see FIG. 10). In the examples depicted in FIGS. 12*a*-12*e*, six output devices are shown in the table view 1010, corresponding to six hazard icons 1214 in the layout view 1008.

Figure 12D:
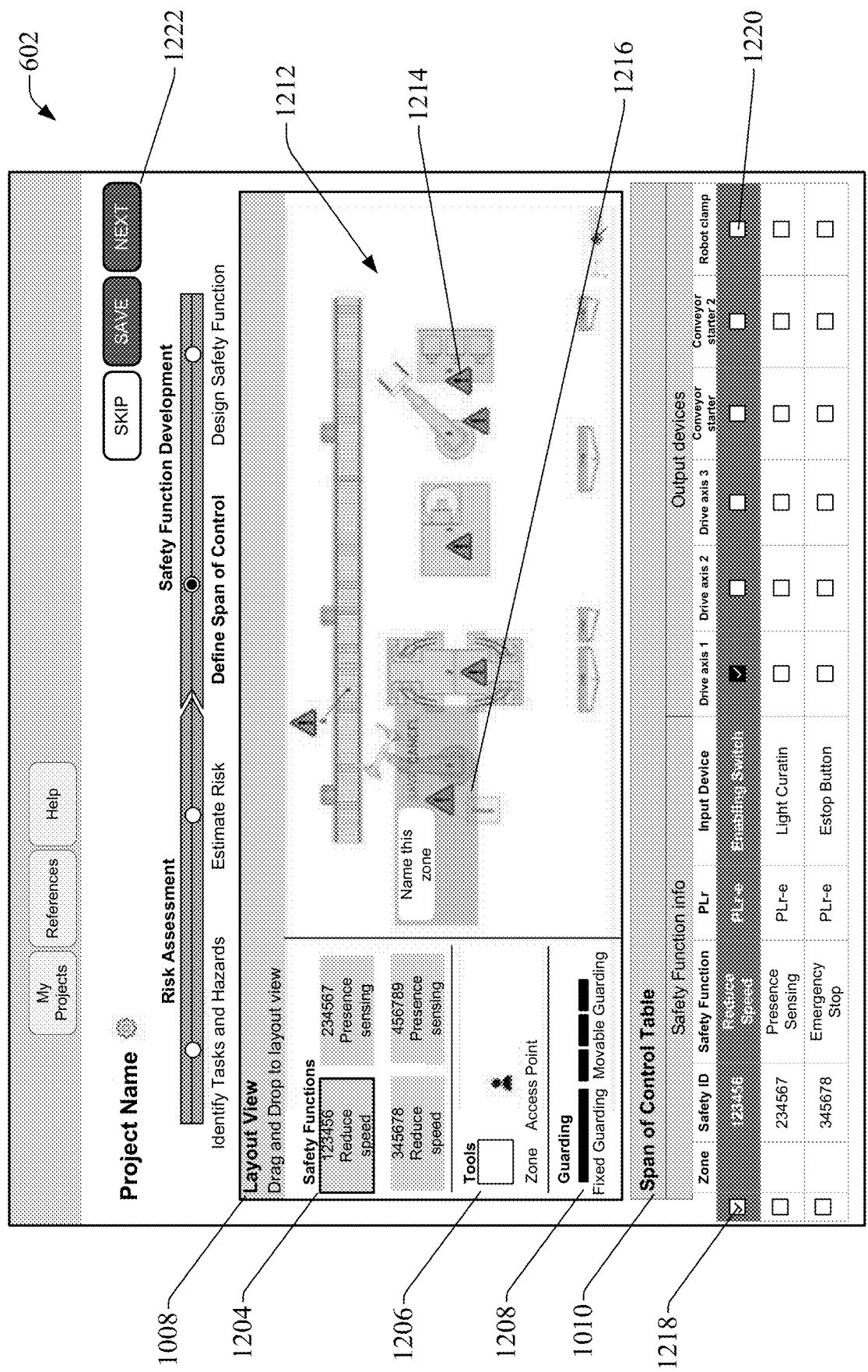

Similar to the risk assessment workflow described above in connection with FIGS. 6*a*-6*c*, interface display 602 allows the user to view and edit the safety function configurations in the layout view 1008 and table view 1010 within the same presentation, such that edits made in one of the two views will inform the data presentation of the other view. In the present phase of the workflow, this includes defining safety zones for each of the safety functions—that is, areas of the machine layout containing hazards whose safe states are controlled by the respective safety functions. FIG. 12*d* illustrates addition of a safety zone 1216 to the image 1212 of the industrial production line. The two views 1008 and 1010 presented by interface display 602 offer multiple approaches for defining a zone 1216.

According to a first approach in which a zone 1216 is defined via interaction with the layout view 1008, the user can first select a safety function for which the zone is to be defined, by selecting the safety function in either the table view 1010 (by selecting a checkbox 1218 in the row corresponding to the safety function) or the safety function section 1204 of the layout view 1008 (by selecting the safety function icon corresponding to the safety function). When a safety function is selected, the selected safety function is highlighted in both of the two views, as shown in FIG. 12*d*. In the illustrated example, the user has assigned a Reduce Speed safety function to the zone 1216.

The user can then select a Zone tool from a Tools section 1206 on the left side of the layout view 1008. Once this tool is selected, the user can interact with the image 1212 to draw the boundaries of a new zone 1216 that encompasses one or more of the hazards (represented by icons 1214) and the associated portions of the machine or line affected by the hazards. In an example embodiment, the zone tool can be a rectangular drawing tool that allows the user to draw and position a rectangular shape encompassing the hazards that fall within the zone 1216. As shown in FIG. 12*d*, the zone 1216 appears as a semitransparent rectangle superimposed over the relevant hazard and associated portions of the machine. In some embodiments, the user interface component 104 can also automatically adjust the size or dimensions of the zone if necessary to overlay the zone 1216 on top of a hazard that is inferred to be intended as part of the zone 1216. Once the zone 1216 has been drawn, the user can assign a name or identifier to the zone 1216 by typing the name into a field on the zone 1216. The safety function component 108 links the hazards encompassed by the zone, and their associated output devices, to the selected safety function.

When a safety zone 1216 is defined in this manner, the states of the output device checkboxes 1220 corresponding to the hazard icons 1214 that are encompassed by the zone 1216 are set (or checked). while checkboxes 1220 for safety devices whose corresponding hazard icons are not encompassed by the zone 1216 are unchecked. In the example depicted in FIG. 12*d*, the newly defined zone 1216 encompasses a hazard icon 1214 corresponding to output device Drive Axis 1. Accordingly, the checkbox 1220 for Drive Axis 1 is checked for the selected safety function while the other output device checkboxes 1220 remain unchecked.

Figure 12E:
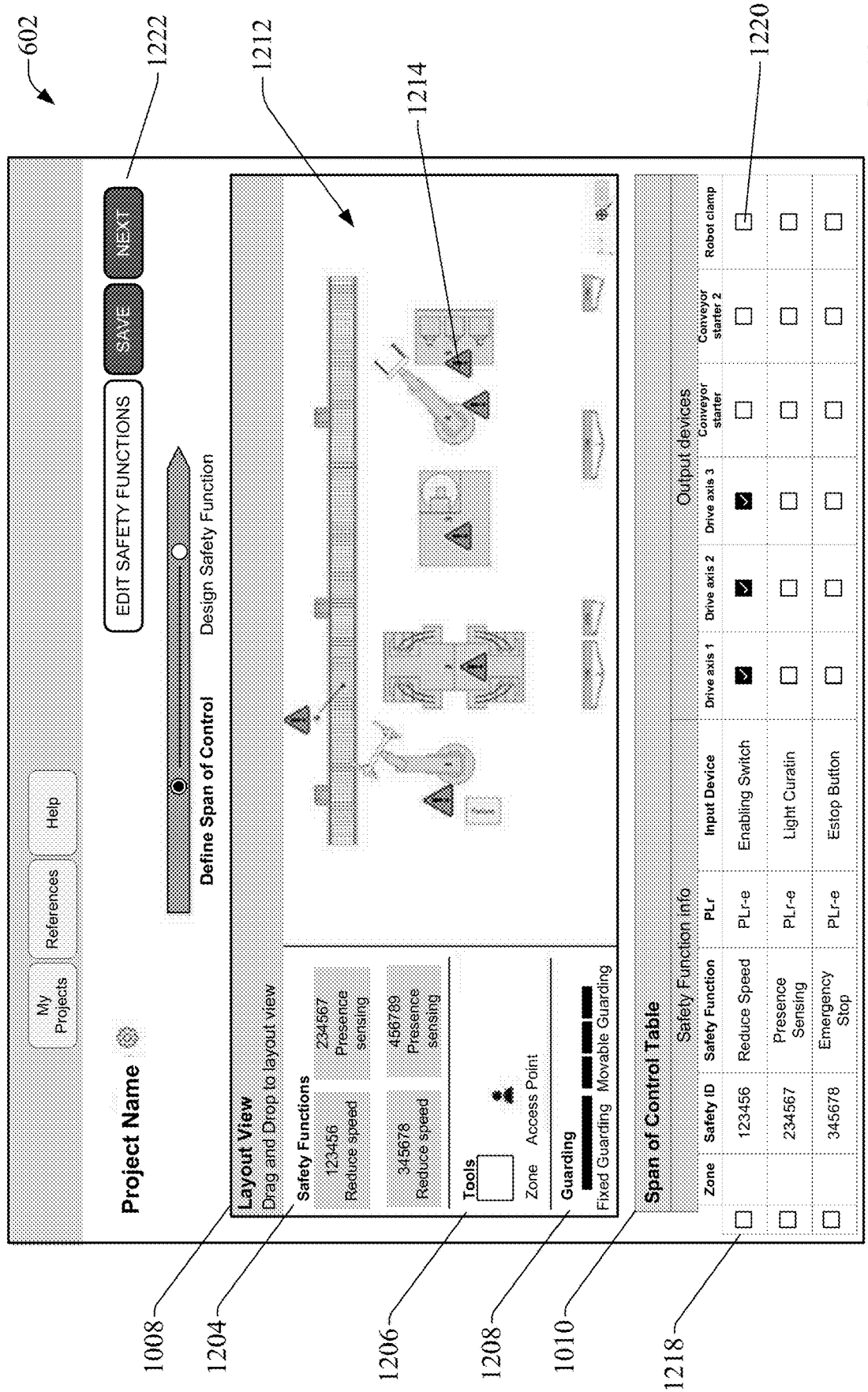
Figure 12F:
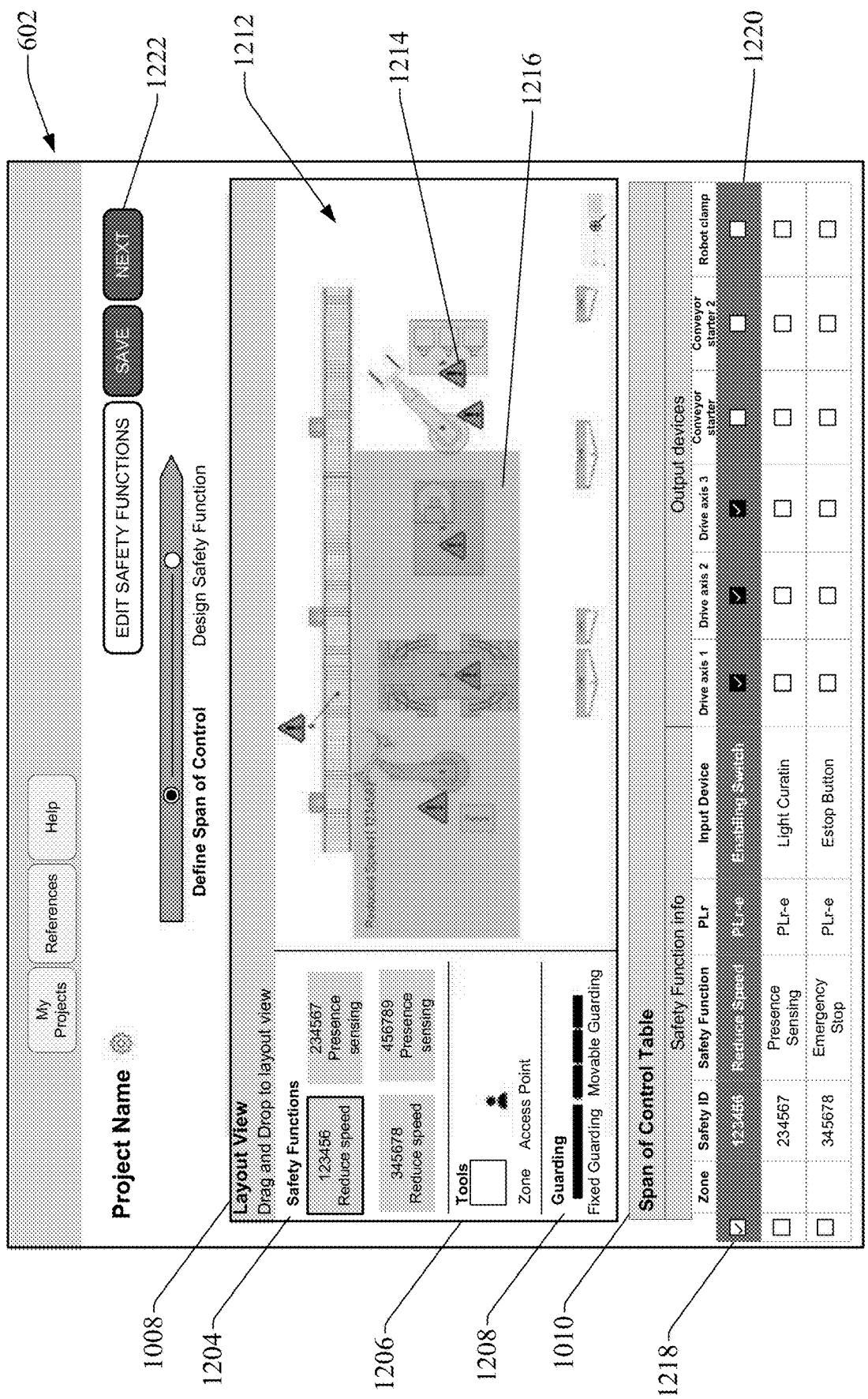

Zones 1216 can also be defined via interaction with the table view 1010. As shown in FIG. 12*e*, the user can select which output devices are to be included in a zone for a given safety function by setting the checkboxes 1220 corresponding to the desired output devices. In the illustrated example, Drive Axis 1, Drive Axis 2, and Drive Axis 3 have been selected to be included in the Reduce Speed safety function. Subsequently selecting this safety function, as shown in FIG. 12*f* (e.g., by selecting checkbox 218), causes the resulting safety zone 1216 to be displayed over the image 1212 in the layout view 1008. The user interface component 104 sizes and positions this zone 1216 based on the identities of the output devices selected by the user in the table view 1010, such that the zone 1216 encompasses the hazard areas corresponding to the selected output devices. While the zone 1216 is displayed, the user can dynamically adjust the span of the zone 1216—and thus the span of control for the safety function—by checking or unchecking selected output devices in the table view 608, which causes the size and shape of the zone 1216 to be adjusted accordingly in the layout view 1008.

Interface display 602 allows the user to iterate between these various approaches for defining a safety function's zone 1216 as desired. For example, the user can select, in the table view 1010, the output devices to be controlled by the safety function, which dynamically sizes and positions the zone 1216 on the layout view 1008 such that the hazards corresponding to the selected output devices are encompassed in the zone 1216. If desired, the user can adjust the size, shape, or position of the zone 1216 via interaction with the graphic of the zone 1216 in the layout view 1008; e.g., by dragging the zone 1216 to a new location over the image 1212 or by dragging the edges of the zone 1216 to resize as desired.

The user can define zones 1216 for each defined safety function in this manner. These zones 1216 represent the span of control for each safety function, defining the output devices—and corresponding portions of the industrial machine or line—whose safe states are controlled by the safety function. Based on the zone definitions, the safety function component 108 creates an association between each safety function and its corresponding zone 1216 and records this association as part of functional safety data 1006. The user-defined name of each zone 1216 is also indicated in a Zone data field of the table view 1010.

Once the zones 1216 have been defined for all safety functions, the user can navigate the interface display 602 to review the spans of control for selected safety functions. Selecting a row of the table view 1010 corresponding to a safety function of interest, or selecting the safety function in section 1204 of the layout view 1008, causes the zone 1216 corresponding to the selected safety function to be rendered on the image 1212, thereby providing a visual indication of which hazards are being addressed by the selected safety function. The additional safety function information in the table view 1010 also serves as a reminder of the performance level achieved by the safety function, the type of input device that triggers the safety function's safety response, and the output devices whose states are controlled by the safety function.

Figure 13:
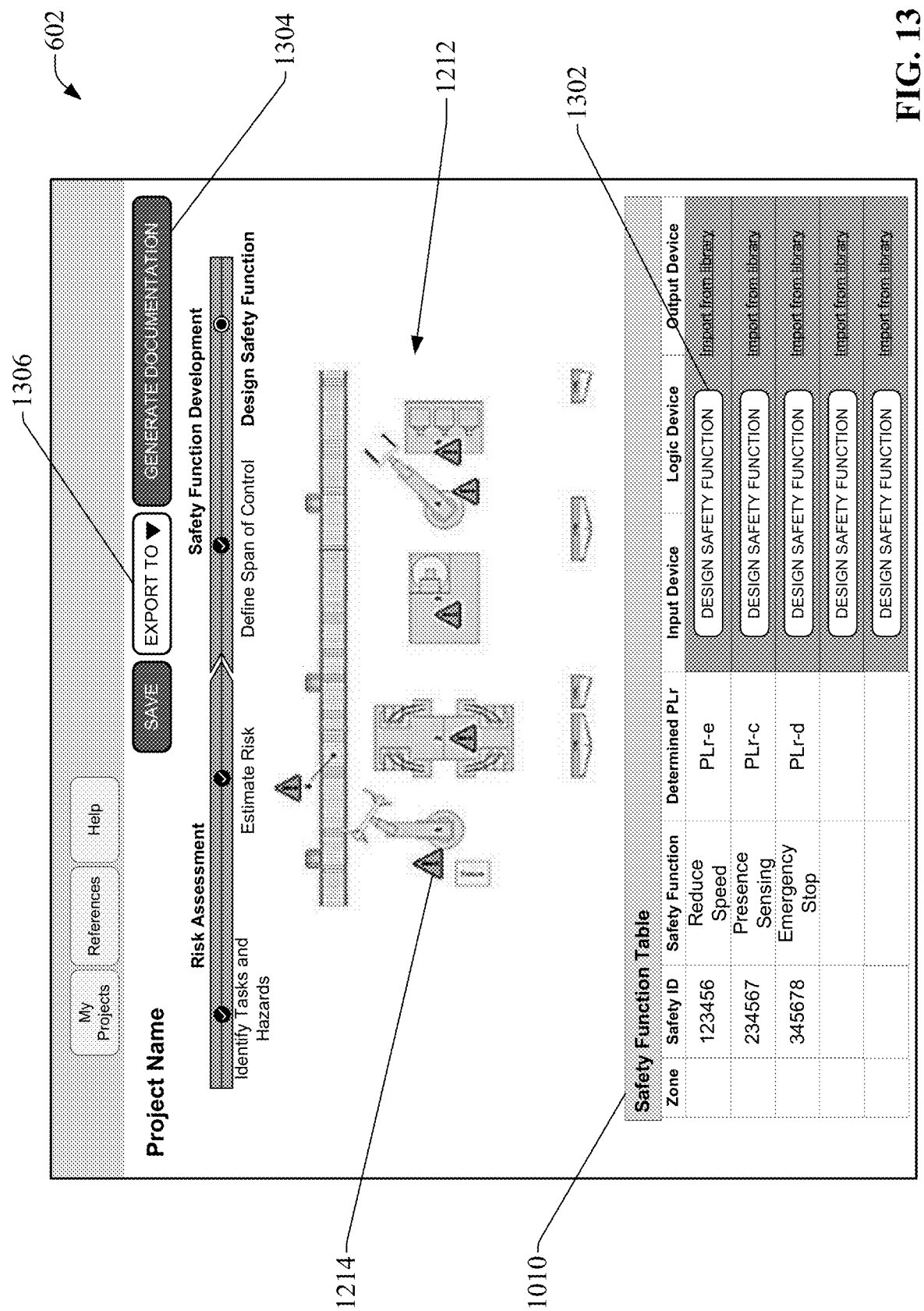
FIG. 13 is a view of an interface display for completing safety function designs for the respective safety functions.
Figure 14:
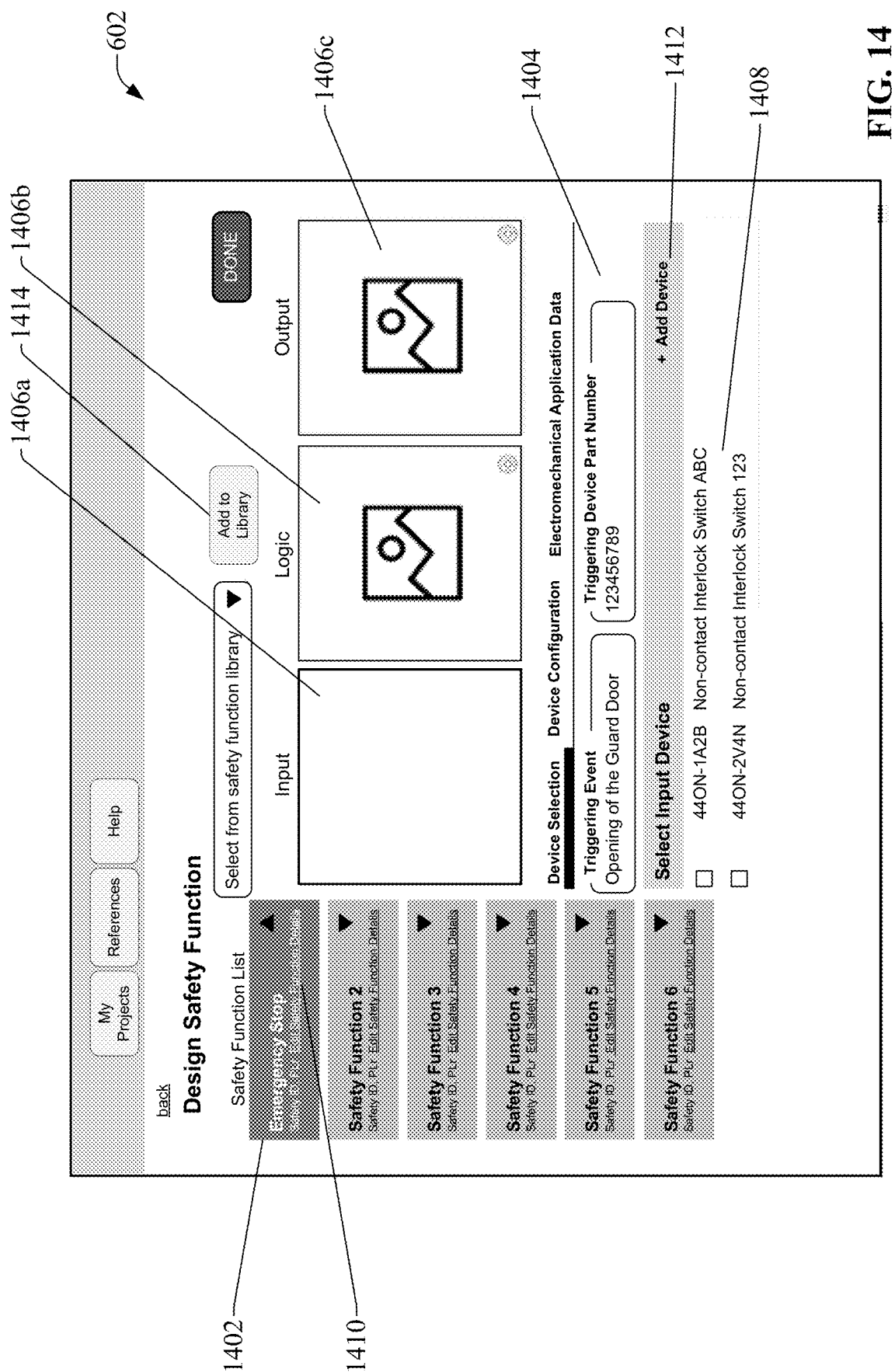
FIG. 14 is a view of an interface display in which a safety function design view is rendered.

After the zones have been defined, selecting the Next button 1222 causes the system to proceed to the next step of the workflow, which allows the user to complete the safety function designs by selecting specific products to be used for the input, logic, and output devices. FIG. 13 is a view of interface display 602 for completing the safety function designs for the respective safety functions defined in the previous steps of the workflow. In this view, each safety function in the table view 1010 includes a button 1302 that, when selected, causes the interface display 602 to render a safety function design view for selecting products for each of the input, logic, and output devices for the safety function. FIG. 14 is a view of interface display 602 in which the safety function design view is rendered. This view presents the user with a filtered set of candidate devices or products that can be selected for each of the input, logic, and output devices for the selected safety function.

In this example view, a list of icons 1402 representing each of the previously defined safety functions are displayed along the left side of the display 602, with the icon 1402 representing the selected safety function highlighted. Selectable fields 1406*a*-1406*c* for the input, output, and logic devices are also displayed. Selection of one of these fields 1406a-1406c causes a filtered list of candidate devices 1408 for the selected type of device—input, logic, or output—to be displayed in a device selection section 1408 of the display 602.

The filtered set of devices that are rendered as candidates for inclusion in the safety function can be selected by the product selection component 110 based in part on the required performance level or safety integrity level for the safety function—recorded in the risk assessment data 308 that was generated during the risk assessment phase of the workflow—as well as the technology or device type that was previously selected using dialog window 1102 as described above (see FIGS. 11a-11b).

Figure 15:
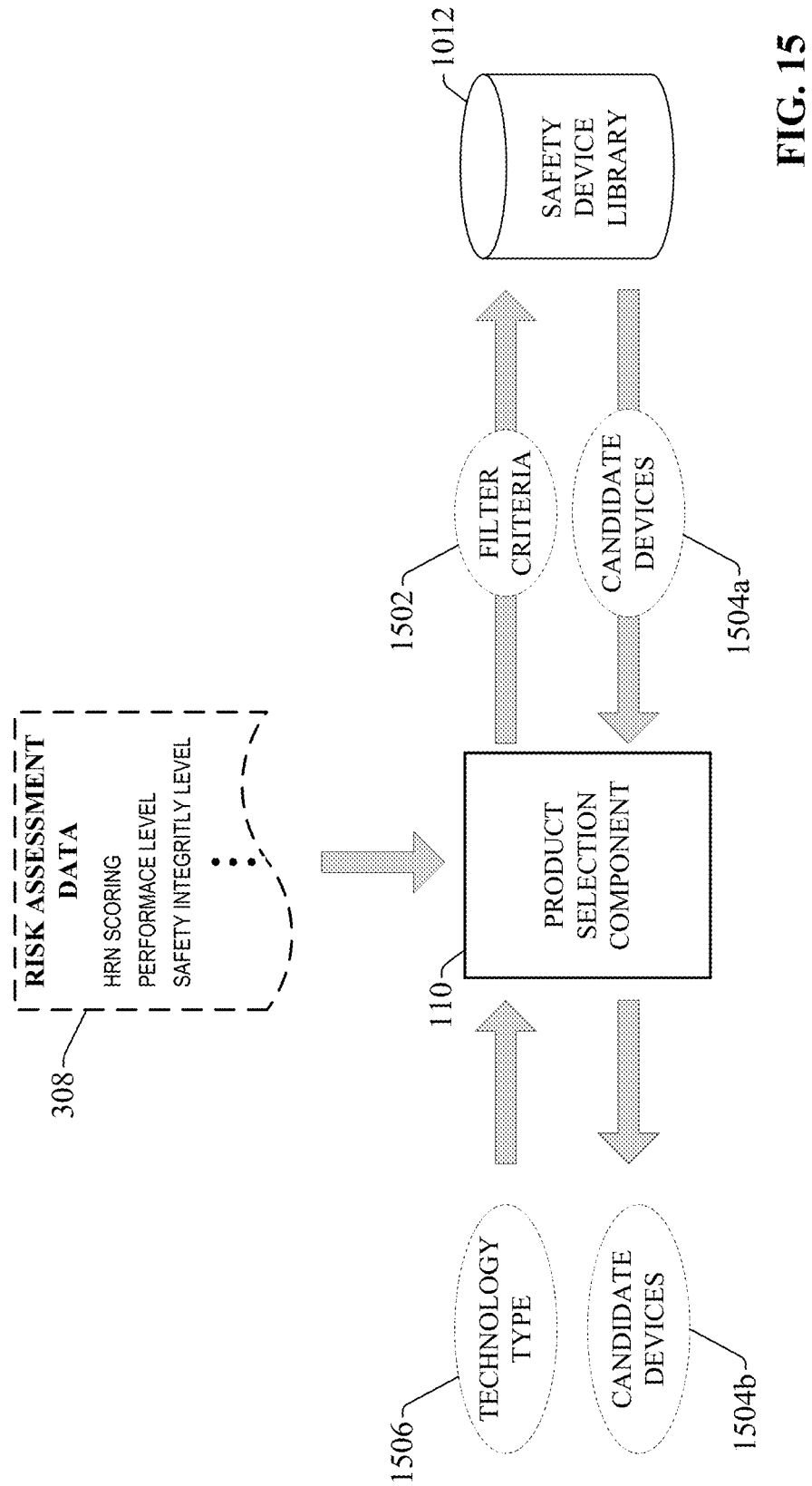
FIG. 15 is a diagram illustrating selection of a set of candidate devices by a product selection component for presentation to a user.

FIG. 15 is a diagram illustrating selection of a set of candidate devices 1504 by the product selection component 110 for presentation to the user. As noted above, the safety design system 102 maintains a safety device library 1012 that stores product data for a range of input, output, and logic safety devices. This product data can include, but is not limited to, a catalog number, a device description, device specification data, current pricing information, connector information, or other such information for the respective products. In one or more embodiments, safety device library 1012 can reside locally as part of the safety design system 102. Alternatively, safety device library 1012 can reside at a remote location accessible by the safety design system 102. For example, safety device library 1012 may reside on a web server accessible via an Internet connection. In another example, safety device library 1012 may reside on cloud-based storage accessible by client devices having appropriate access privileges (e.g., based on a subscription service). By maintaining safety device library 1012 on a web server or cloud platform for centralized access by multiple clients, the product information stored on the library 1012 can be kept current by product vendors having write access privileges to the library 1012.

Based on the risk assessment data 308 obtained during the risk assessment analysis for a given safety function—including risk score (HRN or ANSI RIA) for each identified hazard or a required performance level and/or SIL level for the safety function—as well as the technology type 1506 previously specified by the user, the product selection component 110 generates filter criteria data 1502 designed to select a subset of safety devices defined in the library 1012 that correspond to the selected technology type 1506 (e.g., light curtain, emergency stop push button, enabling switch, safety relay, contactor, etc.), and that satisfy the performance requirements and/or SIL levels defined by the risk assessment data 308. Product selection component 110 submits the filter criteria data 1502 to the safety device library 1012, and in response to receipt of this criteria data 1502 the safety device library 1012 returns a filtered list of candidate devices 1504 that satisfy the requirements encoded in filter criteria 1502. This filtered list of devices is presented in section 1404 of display 602 (as list 1408).

Product selection component 110 selects the filtered set of candidate devices 1504 based on encoded knowledge of prevailing industrial safety standards (which may be specific to a region in which the safety system will be operated), such that the list of candidate devices 1408 presented to the user are known to satisfy the required performance level for the safety function, as determined based on the safety function information previously entered by the user. In this way, the safety design system 102 substantially automates compliance with the industrial safety standards and reduces the burden on the designer to be conversant with the industrial safety standards when designing the safety system.

For embodiments in which safety device library 1012 is maintained on a cloud platform or another public or semi-public network, product vendors with suitable access privileges can access the library 1012 and submit up-to-date information about their available safety devices. This allows product vendors to add or modify product data on the safety device library 1012, including but not limited to catalog numbers, product specification data, product pricing information, etc. The system 102 can also allow the product vendors to define relative prioritizations for their available products, such that certain selected devices are assigned a higher display priority—e.g., ranked higher in the list 1408—over other devices offered by the vendor. In this way, the system 102 supports guided selling of safety devices, affording the vendor a degree of control over which of their products are most visible to customers.

Returning now to FIG. 14, with the input device field 1406a selected, the list of candidate input devices 1408 is displayed in section 1404. In the illustrated example, the list of candidate devices 1408 includes two models of non-contact interlock switches, which were selected from the library 1012 by the product selection component 110 as corresponding to the type of input device selected for the safety function using dialog window 1102 (see FIGS. 11a-11b) and having product specifications that satisfy the performance level and/or SIL requirements for the safety function, as defined by the risk assessment phase of the workflow. Each entry in the list 1408 can include product information for one of the devices, including but not limited to a catalog number for the device (e.g., 440N-1A2B), a type of the device (e.g., non-contact interlock switch), the device's rated supply voltage, a number of available contacts, or other such information. Selection of a device from this list 1408 causes the selected device to be designated as the input device for the safety function. The safety function component 108 records this association as part of the functional safety data 1006 for the safety system.

The user can select suitable products for the safety function's logic and output devices in a similar manner Selecting the logic device field 1406b or the output device field 1406c causes a suitable list of candidate devices 1408 corresponding to the selected device type—and satisfying the required performance levels for the safety function—to be rendered in section 1404 for user selection.

Figure 16:
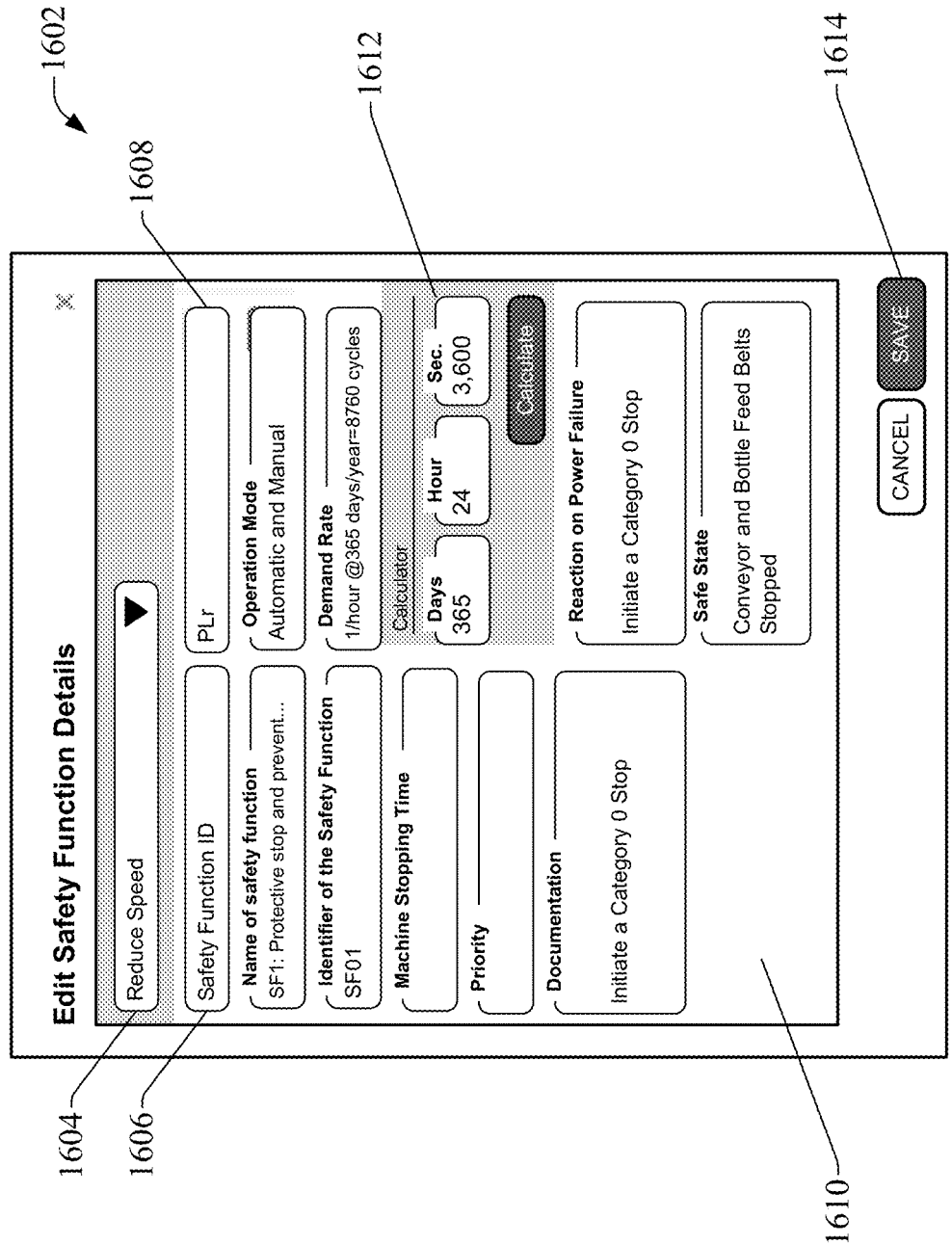
FIG. 16 is a view of an example safety function details dialog window.

A details link 1410 is included on each safety function icon 1402 that invokes a safety function details dialog window for the corresponding safety function. FIG. 16 is a view of an example safety function details dialog window 1602. Dialog window 1602 comprises a data field 1604 identifying the selected safety function, as well as fields 1606 and 1608 displaying the user-defined ID and required PLr for the safety function. In addition to these fields, dialog window 1602 includes a section 1610 comprising editable data fields that are pre-populated with safety function requirement specification (SFRS) information for the safety function. In the illustrated example, section 1610 includes data fields displaying a name of the safety function, operation modes in which the safety function operates (e.g., automatic, manual, semi-automatic, etc.), a demand rate (or cycle frequency) for the safety function, an estimated machine stopping time in response to triggering of the safety function, a priority for the safety function, a reaction of the safety function in the event of a power failure, and a safe state definition for the safety function. At least some of this SFRS information is obtained from the product specification data for the input, logic, and output devices selected for the safety function.

At least some of the SFRS data in section 1610 can be edited as desired to modify aspects of the safety function requirement specification data. During the subsequent document generation phase of the workflow, the safety design system 102 will include this SFRS data in the SFRS documentation generated for the completed safety system design. In the case of the demand rate, dialog window 1602 can also provide a calculator section 1612 that allows the user to enter values for the expected number of days per year, hours per day, and seconds per hour that the safety function is expected to be in operation. The safety function component 108 can then calculate the demand rate for the safety function based on these definitions.

Once the user has completed edits of the SFRS data, selecting the Save button 1614 on the dialog window 1602 causes the safety function component 108 to record the edited SFRS data as part of the functional safety data 1006 for the safety function.

Figure 17:
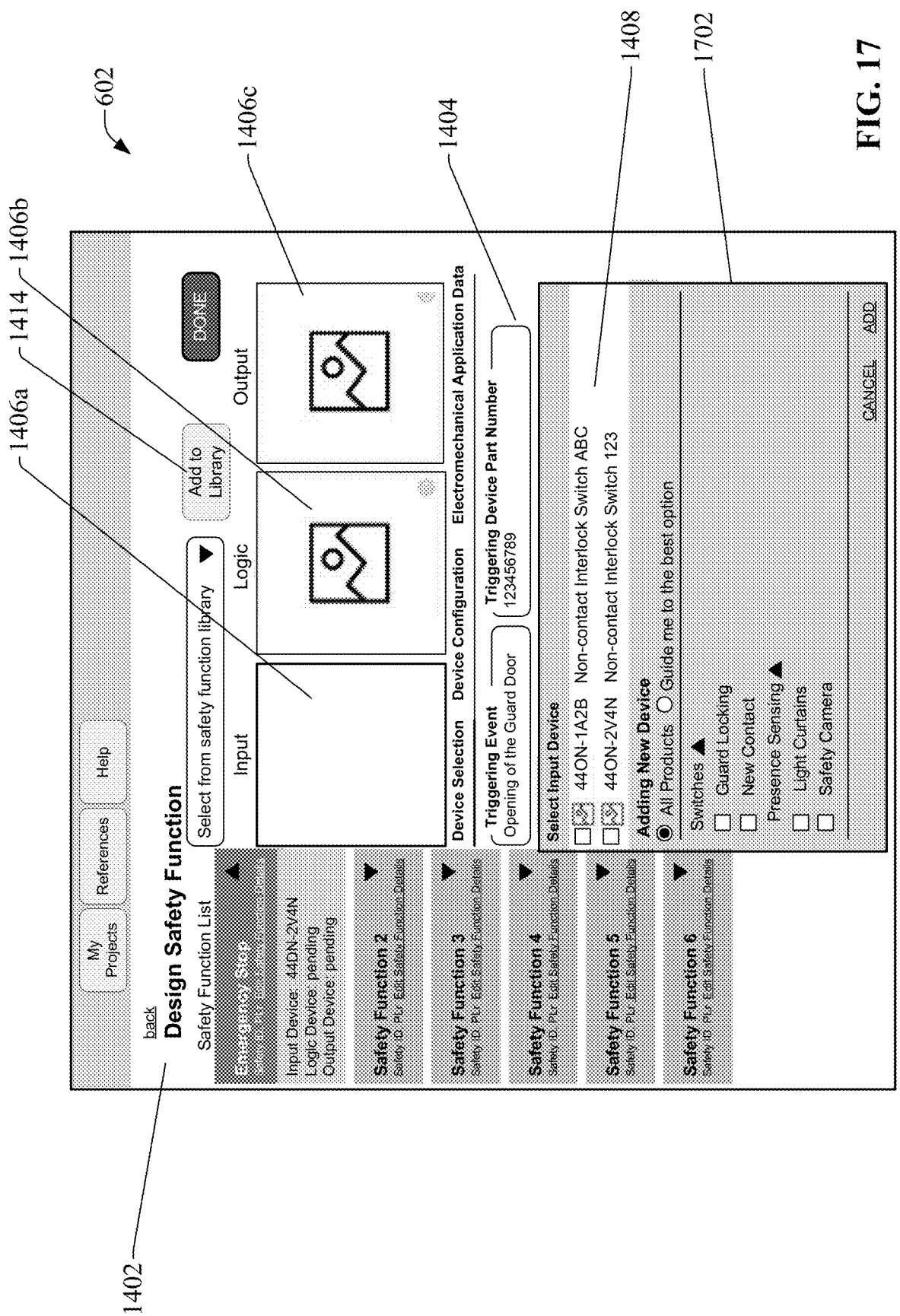
FIG. 17 is a view of an interface display for selecting products to be included in a safety function.

In the example depicted in FIG. 14, an Add Device control 1412 is included near the device selection area, which allows the user to browse available safety devices that are not included in the filtered list 1408 presented by the product selection component 110. FIG. 17 is a view of interface display 602 after the Add Device control 1412 has been selected. Selection of control 1412 causes a device browsing section 1702 to be displayed. This section allows the user to browse available devices according to category (e.g., Switches, Presence Sensing, etc.), and to add selected devices to the safety function currently being configured.

In some embodiments, the safety design system 102 can provide a product selection wizard that assists the user in determining whether the products selected for the input, logic, and output devices will satisfy safety solution requirements. FIG. 18 is an example dialog window 1802 that can serve as an interface for the product selection wizard. Dialog window 1802 can be invoked from interface display 602 by selecting a suitable product selection wizard control (not shown in FIG. 17). When the product selection wizard is invoked, user interface component 104 pre-populates selected data fields in the wizard's dialog window 1802 with data obtained from the specification information for the specific products selected by the user for inclusion in the safety function. This information is then used, together with user-defined installation-specific parameters, to calculate installation parameters and corresponding response times for the safety function.

In the example illustrated in FIG. 18, the present safety function comprises a light curtain (the selected input device) which controls the state of one or more safety relays, which disconnect power to a machine when tripped. Dialog window 1802 can be used to determine the minimum safety distance for mounting the light curtain relative to its corresponding hazard, and to calculate the total response time for the safety function. To this end, section 1808 of dialog window 1802 includes data fields for the light curtain's resolution d (the distance between the light curtain's beams, in millimeters) and the distance R between the light curtain's transmitter and receiver (also in millimeters). The light curtain's resolution is typically a fixed characteristic of the selected light curtain, and so the system 102 obtains this value from the specification data for the light curtain product previously selected by the user for the safety function. The distance R between the light curtain's transmitter and receiver can be set during installation of the light curtain.

Accordingly, the user can enter a value of the expected distance R in the corresponding field. The safety category—Category 2 or Category 4—can also be prepopulated by the system 102 based on the selected light curtain's specification data.

Another section 1804 displays a calculated total response time for initiation of a safety measure based on a sum of the response time of the light curtain, the response time of the safety relay, and the stop time of the machine after power has been disconnected. The system 102 can prepopulate data fields for the response times of the light curtain and safety relays in section 1804 based on information obtained from the respective sets of specification data for the light curtain and safety relay selected by the user. The user can edit the stop time of the machine based on known engineering data for the machine. Another section 1806 specifies whether the safety function is to be used in an industrial application, a stroke application, or a two-hand application. These selections can also be set by the user to reflect the intended application in which the safety function will be used.

Based on this pre-populated and/or user-provided information, the safety function component 108 can calculate a total response time for the safety function, as well as a recommended minimum mounting distance for the light curtain to ensure that the machine will stop in time to prevent injury if the light curtain is broken, and display these results on dialog window 1802. In the illustrated example, the safety function component 108 also calculates and displays a minimum distance that a reflective surface (e.g., a plexiglass panel) located between the light curtain and the hazard should be from the plane of the light curtain's beams. In general, the types of information calculated and displayed on the product selection wizard dialog window 1802 can depend on the type of safety function being viewed (e.g., the type of input device used to detect the hazardous condition). Depending on the type of input device that has been selected for the safety function, dialog window 1802 can render a suitable guide graphic 1810 that helps the user to interpret the calculated installation parameters.

The calculated response times presented on the dialog window 1802 allow the user to validate that the expected response time of the safety function will satisfy requirements of the safety solution, and that the recommended mounting requirements (e g, minimum mounting distances for the input devices) are feasible given installation constraints. Using this product selection wizard, the user can dynamically assess different candidate devices for the safety function to compare expected performances across different device combinations, aiding the user in selecting a suitable combination of products for the safety function that will meet the specific needs of the safety solution.

Once the user has selected specific devices to be used as input, logic, and output devices for the safety function, the user may choose to store the safety function configuration in a safety function library by selecting an appropriate control 1414 on interface display 602 (Add to Library). This causes the safety function configuration to be stored in memory for future retrieval and re-use in other safety system applications (or in the same safety system application if multiple instances of the same safety function are appropriate). Once stored, the safety function configuration can be retrieved and included in other safety design projects. By allowing safety function configurations to be stored and imported into other safety design projects in this manner, the safety design system 102 promotes standardization and consistency across safety system designs within a given industrial enterprise.

Once the user has assigned specific input, logic, and output devices to each safety function as described above, design of the safety system is assumed to be complete (pending a final external validation of the safety system design, as will be described below). The safety function component 108 records the resulting safety system design specifications as functional safety data 1006 (see FIG. 10), which documents the task-hazard pairs, associated safety functions (including the input, logic, and output devices that make up each safety function), spans of control for each safety functions (as defined by the safety zones), SFRS data for the safety functions, or other such information.

Figure 19:
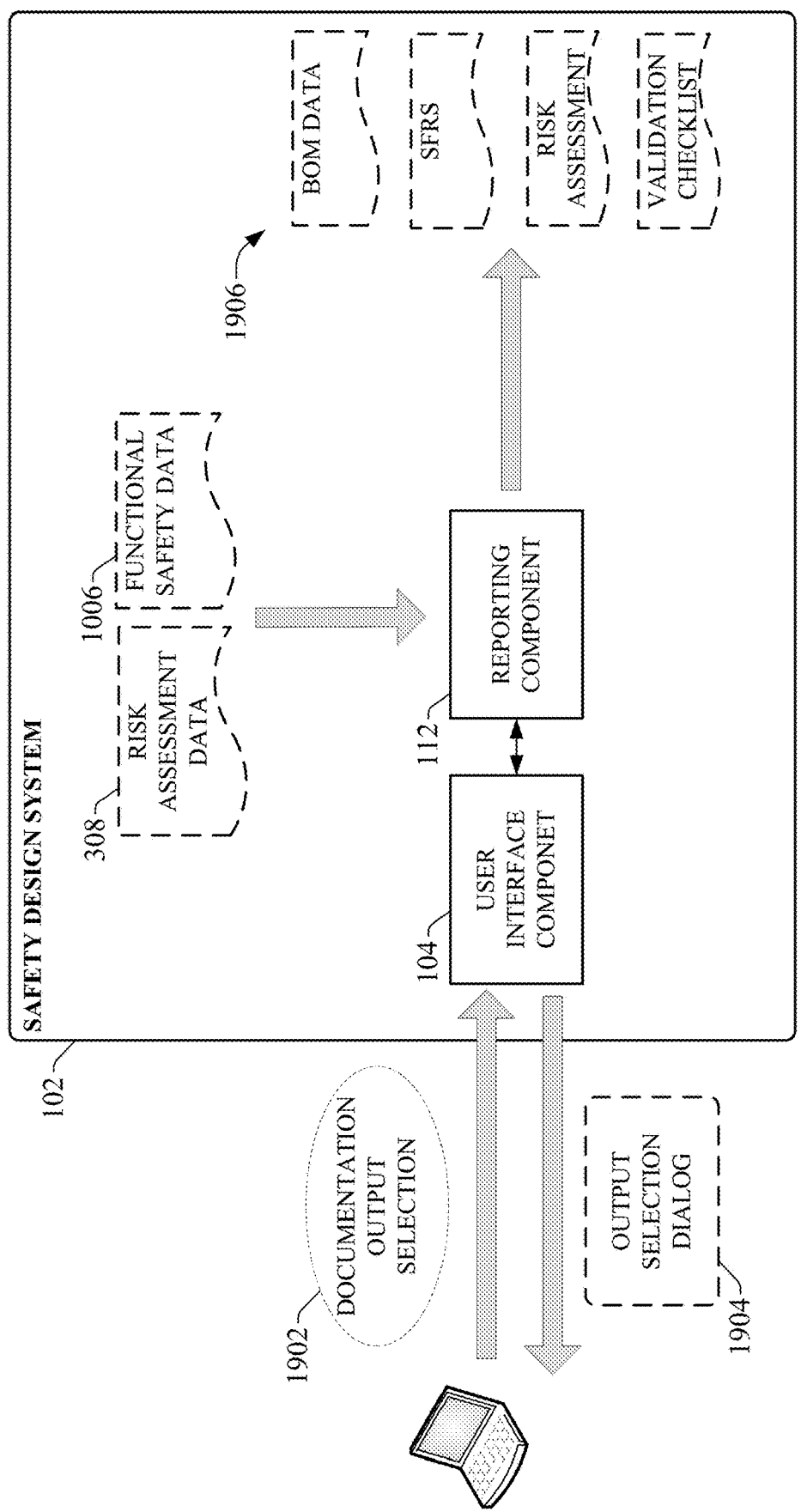
FIG. 19 is a diagram illustrating generation of documentation for a completed safety system design.

Returning to FIG. 13, when all necessary safety design input has been entered by the user and functional safety data 1006 for a complete safety system has been generated by the design system 102, interface display 602 renders a first control 1304 for generating documentation for the completed safety system design and a second control 1306 for exporting the safety function data to an external system. FIG. 19 is a diagram illustrating generation of documentation for the completed safety system design according to one or more embodiments. When the documentation control 1304 is selected, user interface component 104 displays an output selection dialog window 1904 that allows the user to select types of safety system documentation to be generated by the reporting component 112. Based on the user's document output selections 1902, reporting component 112 generates one or more sets of documentation 1906 for the completed safety system design based on the risk assessment data 308 and functional safety data 1006 generated during previous steps in the design workflow.

Figure 20:
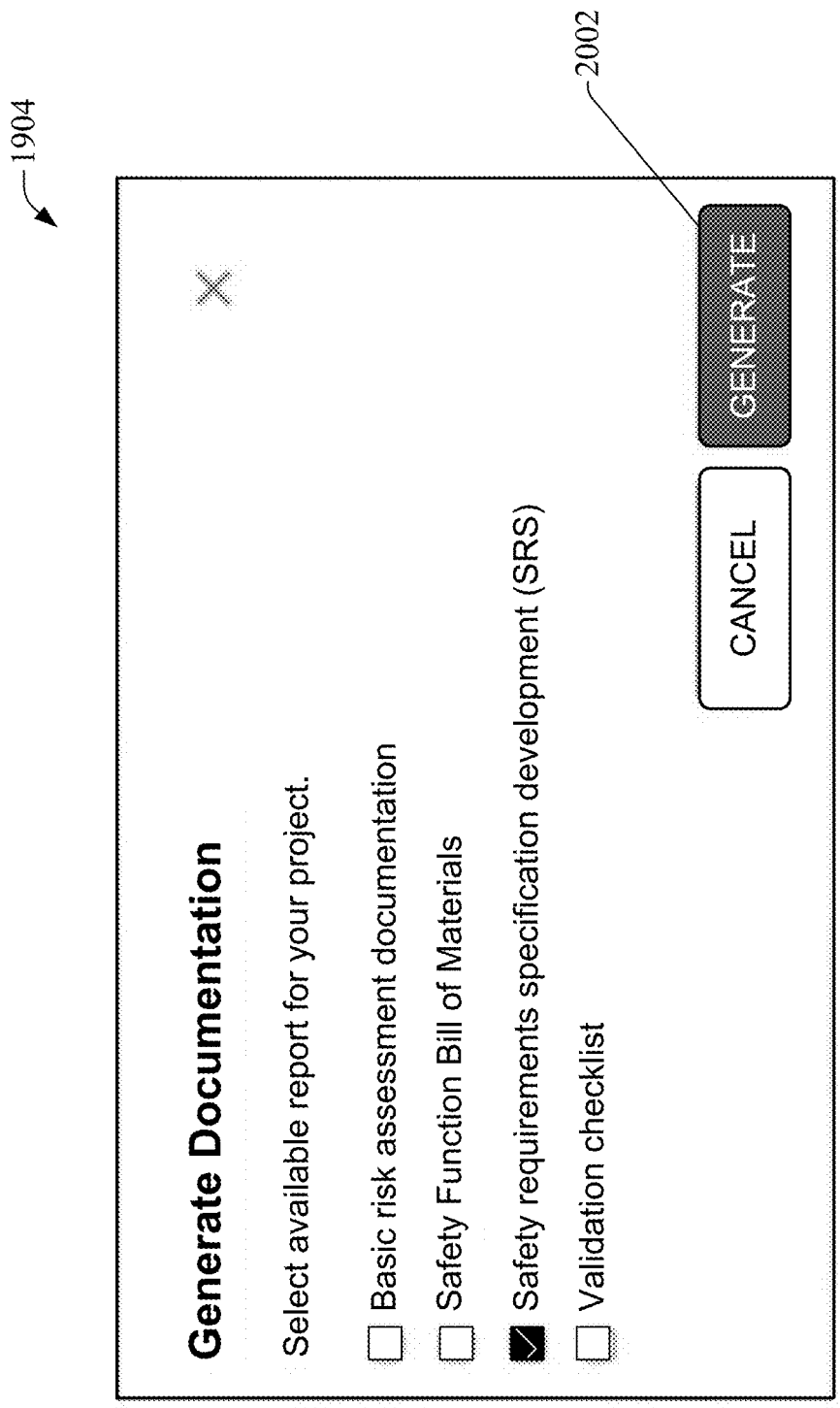
FIG. 20 is an example output selection dialog window.

FIG. 20 is an example output selection dialog window 1904 that can be generated by the user interface component 104. Dialog window 1904 lists the types of reports or documents that can be generated by the reporting component 112. In the illustrated example, safety design system 102 can generate basic risk assessment documentation for the safety system, a bill of materials for the safety system, safety requirements specification (SRS) development documentation for the safety system, and a validation checklist for the safety system. The user can select which of these types of documentation are to be generated, then initiate generation of the selected document types by selecting a Generate button 2002.

Basic risk assessment documentation and safety requirements specification (SRS) development documentation can document information recorded in the risk assessment data 308 that was generated during the risk assessment phase of the workflow, including but not limited to descriptions of the tasks associated with the machine or production line; types, causes, and consequences of hazards associated with those tasks, initial and final risk scores (HRN or ANSI RIA) for the hazards, protective measures (including safety functions) that were added to mitigate the hazards and achieve the final HRN score, required safety function performance levels, spans of control for each safety function (e.g., zone definitions), or other such risk assessment information. Reporting component 112 can generate this risk assessment information in any suitable format according to various embodiments (e.g., as a risk assessment table, as a written report, etc.). The basic risk assessment documentation may report this risk assessment data at a relatively high level, while the SRS documentation may provide a more detailed report of the safety requirements necessary for mitigating each identified hazard (including, for example, the safety function details documented in dialog window 1602 illustrated in FIG. 16).

A bill of materials generated by the reporting component 112 can itemize the input, logic, and output devices that were selected for the respective safety functions. The bill of materials can document, for each device, such information as a catalog number for the device, a quantity of the device used in the safety system, a description of the device, pricing information for the device, an availability of the device, or other such information. This information can be obtained from the product specification data for the respective devices maintained by the safety design system 102. The bill of materials can be used as a guide for purchasing the specified safety devices. FIG. 21 depicts an example bill of materials 2102 that can be generated by the reporting component 112.

A validation checklist generated by reporting component 112 can document a list of on-site tests to be performed on the installed safety system to verify proper functioning of the safety system prior to operation. These tests can include, for example, I/O checks, tests to be performed on installed safety functions, visual verifications that specified items of equipment have been installed correctly (e.g., confirmation that safety input devices have been installed in compliance with minimum distance requirements, as identified using dialog window 1802), or other such validation steps.

Some embodiments of safety design system 102 are capable of exporting configured selected sets of the functional safety data 1006 or risk assessment data 308 to external systems for processing by those systems. For example, some embodiments of the safety design system 102 can include a verification system interface component 114 configured to export some or all of the functional safety data 1006 to a separate performance level verification system to confirm compliance with the required performance levels (as dictated by prescribed industrial safety standards).

Figure 22:
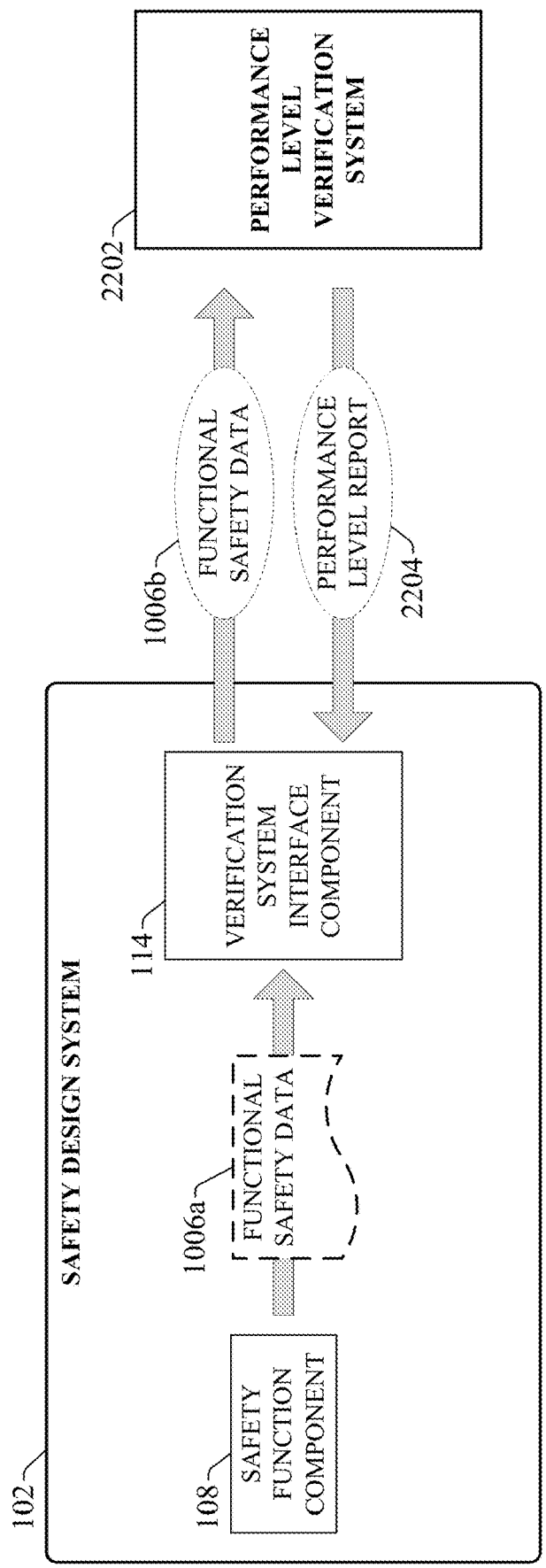
FIG. 22 is a diagram illustrating data exchange between a safety design system and an external performance level verification system.

FIG. 22 is a diagram illustrating data exchange between the safety design system 102 and an external performance level verification system 2202. Selecting to export the functional safety data 1006 to the performance level verification system 2202 (e.g., by selecting the performance level verification system as an export destination using drop-down control 1306; see FIG. 13) can cause the verification system interface component 114 to transform the functional safety data 1006a to a format required by the performance level verification system 2202, and to export the resulting formatted functional safety data 1106b to the performance level verification system 2202 for analysis. The performance level verification system 2202 itself may be a software tool designed to verify a safety function's compliance with a required performance level. Some such verification tools require the safety function data to be entered manually by a user. However, the safety design system's verification system interface component 114 can automatically populate required fields in the performance level verification system 2202 with items of the functional safety data 1006, mitigating the need to enter this data into the verification system 2202 manually. In response, the performance level verification system 2202 can perform the necessary verification analysis on each defined safety function based on the exported data 1006b. In one or more embodiments, the performance level verification interface 214 can be configured to receive report data 2204 from the performance level verification system 2202, and the user interface component 104 can render the results of the analysis as a safety document.

FIG. 23 is an example safety function table 2302 that can be generated by the reporting component 112 or the verification system interface component 114 in some embodiments. Safety function table 2302 lists the safety functions defined for the project and includes columns for the safety function symbol and name; the types of input, output, and logic devices selected for each safety function; the required performance level (PLr) specified for each safety function; and the expected operational frequency of the safety function (e.g., number of operations per year). The data tabulated in safety function table 2302 can correspond to the data required by a separate performance level verification system 2202 to determine whether each safety function will achieve the required performance level dictated by industrial safety standards. Verification system interface component 114 be configured to map the columns of safety function table 2302 to corresponding data fields of the performance level verification system 2202. When the export feature is initiated, the data in the columns of safety function table 2302 can be exported to the corresponding fields of the performance level verification system 2202 to which they are mapped.

Safety design system 102 can also be configured to export selected sets of risk assessment data 308 or functional safety data 1006 to other types of external systems in some embodiments. These other external systems can include documentation generation systems, such as systems designed to generate requests for quotes (RFQs), proposal documents, bills of materials, work orders, purchase orders, wiring diagrams, mechanical drawings, or other such documents.

Some embodiments of safety design system 102 can also interface with other design platforms used to design or configure other system architectures. In such embodiments, the safety design system 102 can share relevant sets of functional safety data 1006 with external design systems that require information about the safety system for the design and configuration of their own systems. These external design systems can include, for example, industrial control development platforms, which may leverage portions of the functional safety data 1006 to automatically generate portions of their control system designs or to generate portions of control code (including safety relay programming) based on the safety system design.

Embodiments of the safety design system 102 described herein integrate a comprehensive set of safety design functions, including risk assessment and safety function development. The system 102 implements an intuitive safety system design workflow that guides a user seamlessly from risk assessment, through safety function design, to the selection of specific safety products. The system's user interfaces include interactive table and layout views. Users can perform layout analysis and define spans of control for respective safety functions through interaction with these two views. The system 102 includes a comprehensive suite of documentation builders that can be used to create reference, engineering, or purchasing documents for the completed safety system design.

FIGS. 24a-24d illustrate a methodology in accordance with one or more embodiments of the subject application. While, for purposes of simplicity of explanation, the methodology shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

Figure 24A:
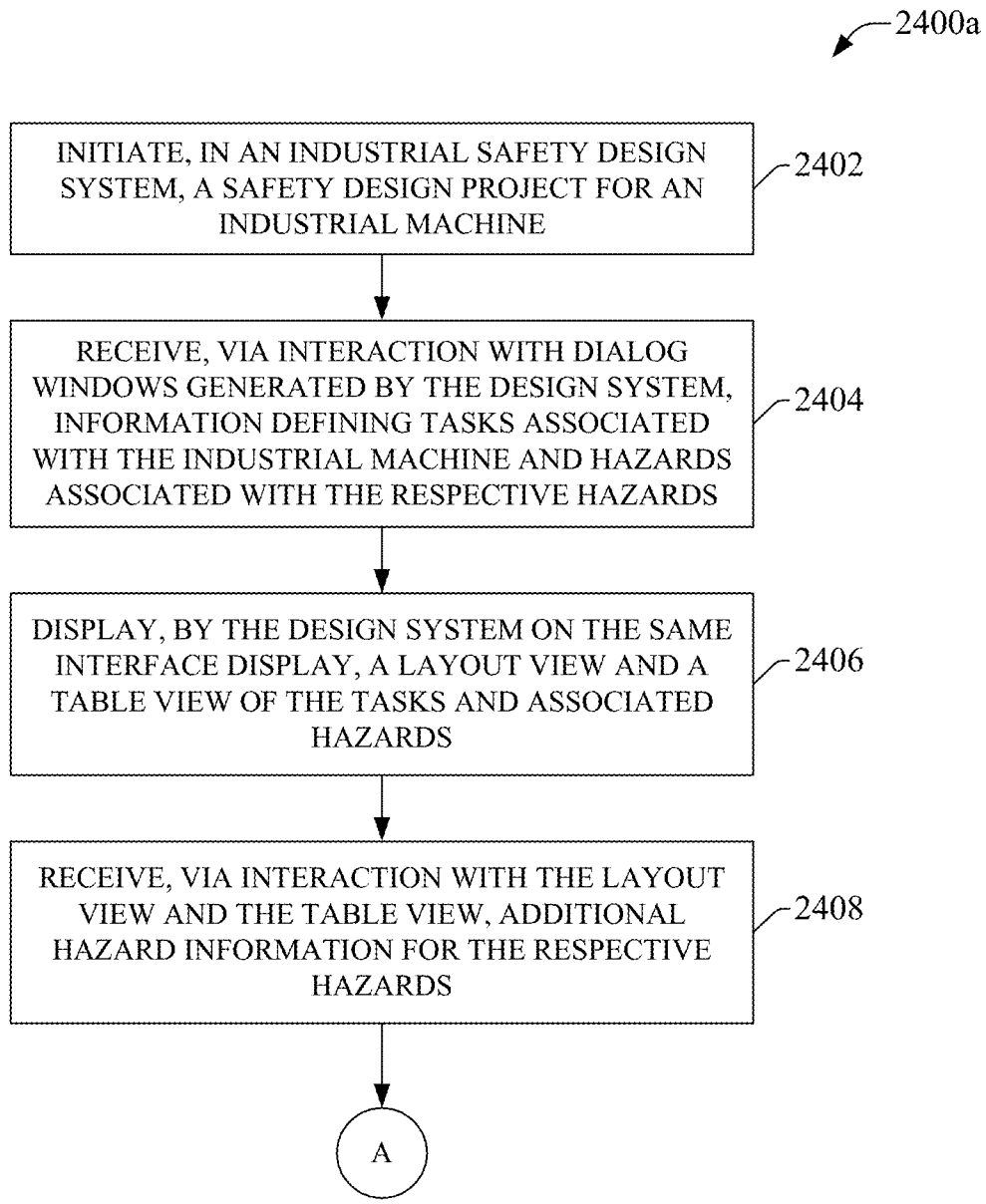
FIG. 24a is a flowchart of a first part of an example methodology for guiding development of an industrial safety system for a machine or production line.

FIG. 24a illustrates a first part of an example methodology 2400a for guiding development of an industrial safety system for a machine or production line. The overall methodology includes a risk assessment phase and a safety function development phase. Initially, at 2402, a safety design project for an industrial machine is initiated in an industrial safety design system. The risk assessment phase then begins at step 2404, where information defining tasks associated with the industrial machine is received via interaction with dialog windows generated by the system. Information defining hazards associated with the respective tasks is also received via these interactions. In some embodiments, the design system can present a categorized list of common tasks for selective association with the machine, as well as lists of common task-specific hazards for selective association with the tasks. The design system can allow the user to add their own tasks and hazards to the list. The design system can also allow the user to specify user roles that are expected to be exposed to the task-hazard pairs (e.g., operators, maintenance personnel, passers-by, etc.).

At 2406, a layout view and a table view of the tasks and associated hazards defined in step 2404 is displayed by the design system. These views are rendered simultaneously on the same interface display, and act as interactive interfaces for further defining the tasks and hazards. The layout view can render an imported image or drawing of the industrial machine for which a safety system is being designed, as well as a list of the previously defined task-hazard pairs in a hierarchical format. The table view can present information about the task-hazard pairs in a table format in which each row of the table corresponds to a hazard, and each column represents an item of information about the hazard (e.g., the name of the task, a unique hazard ID, a type of the hazard, etc.).

At 2408, additional hazard information for the hazards is received via interaction with the layout view and the table view. This additional information can include, for example, a cause of the hazard, a possible consequence of the hazard, a user-defined description of the hazard, a location of the hazard on the machine, an image of the source of the hazard, a number of people expected to be exposed to the hazard, a frequency of the exposure, a likelihood of the hazard's occurrence, a possible degree of harm caused by the hazard, or other such information. Interaction with one of the two views can inform presentation of data on the other view. For example, selection of a hazard from either the table view or the layout view causes the selected hazard to be highlighted in both views. If the user has specified a location of a hazard on the image or drawing of the machine, an icon of the selected hazard is also highlighted.

Figure 24B:
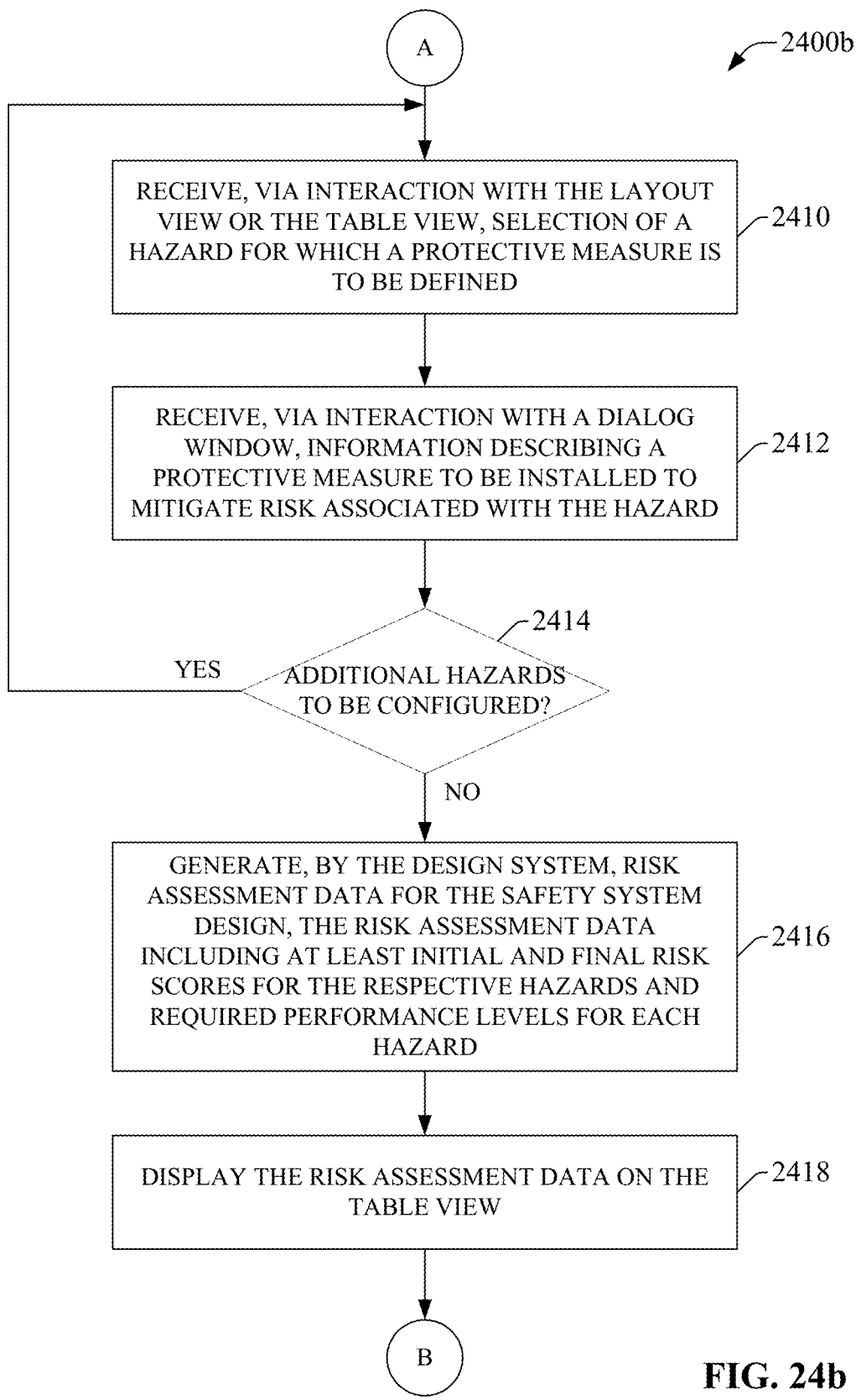
FIG. 24b is a flowchart of a second part of the example methodology for guiding development of an industrial safety system for a machine or production line.

The methodology then proceeds to the second part 2400b illustrated in FIG. 24b. At 2410, selection of a hazard for which a protective measure is to be defined is received via interaction with either the layout view or the table view. At 2412, information describing a protective measure for mitigating the risk associated with the hazard is received via interaction with a dialog window. In some embodiments, the dialog window can display a categorized list of possible countermeasures for selective association with the selected hazard. Example categories of protective measures can include, for example, measures that render the hazard inherently safe by design (e.g., eliminate pinch points), measures implemented via engineering control (e.g., presence sensing, speed reduction, etc.), or measures that reduce the risk via administrative control (e.g., posting of warning signs, installation of warning lights, etc.). Some of these selected protective measures may be safety functions requiring further development in subsequent steps of the workflow.

At 2414, a determination is made as to whether additional hazards still require protective measures to be configured. If so (YES at step 2414), the methodology returns to step 2410, and steps 2410 and 2412 are repeated for each hazard that was identified at step 2404. When protective measures have been specified for each hazard (NO at step 2414), the methodology proceeds to step 2416, where risk assessment data is generated for the machine and its associated safety system design based on the information received in the previous steps. This risk assessment data can include, for example, initial (without protective measures) and final (with protective measures) risk scores for each hazard, required performance levels for safety functions that are to mitigate each hazard (which may be computed by the design system based on knowledge of prevailing industrial safety standards), or other such risk assessment information. At 2418, the risk assessment data is displayed on the table view. In some embodiments, the design system can also export the risk assessment data in the form of a risk assessment report that can be used for auditing or record-keeping purposes.

Figure 24C:
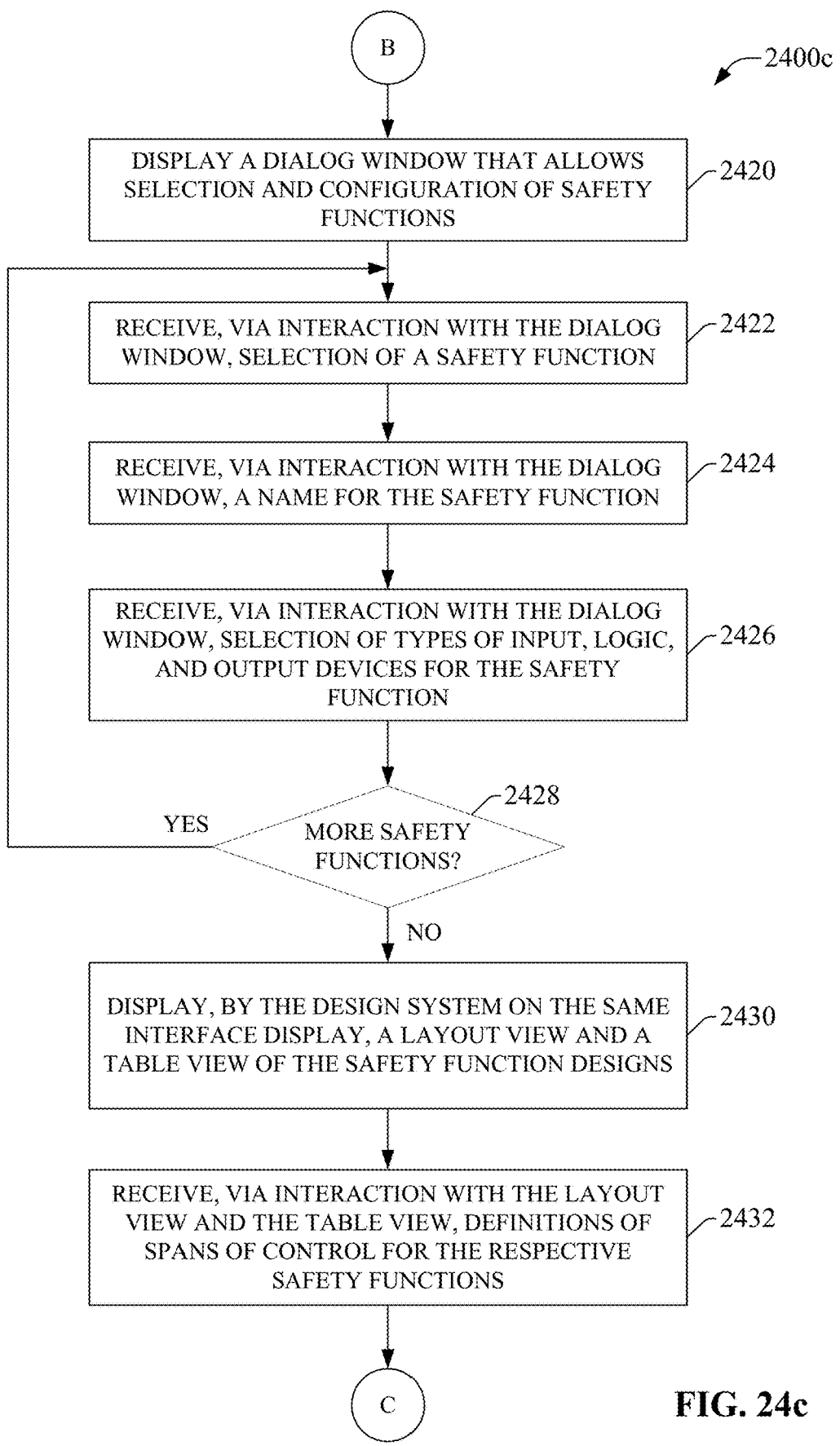
FIG. 24c is a flowchart of a third part of the example methodology for guiding development of an industrial safety system for a machine or production line.
Figure 24D:
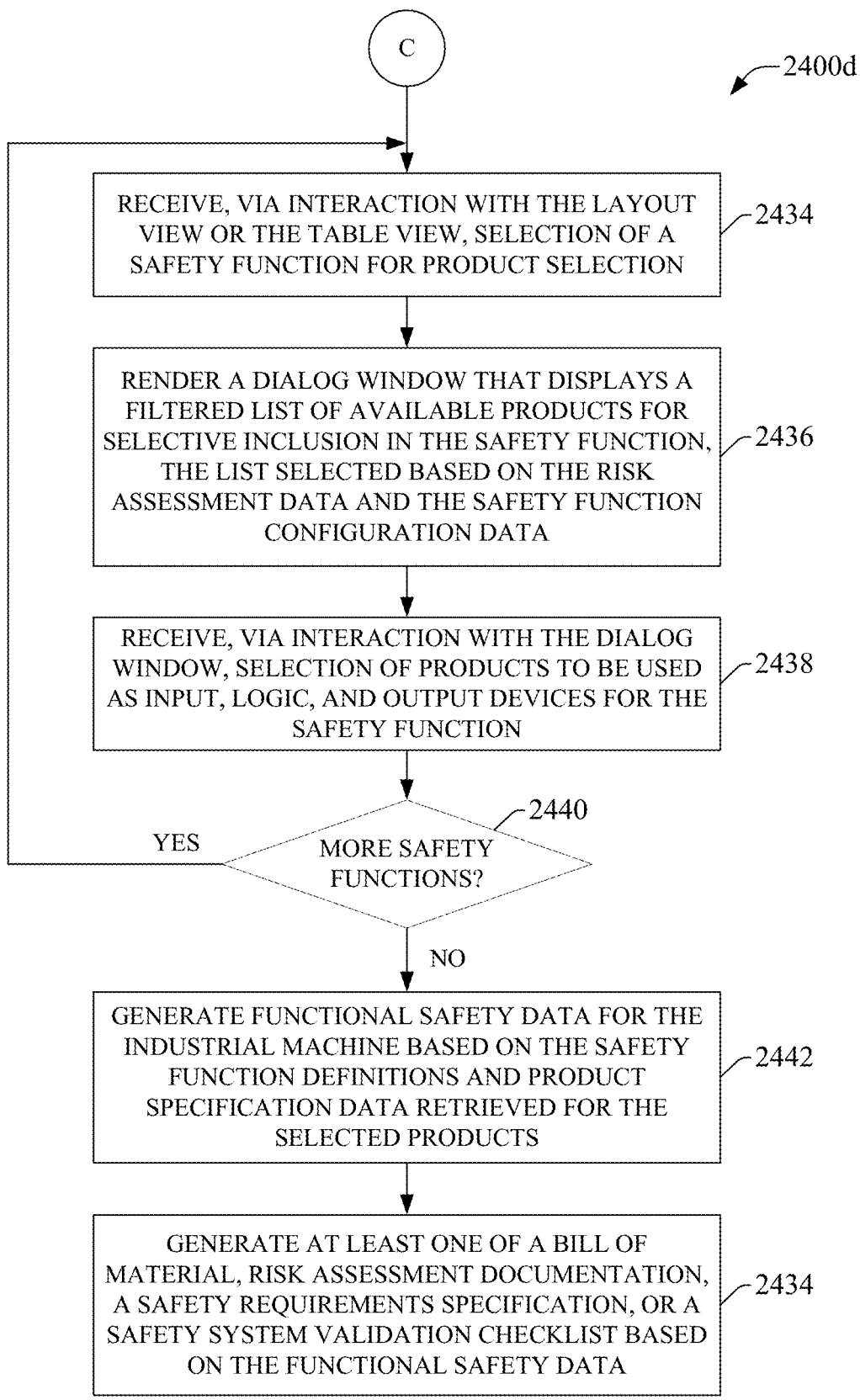
FIG. 24d is a flowchart of a fourth part of the example methodology for guiding development of an industrial safety system for a machine or production line.

The methodology then proceeds to the third part 2400c illustrated in FIG. 24c. This portion of the methodology corresponds to the safety function development phase of the design workflow. In some scenarios, this portion of the methodology can continue from the previous risk assessment phase. In other scenarios in which the user has already performed a separate risk assessment using other tools, the methodology may begin with the third part 2400c using the risk assessment data gathered using these external tools.

At 2420, a dialog window is displayed that allows selection and configuration of any protective measures defined at step 2412 that are safety functions requiring further development. At 2422, selection of a safety function is received via interaction with the dialog window. At 2424, a name of the selected safety function is received via interaction with the dialog window. At 2426, selection of types of input, logic, and output devices for the selected safety function are received via interaction with the dialog window.

At 2428, a determination is made as to whether there are additional defined safety functions that require configuration. If so (YES at step 2428), the methodology returns to step 2422, and steps 2422-2426 are repeated for each defined safety function. When all safety functions have been configured (NO at step 2428), the methodology proceeds to step 2430, where a layout view and a table view of the resulting safety function information are displayed on a same interface display by the design system. The layout view can render an overview image of the industrial machine or production line, as well as selectable icons representing the defined safety functions. The table view can list the safety functions in a tabular format, with each row of the table corresponding to a safety function and each column of the table representing an item of information about the safety function (e.g., a unique identifier of the safety function, a performance level of the safety function, the input and output devices for the safety function, or other such information). As with the layout and table views for the hazards described above, interactions with one of these two views are reflected in both views.

At 2432, definitions of spans of control for the respective safety functions are received via interaction with the layout view and the table view. In some embodiments, the span of control for a selected safety function can be set by selecting or unselecting output devices for the safety function in the table view, which defines which safety output devices will have their safe states controlled by the safety function. These output device selections are reflected in the overview image of the machine in the layout view; e.g., by highlighting the portions of the machine corresponding to the hazards mitigated by the selected output devices. As an alternative approach for defining the span of control for a safety function, the user may draw a control zone on the image of the machine, and the span of control for the safety function will be set to encompass the output devices for the hazards encompassed by the zone. In this case, the output devices corresponding to these hazards will be automatically selected in the table view based on the zone definition in the layout view.

The methodology then proceeds to the fourth part 2400d illustrated in FIG. 24. At 2434, selection of a safety function for which specific input, logic, and output device products are to be selected is received via interaction with the layout view or the table view. At 2436, a dialog window is rendered that displays a filtered list of available products for selective inclusion in the safety function. For each of the safety function's input, logic, and output devices, the design system can select the list of candidate devices from a product library based on such criteria as the performance level requirements specified by the risk assessment data; the type of safety function; the type of input, logic, or output device that was selected for the safety function at step 2426; a determination of which available devices will satisfy the industrial safety standards prescribed for the region in which the machine will operate, or other such filtering criteria.

At 2440 a determination is made as to whether more safety functions require product selection. If so (YES at step 2440), the methodology returns to step 2434, and steps 2434-2438 are repeated for each defined safety function. When products have been selected for all defined safety functions (NO at step 2440), the methodology proceeds to step 2442, where functional safety data for the industrial machine is generated based on the safety function definitions specified in previous steps of the workflow. The safety function data is generated in part based on product specification data retrieved by the design system for the product selected at step 2438. At 2434, at least one of a bill of material, risk assessment documentation, a safety requirements specification, or a safety system validation checklist is generated by the design system based on the functional safety data generated at step 2442.

Embodiments, systems, and components described herein, as well as control systems and automation environments in which various aspects set forth in the subject specification can be carried out, can include computer or network components such as servers, clients, programmable logic controllers (PLCs), automation controllers, communications modules, mobile computers, on-board computers for mobile vehicles, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including DeviceNet, ControlNet, safety networks, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 25:
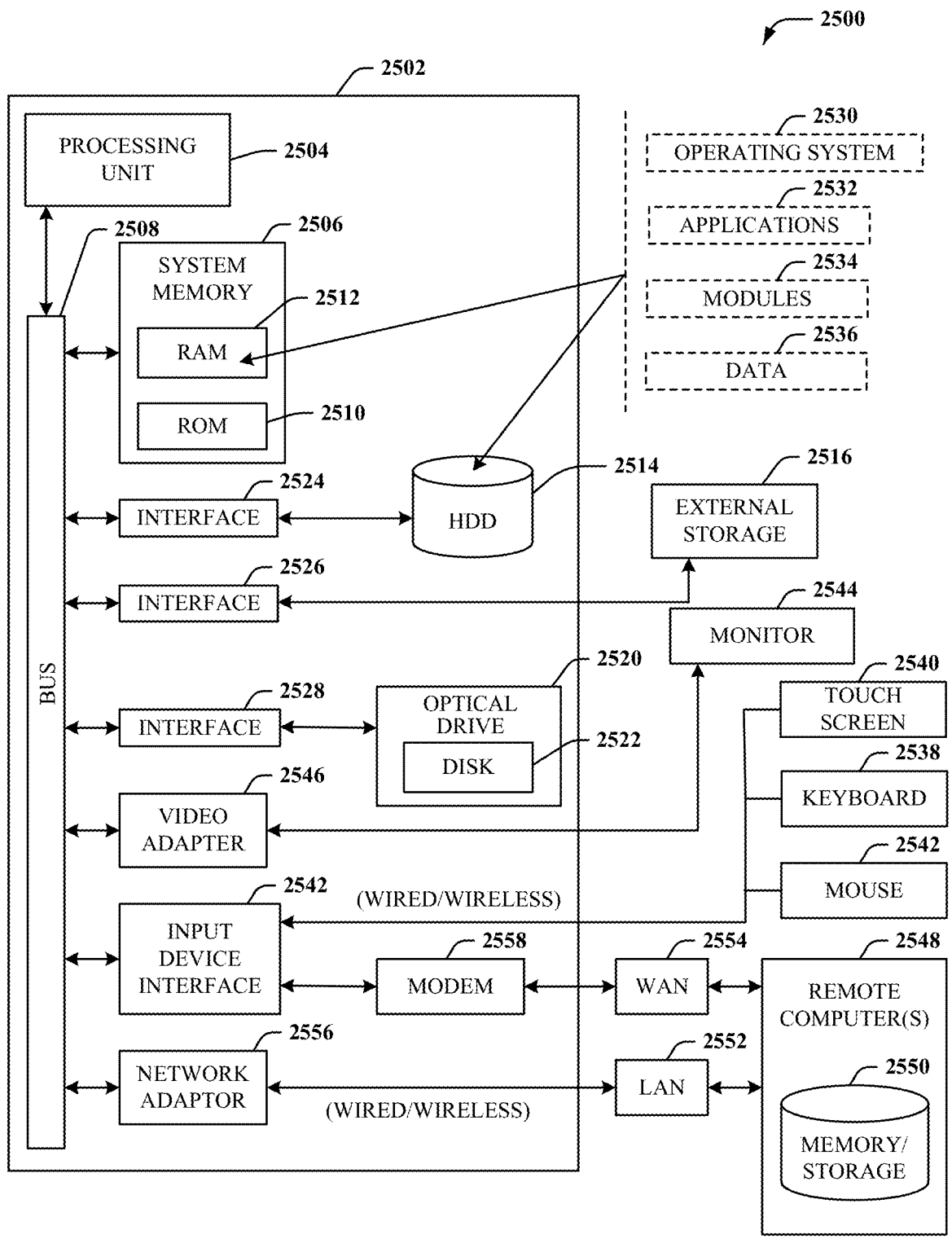
FIG. 25 is an example computing environment.
Figure 26:
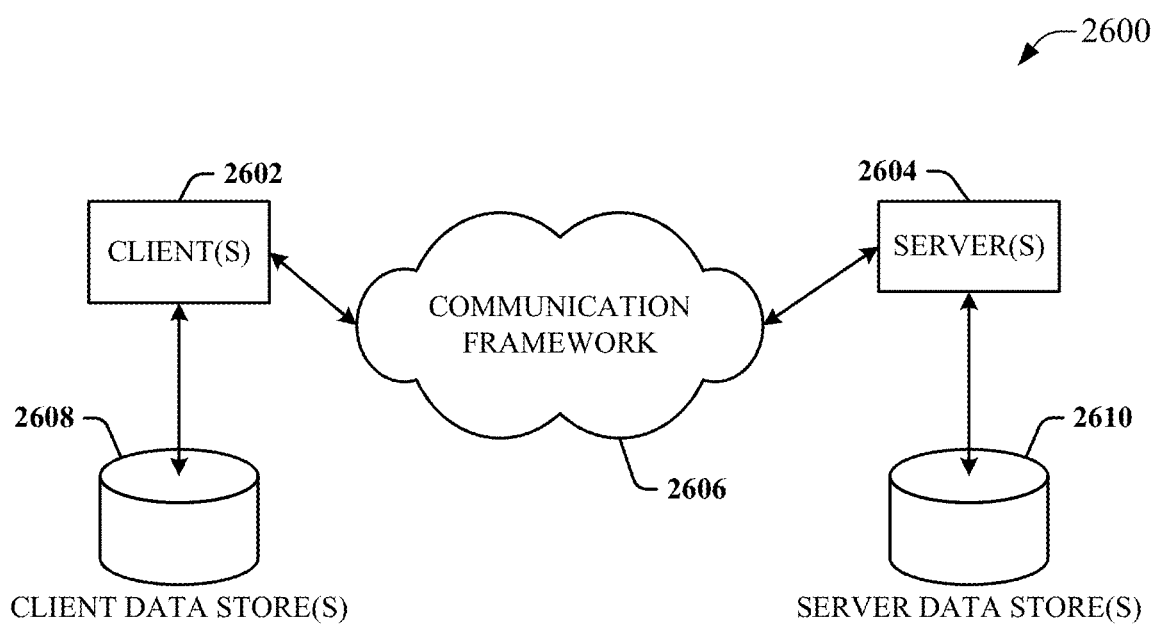
FIG. 26 is an example networking environment.

In order to provide a context for the various aspects of the disclosed subject matter, FIGS. 25 and 26 as well as the following discussion are intended to provide a brief, general description of a suitable environment in which the various aspects of the disclosed subject matter may be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 25 the example environment 2500 for implementing various embodiments of the aspects described herein includes a computer 2502, the computer 2502 including a processing unit 2504, a system memory 2006 and a system bus 2508. The system bus 2508 couples system components including, but not limited to, the system memory 2506 to the processing unit 2504. The processing unit 2504 can be any of various commercially available processors. Dual microprocessors and other multi-processor architectures can also be employed as the processing unit 2504.

The system bus 2508 can be any of several types of bus structure that can further interconnect to a memory bus (with or without a memory controller), a peripheral bus, and a local bus using any of a variety of commercially available bus architectures. The system memory 2506 includes ROM 2510 and RAM 2512. A basic input/output system (BIOS) can be stored in a non-volatile memory such as ROM, erasable programmable read only memory (EPROM), EEPROM, which BIOS contains the basic routines that help to transfer information between elements within the computer 2502, such as during startup. The RAM 2512 can also include a high-speed RAM such as static RAM for caching data.

The computer 2502 further includes an internal hard disk drive (HDD) 2514 (e.g., EIDE, SATA), one or more external storage devices 2516 (e.g., a magnetic floppy disk drive (FDD) 2516, a memory stick or flash drive reader, a memory card reader, etc.) and an optical disk drive 2520 (e.g., which can read or write from a CD-ROM disc, a DVD, a BD, etc.). While the internal HDD 2514 is illustrated as located within the computer 2502, the internal HDD 2514 can also be configured for external use in a suitable chassis (not shown). Additionally, while not shown in environment 2500, a solid state drive (SSD) could be used in addition to, or in place of, an HDD 2514. The HDD 2514, external storage device(s) 2516 and optical disk drive 2520 can be connected to the system bus 2508 by an HDD interface 2524, an external storage interface 2526 and an optical drive interface 2528, respectively. The interface 2524 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 2502, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 2512, including an operating system 2530, one or more application programs 2532, other program modules 2534 and program data 2536. All or portions of the operating system, applications, modules, and/or data can also be cached in the RAM 2512. The systems and methods described herein can be implemented utilizing various commercially available operating systems or combinations of operating systems.

Computer 2502 can optionally comprise emulation technologies. For example, a hypervisor (not shown) or other intermediary can emulate a hardware environment for operating system 2530, and the emulated hardware can optionally be different from the hardware illustrated in FIG. 25. In such an embodiment, operating system 2530 can comprise one virtual machine (VM) of multiple VMs hosted at computer 2502. Furthermore, operating system 2530 can provide runtime environments, such as the Java runtime environment or the .NET framework, for application programs 2532. Runtime environments are consistent execution environments that allow application programs 2532 to run on any operating system that includes the runtime environment. Similarly, operating system 2530 can support containers, and application programs 2532 can be in the form of containers, which are lightweight, standalone, executable packages of software that include, e.g., code, runtime, system tools, system libraries and settings for an application.

Further, computer 2502 can be enable with a security module, such as a trusted processing module (TPM). For instance with a TPM, boot components hash next in time boot components and wait for a match of results to secured values, before loading a next boot component. This process can take place at any layer in the code execution stack of computer 2502, e.g., applied at the application execution level or at the operating system (OS) kernel level, thereby enabling security at any level of code execution.

A user can enter commands and information into the computer 2502 through one or more wired/wireless input devices, e.g., a keyboard 2538, a touch screen 2540, and a pointing device, such as a mouse 2524. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 2504 through an input device interface 2544 that can be coupled to the system bus 2508, but can be connected by other interfaces, such as a parallel port, an IEEE 1394 serial port, a game port, a USB port, an IR interface, a BLUETOOTH® interface, etc.

A monitor 2544 or other type of display device can be also connected to the system bus 2508 via an interface, such as a video adapter 2546. In addition to the monitor 2544, a computer typically includes other peripheral output devices (not shown), such as speakers, printers, etc.

The computer 2502 can operate in a networked environment using logical connections via wired and/or wireless communications to one or more remote computers, such as a remote computer(s) 2548. The remote computer(s) 2548 can be a workstation, a server computer, a router, a personal computer, portable computer, microprocessor-based entertainment appliance, a peer device or other common network node, and typically includes many or all of the elements described relative to the computer 2502, although, for purposes of brevity, only a memory/storage device 2550 is illustrated. The logical connections depicted include wired/wireless connectivity to a local area network (LAN) 2552 and/or larger networks, e.g., a wide area network (WAN) 2554. Such LAN and WAN networking environments are commonplace in offices and companies, and facilitate enterprise-wide computer networks, such as intranets, all of which can connect to a global communications network, e.g., the Internet.

When used in a LAN networking environment, the computer 2502 can be connected to the local network 2552 through a wired and/or wireless communication network interface or adapter 2556. The adapter 2556 can facilitate wired or wireless communication to the LAN 2552, which can also include a wireless access point (AP) disposed thereon for communicating with the adapter 2556 in a wireless mode.

When used in a WAN networking environment, the computer 2502 can include a modem 2558 or can be connected to a communications server on the WAN 2554 via other means for establishing communications over the WAN 2554, such as by way of the Internet. The modem 2558, which can be internal or external and a wired or wireless device, can be connected to the system bus 2508 via the input device interface 2524. In a networked environment, program modules depicted relative to the computer 2502 or portions thereof, can be stored in the remote memory/storage device 2550. It will be appreciated that the network connections shown are example and other means of establishing a communications link between the computers can be used.

When used in either a LAN or WAN networking environment, the computer 2502 can access cloud storage systems or other network-based storage systems in addition to, or in place of, external storage devices 2516 as described above. Generally, a connection between the computer 2502 and a cloud storage system can be established over a LAN 2552 or WAN 2554 e.g., by the adapter 2556 or modem 2558, respectively. Upon connecting the computer 2502 to an associated cloud storage system, the external storage interface 2526 can, with the aid of the adapter 2556 and/or modem 2558, manage storage provided by the cloud storage system as it would other types of external storage. For instance, the external storage interface 2526 can be configured to provide access to cloud storage sources as if those sources were physically connected to the computer 2502.

The computer 2502 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

FIG. 25 is a schematic block diagram of a sample computing environment 2500 with which the disclosed subject matter can interact. The sample computing environment 2500 includes one or more client(s) 2502. The client(s) 2502 can be hardware and/or software (e.g., threads, processes, computing devices). The sample computing environment 2500 also includes one or more server(s) 2504. The server(s) 2504 can also be hardware and/or software (e.g., threads, processes, computing devices). The servers 2504 can house threads to perform transformations by employing one or more embodiments as described herein, for example. One possible communication between a client 2502 and servers 2504 can be in the form of a data packet adapted to be transmitted between two or more computer processes. The sample computing environment 2500 includes a communication framework 2506 that can be employed to facilitate communications between the client(s) 2502 and the server(s) 2504. The client(s) 2502 are operably connected to one or more client data store(s) 2508 that can be employed to store information local to the client(s) 2502. Similarly, the server(s) 2504 are operably connected to one or more server data store(s) 2510 that can be employed to store information local to the servers 2504.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A system for designing industrial safety systems, comprising:
a memory that stores executable components; and
a processor, operatively coupled to the memory, that executes the executable components, the executable components comprising:
a user interface component configured to render an interface display and to receive, via interaction with the interface display, design input that defines aspects of an industrial safety system for an industrial machine, wherein the design input selects, via interaction with a first list of available tasks and a second list of available hazards, tasks expected to be performed relative to the industrial machine and respective hazards associated with the tasks,
wherein the interface display simultaneously displays
a layout view that displays a graphic of the industrial machine and the aspects of the industrial safety system as a hierarchical list, and
a table view that displays the aspects of the industrial safety system in a tabular format;
a safety function component configured to generate functional safety data for the industrial safety system based on the design input; and
a reporting component configured to generate, based on the functional safety data, at least one of a risk assessment document for the industrial machine, a bill of materials for the industrial safety system, a safety function requirements specification document for the industrial safety system, or a validation checklist for the industrial safety system, wherein an interaction with a first view, of the layout view or the table view, causes a corresponding update to a second view of the layout view or the table view.

2. The system of claim 1, wherein
the layout view displays the hazards in the hierarchical list categorized according to the tasks,
the table view displays the hazards in a table having rows corresponding to the hazards and columns corresponding to items of hazard information for the hazard, and
selection of a hazard from one of the layout view or the table view causes the hazard to be highlighted in the table view, on the hierarchical list, and on the graphic of the industrial machine.

3. The system of claim 2, wherein the items of hazard information comprise at least one of a task with which the hazard is associated, an identification number for the hazard, a type of the hazard, a cause of the hazard, a consequence of the hazard, a description, or an image of a source of the hazard.

4. The system of claim 1, wherein
the user interface component is configured to, in response to selection of a safety function control in a row of the table view, render a dialog box that prompts for information about a hazard corresponding to the row,
the design input specifies, via interaction with the dialog box, the information about the hazard, and
the executable components further comprise a risk assessment component configured to calculate an initial risk level score and a required performance level for mitigation of a risk associated with the hazard based on the information about the hazard.

5. The system of claim 4, wherein
the design input selects, via interaction with the dialog box, a safety function to be associated with the hazard,
the risk assessment component calculates a final risk level score for the hazard based on addition of the safety function, and
the table view displays, in the row corresponding to the hazard, the initial risk level score, the final risk level score, and a name of the safety function.

6. The system of claim 5, wherein the risk assessment component is further configured to calculate a required performance level for the safety function based on the information about the hazard and industrial safety standards defined for the industrial machine.

7. The system of claim 1, wherein
the user interface component is configured to, in response to selection of a safety function control in a row of the table view, render a dialog box that prompts for information about a safety function to be used to mitigate a risk associated with a hazard corresponding to the row,
the design input specifies, via interaction with the dialog box, the information about the safety function, and
the table view displays the information about the safety function in a table having rows corresponding to respective safety functions, including the safety function, defined for the industrial safety system.

8. The system of claim 7, wherein
the information about the safety function comprises identities of an input device, a logic device, and an output device for the safety function, and
the table in the table view comprises columns corresponding to output devices, including the output device, defined for the industrial safety system.

9. The system of claim 8, wherein
the columns corresponding to the output devices comprise selection controls,
the design input selects or unselects the selection controls via interaction with the table view,
selection of a selection control, of the selection controls, in a row corresponding to a safety function causes an output device corresponding to the selection control to be added to the safety function, and
unselection of the selection control causes the output device to be removed from the safety function.

10. The system of claim 9, wherein the selection of the selection control causes a safety zone graphic to be rendered on the image of the industrial machine, the safety zone graphic encompassing an area of the industrial machine whose safe state is controlled by the output device selected in the table.

11. The system of claim 9, wherein
the layout view is configured to, in response to receipt of zone drawing input received via interaction with the graphic of the industrial machine, render a safety zone graphic that defines a span of control for the safety function, and
receipt of the zone drawing input causes a first subset of the output devices corresponding to hazards encompassed by the safety zone graphic to be selected in the table view, and causes a second subset of the output device corresponding to hazards outside the safety zone graphic to be unselected.

12. The system of claim 8, wherein
the user interface component is configured to, in response to selection of a safety function design control in a row of the table view, render a dialog box that displays filtered sets of candidate products for use as the input device, the logic device, and the output device for the safety function, and
the executable components further comprise a product selection component configured to select the filtered sets of candidate products, from among available products defined in a product library, based on a determination that the filtered sets of candidate products satisfy a required performance level calculated for the safety function.

13. A method for developing industrial safety systems, comprising:
rendering, by a system comprising a processor, an interface display;
receiving, by the system via interaction with the interface display, design input that defines aspects of an industrial safety system for an industrial machine, wherein the receiving of the design input comprises
selecting, from a first list of available tasks, tasks expected to be performed relative to the industrial machine, and
selecting, from a second list of available hazards, hazards associated with the tasks;
generating, by the system, functional safety data for the industrial safety system based on the design input; and
generating, by the system, based on the functional safety data, at least one of a risk assessment document for the industrial machine, a bill of materials for the industrial safety system, a safety requirements specification document for the industrial safety system, or a validation checklist for the industrial safety system,
wherein the rendering comprises simultaneously displaying on the interface display:

a layout view that displays a graphic of the industrial machine and the aspects of the industrial safety system as a hierarchical list, and a table view that displays the aspects of the industrial safety system in a tabular format.

14. The method of claim 13, wherein
the rendering of the interface display comprises:
displaying, in the layout view, the hazards in the hierarchical list categorized according to the tasks,
displaying, in the table view, the hazards in a table having rows corresponding to the hazards and columns corresponding to items of hazard information for the hazard, and
the method further comprises, in response to selection of a hazard from one of the layout view or the table view, highlighting the hazard in the table view, on the hierarchical list, and on the graphic of the industrial machine.

15. The method of claim 13, further comprising:
in response to selection of a safety function control in a row of the table view, rendering, by the system, a dialog box that prompts for information about a hazard corresponding to the row,
receiving, by the system as part of the design input via interaction with the dialog box, the information about the hazard, and
determining, by the system, an initial risk level score and a required performance level for mitigation of a risk associated with the hazard based on the information about the hazard.

16. The method of claim 15, further comprising:
receiving, by the system as part of the design input, selection of a safety function to be associated with the hazard,
calculating, by the system, a final risk level score for the hazard based on addition of the safety function, and
displaying, by the system, in a row of the table view corresponding to the hazard, the initial risk level score, the final risk level score, and a name of the safety function.

17. A non-transitory computer-readable medium having stored thereon instructions that, in response to execution, cause a system comprising a processor to perform operations, the operations comprising:
rendering an interface display for development of a safety system for an industrial machine;
receiving, via interaction with the interface display, design input that defines aspects of the safety system, wherein the receiving of the design input comprises
selecting, from a first list of available tasks, tasks expected to be performed relative to the industrial machine, and
selecting, from a second list of available hazards, hazards associated with the tasks;
generating functional safety data for the industrial safety system based on the design input; and
generating based on the functional safety data, at least one of a risk assessment document for the industrial machine, a bill of materials for the industrial safety system, a safety requirements specification document for the industrial safety system, or a validation checklist for the industrial safety system,
wherein the rendering comprises simultaneously displaying on the interface display:
a layout view that displays a graphic of the industrial machine and the aspects of the industrial safety system as a hierarchical list, and
a table view that displays the aspects of the industrial safety system in a tabular format.

18. The non-transitory computer-readable medium of claim 17, wherein
the rendering of the interface display comprises:
displaying, in the layout view, the hazards in the hierarchical list categorized according to the tasks,
displaying, in the table view, the hazards in a table having rows corresponding to the hazards and columns corresponding to items of hazard information for the hazard, and
the operations further comprise, in response to selection of a hazard from one of the layout view or the table view, highlighting the hazard in the table view, on the hierarchical list, and on the graphic of the industrial machine.

19. The non-transitory computer-readable medium of claim 17, the operations further comprising:
in response to selection of a safety function control in a row of the table view, rendering a dialog box that prompts for information about a hazard corresponding to the row,
receiving, as part of the design input via interaction with the dialog box, the information about the hazard, and
determining an initial risk level score and a required performance level for mitigation of a risk associated with the hazard based on the information about the hazard.

20. The non-transitory computer-readable medium of claim 19, the operations further comprising:
receiving, as part of the design input, selection of a safety function to be associated with the hazard,
calculating a final risk level score for the hazard based on addition of the safety function, and
displaying in a row of the table view corresponding to the hazard, the initial risk level score, the final risk level score, and a name of the safety function.

* * * * *